United States Patent
Price et al.

(10) Patent No.: US 8,907,832 B2
(45) Date of Patent: Dec. 9, 2014

(54) POLARITY COMPENSATING DUAL-STRING DIGITAL-TO-ANALOG CONVERTERS (DACS), AND RELATED CIRCUITS, SYSTEMS, AND METHODS

(71) Applicant: QUALCOMM Incorporated, San Diego, CA (US)

(72) Inventors: Burt L. Price, Raleigh, NC (US); Dhaval R. Shah, Raleigh, NC (US); Yeshwant Nagaraj Kolla, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/834,184

(22) Filed: Mar. 15, 2013

(65) Prior Publication Data

US 2014/0266836 A1    Sep. 18, 2014

(51) Int. Cl.
  *H03M 1/78* (2006.01)
  *H03M 1/68* (2006.01)
  *H03M 1/06* (2006.01)
  *H03M 1/76* (2006.01)

(52) U.S. Cl.
  CPC .............. *H03M 1/68* (2013.01); *H03M 1/0602* (2013.01); *H03M 1/682* (2013.01); *H03M 1/765* (2013.01)
  USPC ............................ 341/154; 341/144; 341/145

(58) Field of Classification Search
  CPC ....................................................... H03M 1/78
  USPC ......................................... 341/144, 145, 154
  See application file for complete search history.

(56) References Cited

U.S. PATENT DOCUMENTS 3,453,615 A    7/1969    Scott
3,810,022 A    5/1974    Collins
(Continued)

FOREIGN PATENT DOCUMENTS

EP        0102609 A2    3/1984
GB        2118386 A     10/1983

OTHER PUBLICATIONS

Boylston L.E., Jr., et al., "Enhancing Performance in Interpolating Resistor String DACs," Iowa State University, Aug. 2002, 4 pages, http://class.ece.iastate.edu/vlsi2/docs/Papers%20Done/2002-08-MWSCAS-LB.pdf.

(Continued)

*Primary Examiner* — Linh Nguyen
(74) *Attorney, Agent, or Firm* — Withrow & Terranova, PLLC

(57) ABSTRACT

Polarity compensating dual-string digital-to-analog converters (DACs), and related circuits, systems, and methods are disclosed. In embodiments disclosed herein, a secondary voltage divider of a dual-string DAC includes a switch logic unit. The switch logic unit is configured to compensate for polarity changes in the dual-string DAC to maintain monotonicity. Monotonicity means an output voltage of a DAC either increases or stays constant for monotonically increasing functions or either decreases or stays constant for monotonically decreasing functions given an incremental change in a DAC input code. The switch logic unit is configured to compensate for polarity changes in the input voltage from the primary voltage divider to the secondary resistor string. The switch logic unit is configured to select a secondary switch among the plurality of secondary switches in a secondary voltage divider, to divide an input voltage based on a polarity indicator and a DAC input code, to maintain monotonicity.

37 Claims, 23 Drawing Sheets

(56) References Cited

U.S. PATENT DOCUMENTS

| | | | |
|---|---|---|---|
| 5,703,588 A | 12/1997 | Rivoir et al. | |
| 5,943,000 A | 8/1999 | Nessi et al. | |
| 5,969,657 A | 10/1999 | Dempsey et al. | |
| 5,977,898 A | 11/1999 | Ling et al. | |
| 6,014,097 A | 1/2000 | Brandt | |
| 6,225,929 B1 | 5/2001 | Beck | |
| 6,268,817 B1 | 7/2001 | Min et al. | |
| 6,781,536 B1 | 8/2004 | Martins | |
| 6,914,547 B1 * | 7/2005 | Swaroop et al. | 341/144 |
| 6,954,165 B2 * | 10/2005 | Mallinson | 341/144 |
| 6,958,720 B1 | 10/2005 | Prater | |
| 6,995,701 B1 * | 2/2006 | Churchill et al. | 341/154 |
| 7,015,847 B1 | 3/2006 | McLachlan et al. | |
| 7,102,424 B2 * | 9/2006 | Vorenkamp | 327/540 |
| 7,136,002 B2 | 11/2006 | Dempsey et al. | |
| 7,330,066 B2 | 2/2008 | Huang | |
| 7,425,941 B2 | 9/2008 | Sung et al. | |
| 7,605,735 B2 | 10/2009 | Chen et al. | |
| 7,639,166 B2 * | 12/2009 | Iijima | 341/145 |
| 7,710,302 B2 | 5/2010 | Iadanza et al. | |
| 7,830,291 B2 * | 11/2010 | Wikner | 341/155 |
| 7,956,786 B2 * | 6/2011 | Cosgrave | 341/145 |
| 7,982,581 B2 * | 7/2011 | Jha et al. | 338/118 |
| 2003/0141998 A1 * | 7/2003 | Matsui | 341/145 |
| 2011/0181571 A1 | 7/2011 | Harada | |

OTHER PUBLICATIONS

Chen C.C., et al., "A 10-Bit Folded Multi-LSB Decided Resistor String Digital to Analog Converter," 2006 International Symposium on Intelligent Signal Processing and Communication Systems, 2006, pp. 123-126.

"Thévenin Theorem," Wikipedia—The Free encyclopedia, Updated Nov. 2, 2012, 3 pages, http://en.wikipedia.org/wiki/Th%C3%A9venin_theorem.

Invitation to Pay Additonal Fees and Communication Relating to the Results of the Partial International Search for Patent Application No. PCT/US2014/024235, mailed Aug. 22, 2014, 6 pages.

* cited by examiner

| 66 | | | | 106 | | 118 | | | | 122 |
|---|---|---|---|---|---|---|---|---|---|---|
| LSB CODE (66) | | | | LSB of the MSB CODE (48) | | | | | | |
| S3 | S2 | S1 | S0 | S4 | | G3 | G2 | G1 | G0 | U# |
| 0 | 0 | 0 | 0 | 0 | | 0 | 0 | 0 | 0 | 0 |
| 0 | 0 | 0 | 1 | 0 | | 1 | 0 | 0 | 0 | 1 |
| 0 | 0 | 1 | 0 | 0 | | 0 | 1 | 0 | 0 | 2 |
| 0 | 0 | 1 | 1 | 0 | | 1 | 1 | 0 | 0 | 3 |
| 0 | 1 | 0 | 0 | 0 | | 0 | 0 | 1 | 0 | 4 |
| 0 | 1 | 0 | 1 | 0 | | 1 | 0 | 1 | 0 | 5 |
| 0 | 1 | 1 | 0 | 0 | | 0 | 1 | 1 | 0 | 6 |
| 0 | 1 | 1 | 1 | 0 | | 1 | 1 | 1 | 0 | 7 |
| 1 | 0 | 0 | 0 | 0 | | 0 | 0 | 0 | 1 | 8 |
| 1 | 0 | 0 | 1 | 0 | | 1 | 0 | 0 | 1 | 9 |
| 1 | 0 | 1 | 0 | 0 | | 0 | 1 | 0 | 1 | 10 |
| 1 | 0 | 1 | 1 | 0 | | 1 | 1 | 0 | 1 | 11 |
| 1 | 1 | 0 | 0 | 0 | | 0 | 0 | 1 | 1 | 12 |
| 1 | 1 | 0 | 1 | 0 | | 1 | 0 | 1 | 1 | 13 |
| 1 | 1 | 1 | 0 | 0 | | 0 | 1 | 1 | 1 | 14 |
| 1 | 1 | 1 | 1 | 0 | | 1 | 1 | 1 | 1 | 15 |
| | | | | | | | | | | |
| LSB CODE (66) | | | | LSB of the MSB CODE (48) | | | | | | |
| S3 | S2 | S1 | S0 | S4 | | G3 | G2 | G1 | G0 | U# |
| 0 | 0 | 0 | 0 | 1 | | 1 | 1 | 1 | 1 | 15 |
| 0 | 0 | 0 | 1 | 1 | | 1 | 1 | 1 | 0 | 14 |
| 0 | 0 | 1 | 0 | 1 | | 1 | 1 | 0 | 1 | 13 |
| 0 | 0 | 1 | 1 | 1 | | 1 | 1 | 0 | 0 | 12 |
| 0 | 1 | 0 | 0 | 1 | | 1 | 0 | 1 | 1 | 11 |
| 0 | 1 | 0 | 1 | 1 | | 1 | 0 | 1 | 0 | 10 |
| 0 | 1 | 1 | 0 | 1 | | 1 | 0 | 0 | 1 | 9 |
| 0 | 1 | 1 | 1 | 1 | | 1 | 0 | 0 | 0 | 8 |
| 1 | 0 | 0 | 0 | 1 | | 0 | 1 | 1 | 1 | 7 |
| 1 | 0 | 0 | 1 | 1 | | 0 | 1 | 1 | 0 | 6 |
| 1 | 0 | 1 | 0 | 1 | | 0 | 1 | 0 | 1 | 5 |
| 1 | 0 | 1 | 1 | 1 | | 0 | 1 | 0 | 0 | 4 |
| 1 | 1 | 0 | 0 | 1 | | 0 | 0 | 1 | 1 | 3 |
| 1 | 1 | 0 | 1 | 1 | | 0 | 0 | 1 | 0 | 2 |
| 1 | 1 | 1 | 0 | 1 | | 0 | 0 | 0 | 1 | 1 |
| 1 | 1 | 1 | 1 | 1 | | 0 | 0 | 0 | 0 | 0 |
| | | | | | | Use of the XOR flips the polarity | | | | |

*FIG. 20*

| 66 | | | 122(14) | 106 | 62(14) |
|---|---|---|---|---|---|
| LSB CODE (66) | | | 3 to 8 Decoder output | LSB of the MSB CODE (48) | |
| S2 | S1 | S0 | G# | S3 | U# |
| 0 | 0 | 0 | G0 | 0 | 0 |
| 0 | 0 | 1 | G1 | 0 | 1 |
| 0 | 1 | 0 | G2 | 0 | 2 |
| 0 | 1 | 1 | G3 | 0 | 3 |
| 1 | 0 | 0 | G4 | 0 | 4 |
| 1 | 0 | 1 | G5 | 0 | 5 |
| 1 | 1 | 0 | G6 | 0 | 6 |
| 1 | 1 | 1 | G7 | 0 | 7 |
| | | | | | |
| LSB CODE (66) | | | 3 to 8 Decoder output | LSB of the MSB CODE (48) | |
| S2 | S1 | S0 | G# | S3 | U# |
| 0 | 0 | 0 | G0 | 1 | 7 |
| 0 | 0 | 1 | G1 | 1 | 6 |
| 0 | 1 | 0 | G2 | 1 | 5 |
| 0 | 1 | 1 | G3 | 1 | 4 |
| 1 | 0 | 0 | G4 | 1 | 3 |
| 1 | 0 | 1 | G5 | 1 | 2 |
| 1 | 1 | 0 | G6 | 1 | 1 |
| 1 | 1 | 1 | G7 | 1 | 0 |

POLARITY COMPENSATING DUAL-STRING DIGITAL-TO-ANALOG CONVERTERS (DACS), AND RELATED CIRCUITS, SYSTEMS, AND METHODS

RELATED APPLICATION

The present application is related to U.S. patent application Ser. No. 13/834,041 filed on Mar. 15, 2013 and entitled "DUAL-STRING DIGITAL-TO-ANALOG CONVERTERS (DACs), AND RELATED CIRCUITS, SYSTEMS, AND METHODS." which is incorporated herein by reference in its entirety.

BACKGROUND

I. Field of the Disclosure

The field of the disclosure relates to dual-string digital-to-analog converters (DACs), and particularly to interconnections and switching of primary and secondary voltage dividers provided therein.

II. Background

A digital-to-analog converter (DAC) is a device that converts digital codes to representative analog signals. For example, the converted analog signals may be recreations of native analog signals previously converted into the digital codes by an analog-to-digital converter (ADC). A common use of ADCs and DACs is converting audio and video signals used in media devices (e.g. televisions, cell phones, MP3 players, etc.) from analog sign representations to digital signal representations, or vice versa.

One type of DAC is a dual-string DAC. A dual resistor string DAC (also referred to as "dual-string DAC") requires fewer resistors and switches to convert digital codes into analog signal representations as compared to single resistor string DACs. A dual-string DAC includes a first resistor string that generates a coarse conversion of a digital code. A second resistor string of the dual-string DAC generates a finer interpolation of the coarse conversion of the digital code received from the first resistor string to provide an output voltage providing an analog signal representation of the digital code. For example, if a dual-string DAC is configured to convert six (6) bit binary digital codes into sixty-four (64) unique conversions (i.e., $2^6$ conversions), each resistor string of the dual-string DAC could each include eight (8) resistors for a total of sixteen (16) resistors, as opposed to providing sixty-four (64) resistors in a single-string DAC.

For example, FIG. 1 illustrates an exemplary dual-string DAC 10 (referred to herein as "DAC 10"). The DAC 10 functions by applying a received input voltage $V_{in}$ across a primary voltage divider circuit 12, referred to herein as "primary voltage divider 12." The primary voltage divider 12 provides coarse voltage (i.e., analog signal) values by dividing the input voltage $V_{in}$ across a plurality of primary resistors R(0)-R(N−1) in a primary resistor string 14 at selected resistor node pairs $N_r(0)$-$N_r(N)$ at nodes between the primary resistors R(0)-R(N−1). For example, if N equals sixteen (16), this means the number of primary resistors R(0)-R(N−1) provided in the primary voltage divider 12 totals sixteen (16). In this example, the primary voltage divider 12 provides sixteen (16) unique divided primary voltages selectable by four (4) binary bits of a digital code provided to the primary voltage divider 12 for conversion. For example, the bits of a digital DAC input code 15 (hereinafter "DAC input code 15") are used to select the primary voltages, as illustrated in FIG. 1. In this example, the most significant bits N of the DAC input code 15 are used to select the primary voltages. A coarse divided primary voltage value is selected by a primary switch unit 16 that selects a pair of primary switches U(0)-U(2N−1) to select a selected resistor node pair $N_r$ among a plurality of selected resistor node pairs $N_r(0)$ to $N_r(N)$ in the primary resistor string 14 to select one of the divided primary voltages as a selected coarse divided primary voltage $V_p$. This selected coarse divided primary voltage $V_p$ is applied across a secondary voltage divider circuit 18, referred to herein as "secondary voltage divider 18."

With continuing reference to FIG. 1, the secondary voltage divider 18 is provided in the DAC 10 and configured to further divide the selected coarse divided primary voltage $V_p$ into a plurality of finer secondary voltages. In this regard, the secondary voltage divider 18 comprises a plurality of secondary resistors $R_s(0)$-$R_s(Y-1)$ to form a secondary resistor string 20. Similar to the primary resistor string 14, the secondary resistor string 20 divides the applied primary voltage from the primary voltage divider 12 into finer, interpolated secondary voltages. As the primary voltage is applied across the secondary resistor string 20, a secondary output voltage $V_{out}$ is selected by a secondary voltage divider switch 22. For example, if Y equals thirty-two (32), meaning the number of secondary resistors $R_s(0)$-$R_s(Y-1)$ provided in the secondary voltage divider 18 totals thirty-two (32), the secondary voltage divider 18 provides thirty-two (32) unique divided secondary voltages. The thirty-two (32) unique divided secondary voltages are selectable by five (5) binary digital code bits provided to the secondary voltage divider 18. For example, the bits of the DAC input code 15 used to select the secondary voltages may comprise the least significant five (5) bits (LSB) of the DAC input code 15. A finer, interpolated secondary voltage value is selected by the secondary voltage divider switch 22 by selecting a resistor node $N_{sr}$. The selected resistor node $N_{sr}$ is selected from among resistor nodes $N_{sr}(0)$-$N_{sr}(Y)$ in the secondary resistor string 20 to provide a final, secondary output voltage $V_{out}$ representing the converted DAC input code 15.

When the DAC 10 in FIG. 1 converts the DAC input code 15 into the secondary output voltage $V_{out}$, the DAC 10 transfer function remains monotonic throughout the range of possible digital codes. The DAC 10 being montonic in this example means that the DAC 10 will generate a secondary output voltage $V_{out}$ that increases (or stays constant) or decreases (or stays constant) for a given incremental change in the DAC input code 15. Montonicity in the DAC 10 may be desired if it is desired for the DAC 10 convert digital codes to representative analog signals in a linear fashion. The DAC 10 is designed to be monotonic to be linear. More specifically, the DAC 10 in FIG. 1 being monotonic means the selected coarse divided primary voltage $V_p$ and the secondary output voltage $V_{out}$ of the DAC 10 either increases or stays constant for a monotonically increasing DAC input code 15, or decreases or stays constant for a monotonically decreasing DAC input code 15. For example, as the DAC input code 15 increases in value, the selected coarse divided primary voltage $V_p$ and the secondary output voltage $V_{out}$ increase or remain constant (i.e., not decrease) for the DAC 10. Likewise, as the DAC input code 15 decreases in value, the selected coarse divided primary voltage $V_p$ and the secondary output voltage $V_{out}$ decrease or remain constant (i.e., not increase) for the DAC 10.

With continuing reference to FIG. 1, primary switches U(0)-U(2N−1) are provided in the primary switch unit 16 of the DAC 10. The primary switches U(0)-U(2N−1) are configured to be controllably opened and closed to select the desired selected resistor node pair 49 among the plurality of selected resistor node pairs $N_r(0)$-$N_r(N)$. Selecting the desired selected resistor node pair among the selected resistor node pairs $N_r(0)$-$N_r(N)$ selects the selected coarse divided primary voltage $V_p$ in the primary voltage divider 12 to be applied to the secondary resistor string 20. The primary switches U(0)-U(2N-1) are provided in pairs for each selected resistor node to maintain monotonicity in the DAC 10. For example, if the voltage across the selected resistor node pair $N_r(2)$ and $N_r(3)$ in the primary voltage divider 12 is selected to be applied across the secondary resistor string 20, primary switch U(3) is selected to couple $N_r(2)$ to a positive input terminal 24I of the secondary resistor string 20. Switch U(6) is selected to couple $N_r(3)$ to a negative input terminal 26I of the secondary voltage string 20. If the most significant bits (MSB) of the DAC input code 15 increments, causing the voltage across selected resistor node pair $N_r(3)$ and $N_r(4)$ to be selected, the primary switch U(5) must be selected instead of primary switch U(6). Primary switch U(5) must be selected to couple selected resistor node pair $N_r(3)$ to the positive terminal 24I of the secondary resistor string 20. Otherwise, if primary switch U(6) were continued to be selected, $N_r(3)$ would remain coupled to the negative terminal 26I of the secondary resistor string 20 of the secondary resistor string 20, thus causing the selected coarse divided primary voltage $V_p$ in the primary voltage divider 12 to not be applied incrementally, in kind, with the increment in the DAC input code 15 across the secondary resistor string 20. Thus, the DAC 10 would not be monotonic. Thus in summary, if the primary switches U(0)-U(2N-1) are not provided in pairs for each selected resistor node $N_r(0)$-$N_r(N)$, polarity changes (e.g., polarity flips) will occur in the selected coarse divided primary voltage $V_p$ applied across the secondary resistor string 20. Monotonicity would be lost as a result.

SUMMARY OF THE DISCLOSURE

Embodiments disclosed in the detailed description include polarity compensating dual-string digital-to-analog converters (DACs). Related circuits, systems, and methods are also disclosed. In embodiments disclosed herein, a secondary voltage divider of a dual-string DAC includes a switch logic unit. The switch logic unit is configured to compensate for polarity changes in the dual-string DAC to maintain monotonicity in the dual-string DAC. The dual-string DAC being montonic means that the dual-string DAC will convert a digital input code into an representative analog output voltage that increases (or stays constant) or decreases (or stays constant) for a given incremental change in the digital input code. Monotonicity may be desired if it is desired for a DAC to convert digital codes to representative analog signals in a linear fashion. The switch logic unit is configured to select a secondary switch among a plurality of secondary switches to divide an input voltage from a primary voltage divider, based on a polarity indicator and the DAC input code, to maintain monotonicity. Each of the secondary switches is connected to a resistor node in a secondary resistor string of the secondary voltage divider. Thus, as a non-limiting example, the dual-string DAC can avoid the need to provide two switches for each resistor node in a primary resistor string to maintain monotonicity.

In this regard, in one embodiment, a secondary voltage divider of a dual-string DAC is provided. The secondary voltage divider of the dual-string DAC comprises a secondary resistor string comprising a plurality of secondary resistors. The secondary resistor string comprises a plurality of secondary resistor nodes configured to divide a selected primary DAC output voltage applied as a secondary DAC input voltage across the secondary resistor string into a plurality of divided voltage levels. The secondary voltage divider further comprises a secondary switch unit comprising a plurality of secondary switches each coupled to a respective secondary resistor node among the plurality of secondary resistor nodes. Each secondary switch among the plurality of secondary switches is configured to select a current secondary resistor node among the plurality of secondary resistor nodes of the secondary resistor string. The selected current secondary resistor node provides a divided secondary voltage level across the current selected secondary resistor node to be applied to a DAC output voltage node of the dual-string DAC. The secondary voltage divider further comprises a switch logic unit configured to receive a secondary DAC input code and a polarity indicator indicating a polarity of the secondary DAC input voltage. The switch logic unit is further configured to select a current secondary switch among the plurality of secondary switches based on the polarity indicator and the secondary DAC input code to select a secondary resistor node coupled to a current selected secondary switch. The selection of the current secondary switch causes the divided secondary voltage level across the current selected secondary resistor node to be applied to the DAC output voltage node of the dual-string DAC. In this manner, as non-limiting examples, the selected primary DAC output voltage of the primary resistor string divider may be corrected for both polarity and monotonicity issues allowing for efficiently constructed primary voltage dividers that may eliminate isolation circuits.

In another embodiment, a secondary voltage divider of a dual-string DAC for dividing a voltage output from a primary voltage divider comprises a means for dividing a total voltage and a secondary resistor string comprising a plurality of secondary resistors. The secondary resistor string comprises a plurality of secondary resistor nodes configured to divide a selected primary DAC output voltage. The selected primary DAC output voltage is applied as a secondary DAC input voltage across the secondary resistor string into a plurality of divided voltage levels. The secondary voltage divider further comprises a means for selecting a secondary resistor node. A secondary switch unit comprises a plurality of secondary switches, each coupled to a respective secondary resistor node among the plurality of secondary resistor nodes. Each secondary switch among the plurality of secondary switches is configured to select a current secondary resistor node among the plurality of secondary resistor nodes of the secondary resistor string to provide a divided secondary voltage level across the current selected secondary resistor node to be applied to a DAC output voltage node of the dual-string DAC. The secondary voltage divider further comprises a means for receiving a polarity indicator. A switch logic unit is configured to receive a DAC input code and the polarity indicator indicating a polarity of the secondary DAC input voltage. The secondary voltage divider then selects a current secondary switch among the plurality of secondary switches based on the polarity indicator and the secondary DAC input code to select the secondary resistor node coupled to the selected current secondary switch to cause the divided secondary voltage level across the current selected resistor node to be applied to the DAC output voltage node of the dual-string DAC.

In another embodiment, a method of providing a secondary DAC output voltage in a dual-string DAC is provided. The method comprises receiving a secondary DAC input code and a polarity indicator indicating a polarity of a secondary DAC input voltage applied across a secondary resistor string having a plurality of secondary resistors. The secondary resistor string comprises a plurality of secondary resistor nodes dividing the secondary DAC input voltage across the secondary resistor string into a plurality of divided secondary voltage levels. The method further comprises selecting a current secondary switch among a plurality of secondary switches in a secondary switch unit, based on the polarity indicator and the secondary DAC input code. Each of the plurality of secondary switches are coupled to a respective secondary resistor node among the plurality of secondary resistor nodes. Each secondary switch selects a current secondary resistor node among the plurality of secondary resistor nodes to cause a divided secondary voltage level across the current selected secondary resistor node to be applied to a DAC output voltage node of the dual-string DAC.

In another embodiment, a dual-string DAC is provided. The dual-string DAC comprises a primary voltage divider and a secondary voltage divider. The primary voltage divider comprises a primary resistor string having a total resistance. The primary resistor string comprises a plurality of resistor nodes configured to divide a DAC input voltage applied across the primary resistor string into a plurality of divided voltage levels. The primary voltage divider further comprises a primary switch unit configured to receive a DAC input code and select a resistor node circuit among a plurality of resistor node circuits. The resistor node circuit comprises a selected resistor node pair among a plurality of resistor node pairs of the primary resistor string based on the DAC input code to couple a divided voltage level across the selected resistor node pair to a secondary voltage divider circuit of the dual-string DAC. The primary voltage divider further comprises at least one adjusting circuit. The at least one adjusting circuit comprises at least one first fractional resistance to the selected resistor node configured to maintain an ideal voltage of the selected resistor node pair across the secondary voltage divider circuit. In response to the primary switch unit selecting the selected resistor node pair, an ideal voltage is maintained without impedance isolation between the primary voltage divider and the secondary voltage divider circuit.

The secondary voltage divider comprises a secondary resistor string comprising a plurality of secondary resistors. The secondary resistor string comprises a plurality of secondary resistor nodes configured to divide a selected primary DAC output voltage applied as a secondary DAC input voltage across the secondary resistor string into a plurality of secondary divided voltage levels. The secondary voltage divider further comprises a secondary switch unit. The secondary switch unit comprises a plurality of secondary switches each coupled to a respective secondary resistor node among the plurality of secondary resistor nodes. Each secondary switch among the plurality of secondary switches is configured to select a current secondary resistor node among the plurality of secondary resistor nodes of the secondary resistor string. The selection of the current secondary resistor node causes one of the plurality of secondary divided voltage levels across the current selected secondary resistor node to be applied to a DAC output voltage node of the dual-string DAC. The secondary voltage divider further comprises a switch logic unit. The switch logic unit is configured to receive a secondary DAC input code and a polarity indicator indicating a polarity of the secondary DAC input voltage. The switch logic unit is further configured to select a current secondary switch among the plurality of secondary switches based on the polarity indicator and the secondary DAC input code. The selection of a current secondary switch selects a secondary resistor node coupled to the selected current secondary switch causing the one of the plurality of secondary divided voltage levels across the current selected secondary resistor node to be applied to the DAC output voltage node of the dual-string DAC.

BRIEF DESCRIPTION OF THE FIGURES

FIG. 20 is an exemplary logic table illustrating a DAC input code and corresponding secondary switch selection in the secondary voltage divider circuit of FIG. 18 to maintain polarity and monotonicity in a dual-string DAC;

FIG. 22 is an exemplary logic table illustrating a DAC input code and corresponding secondary switch selection in the secondary voltage divider circuit of FIG. 20 to maintain polarity and monotonicity in a dual-string DAC.

DETAILED DESCRIPTION

Figure 1:
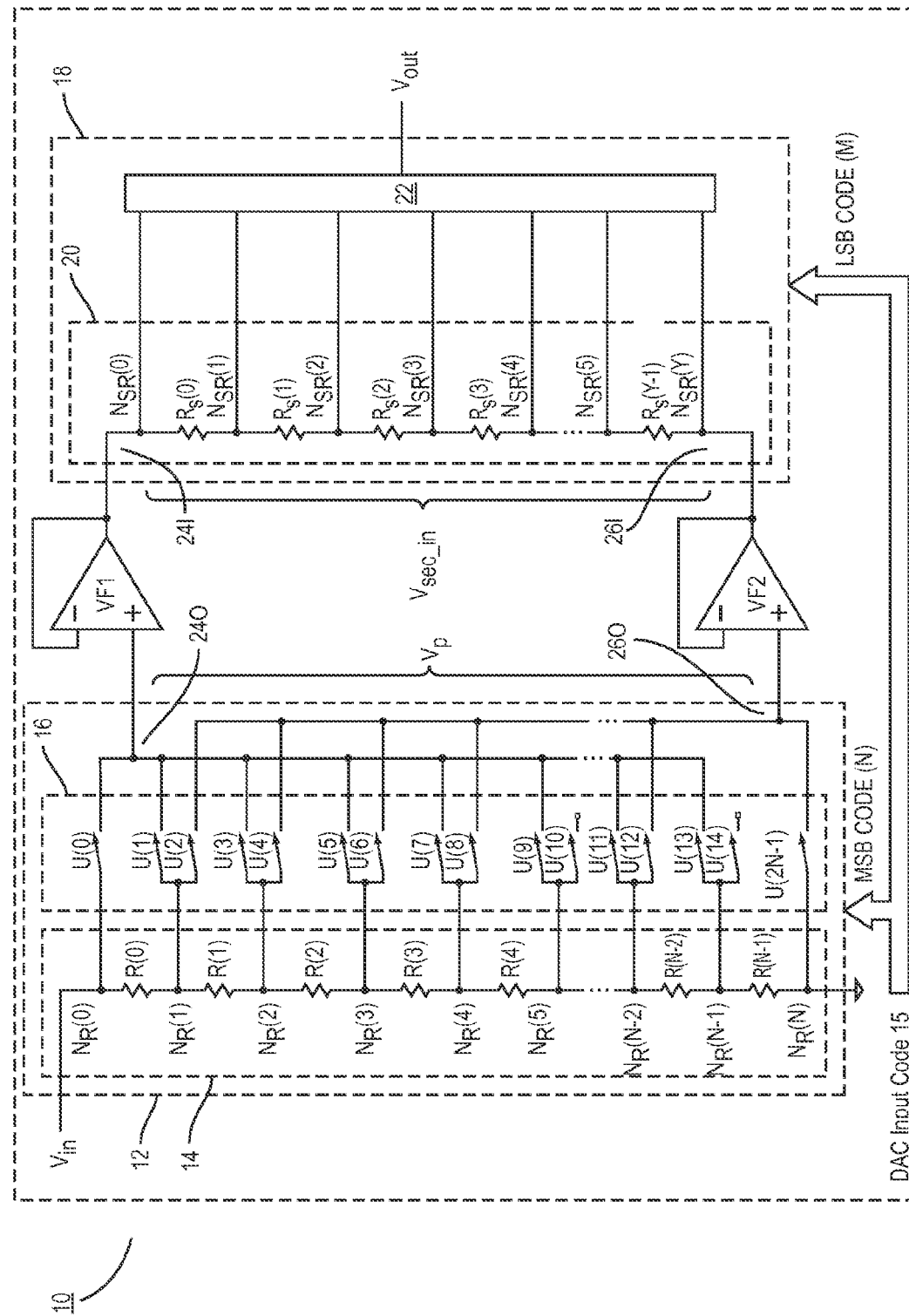
FIG. 1 is a block diagram of an exemplary dual-string digital-to-analog converter (DAC) that includes a primary voltage divider circuit functioning as a coarse voltage divider, and a secondary voltage divider circuit interpolating coarse voltage selected from the primary voltage divider circuit to generate an analog signal representation of a digital code.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include dual-string digital-to-analog converters (DACs), and related circuits, systems, and methods. In embodiments disclosed herein, a primary voltage divider of a dual-string DAC is comprised of at least one adjusting circuit. The adjusting circuit is configured to maintain an ideal voltage of a selected resistor node pair across a secondary voltage divider circuit, in response to a primary switch unit selecting the selected resistor node pair. In this manner, impedance isolation is not required between the primary voltage divider and the secondary voltage divider circuit of the dual-string DAC. As a result, as non-limiting examples, the area on an integrated circuit (IC) for a dual-string DAC may be decreased, power consumption of the dual-string DAC may be decreased, and/or the dual-string DAC may have increased performance by not requiring a settling time for the removed impedance isolation circuits.

Other embodiments described below and illustrated by example in FIGS. 15-22, include polarity compensating dual-string digital-to-analog converters (DACs), and related circuits, systems, and methods. In embodiments disclosed herein, a secondary voltage divider of a dual-string DAC includes a switch logic unit. The switch logic unit is configured to compensate for polarity changes in the dual-string DAC to maintain monotonicity in the dual-string DAC. The dual-string DAC being montonic means that the dual-string DAC will convert a digital input code into an representative analog output voltage that increases (or stays constant) or decreases (or stays constant) for a given incremental change in the digital input code. Montonicity may be desired if it is desired for a DAC to convert digital codes to representative analog signals in a linear fashion. The switch logic unit is configured to select a secondary switch among a plurality of secondary switches to divide an input voltage from a primary voltage divider, based on a polarity indicator and the DAC input code, to maintain monotonicity. Each of the secondary switches is connected to a resistor node in a secondary resistor string of the secondary voltage divider. Thus, as a non-limiting example, the dual-string DAC can avoid the need to provide two switches for each resistor node in a primary resistor string to maintain monotonicity.

Before describing embodiments of the polarity compensating dual-string DACs with regard to FIGS. 15-22, examples of dual-string DACs configured to maintain an ideal voltage of a selected resistor node pair across a secondary voltage divider circuit will first be described with regard to FIGS. 2-14.

Figure 2:
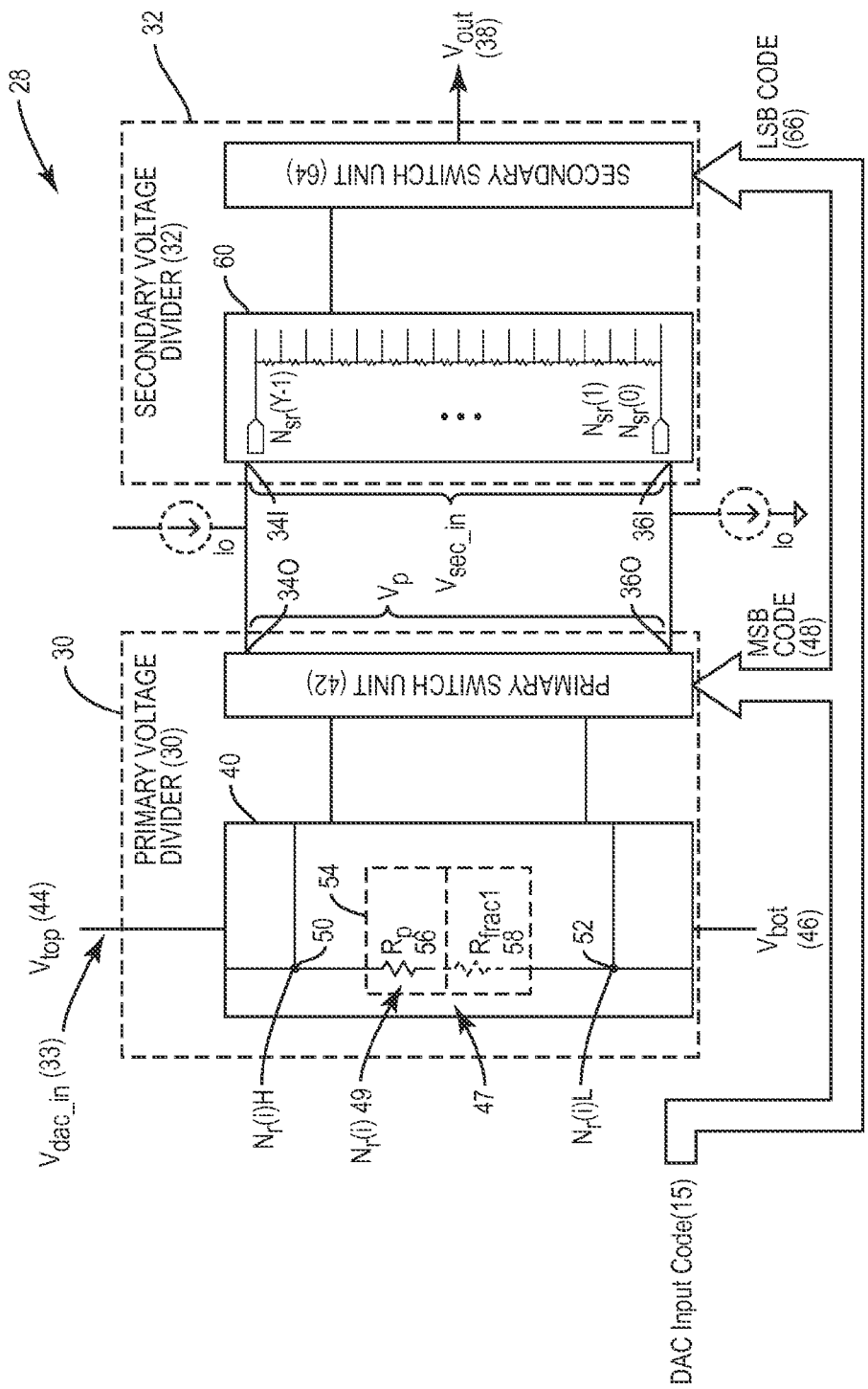
FIG. 2 is an exemplary generalized representation of an adjusting circuit that can be provided in a dual-string DAC, wherein the adjusting circuit is configured to provide fractional resistance to a selected resistor node circuit to maintain an ideal voltage of a selected resistor node pair across a secondary voltage divider circuit.

In this regard, FIG. 2 illustrates an exemplary dual-string DAC 28 configured to maintain an ideal voltage of a selected resistor node pair across a secondary voltage divider circuit. The ideal voltage of the selected resistor node pair across the secondary voltage divider circuit can be maintained without the requirement of providing impedance isolation between a primary voltage divider circuit and a secondary voltage divider circuit. In this regard, the dual-string DAC 28 in this embodiment comprises a primary voltage divider circuit 30 coupled to a secondary voltage divider circuit 32. The primary voltage divider circuit 30 is referred to herein as "primary voltage divider 30." The secondary voltage divider circuit 32 is referred to herein as "secondary voltage divider 32." The primary voltage divider 30 divides a DAC input voltage $V_{dac\_in}$ 33 to provide a coarse primary output voltage $V_p$ to be applied across coarse primary output voltage terminals 34O, 36O, which are coupled to secondary DAC input voltage terminals 34I, 36I, respectively, of the secondary voltage divider 32. The secondary voltage divider 32 divides the coarse primary output voltage $V_p$ to provide a DAC output voltage $V_{out}$ 38.

With continuing reference to FIG. 2, the primary voltage divider 30 comprises a primary resistor string 40 and a primary switch unit 42. The DAC input voltage $V_{dac\_in}$ 33 is comprised of the voltage between a voltage rail node $V_{top}$ 44 and a ground rail node $V_{bot}$ 46. The DAC input voltage $V_{dac\_in}$ 33 is applied across the primary resistor string 40 that is divided in accordance with a most significant bit (MSB) code 48 of the DAC input code 15 in this example. The MSB code 48 comprises a plurality of most significant N binary input bits of the DAC input code 15. In this example, the MSB code 48 controls the primary switch unit 42. The primary switch unit 42 is configured to select a resistor node circuit 47 comprised of a selected resistor node pair $N_r(i)$ 49 in this example. The selected resistor node pair $N_r(i)$ 49 comprises a selected first resistor node $N_r(i)H$ 50 and a selected second resistor node $N_r(i)L$ 52. The resistor node $N_r(i)L$ 52 will be used to indicate the lower resistor node of a selected resistor node pair $N_r(i)$ 49, the voltage at the lower selected resistor node $N_r(i)L$ 52 will have a lower relative voltage than the paired higher selected resistor node $N_r(i)H$ 50. The selected resistor node pair $N_r(i)$ 49 comprises a lower selected resistor node $N_r(i)L$ 52 and a higher selected resistor node $N_r(i)H$ 50 based on the MSB code 48. The voltage at the selected resistor node pair $N_r(i)$ 49 at the lower selected resistor node $N_r(i)L$ 52 and higher selected resistor node $N_r(i)H$ 50 is provided to the secondary voltage divider 32 as a secondary DAC input voltage $V_{sec\_in}$ across the secondary DAC input voltage terminals 34I, 36I. As discussed below, the secondary voltage divider 32 divides the secondary DAC input voltage $V_{sec\_in}$ applied across the secondary DAC input voltage terminals 34I, 36I into a second, finer voltage, which represents the converted DAC input code 15 in analog representation.

With continuing reference to FIG. 2, the divided voltage at the selected resistor node pair $N_r(i)$ 49 in an ideal primary resistor string would be a function of the DAC input voltage $V_{dac\_in}$ 33 divided by the number of primary resistors of the primary resistor string 40. In such an ideal primary resistor string, without distortions or non-linearities from ancillary or secondary load circuits, such as the secondary voltage divider 32, the voltage at the selected resistor node pair $N_r(i)$ 49 will be referred to as an ideal voltage $V_{ideal}$ (not shown). With continuing reference to FIG. 2, if the primary voltage divider 30 and the secondary voltage divider 32 were coupled together without providing an intervening isolating circuit, an actual voltage $V_{actual}$ (not shown) at the selected resistor node pair $N_r(i)$ 49 would be different from the ideal voltage $V_{ideal}$, because the secondary load of the secondary voltage divider 32 would be directly coupled to the primary voltage divider 30 without isolation. Thus, the resistive characteristics of the secondary voltage divider 32 would alter or distort the resistance across the selected resistor node pairs $N_r(i)$ 49.

With continuing reference to FIG. 2, to adjust for the secondary load created when the primary resistor string 40 is directly coupled to the secondary voltage divider 32 without isolation, the primary resistor string 40 includes a first adjusting circuit 54 in this embodiment. The first adjusting circuit 54 includes a primary resistance $R_p$ 56 and at least one first fractional resistance $R_{frac1}$ 58, in this example. In FIGS. 2-14, the first adjusting circuit 54 will comprise the resistor node circuit 47. Thus, as discussed in more detail below, when the primary resistor string 40 is directly coupled to the secondary voltage divider 32 without isolation, the fractional resistance $R_{frac1}$ 58 is coupled to the resistance across the selected resistor node pairs $N_r(i)$ 49. The ohmic value of the fractional resistance $R_{frac1}$ 58 is chosen to compensate and provide resistance across the selected resistor node pair $N_r(i)$ 49 as if the secondary voltage divider 32 were isolated or not coupled to the primary voltage divider 30. Thus, the ideal voltage $V_{ideal}$ provided by the primary voltage divider 30 to the secondary voltage divider 32, according to the selected resistor node pair $N_r(i)$ 49, is maintained. Thus, with the first adjusting circuit 54 in FIG. 2, the need to provide isolation circuits between the primary voltage divider 30 and the secondary voltage divider 32 is not required to maintain the ideal voltage $V_{ideal}$. This is discussed in more detail below starting at FIG. 4. The further dividing of the selected coarse divided primary voltage $V_p$ into the DAC output voltage $V_{out}$ 38 will now be discussed with continued reference to FIG. 2.

With continuing reference to FIG. 2, the coarse primary output voltage $V_p$ across coarse primary output voltage terminals 34O, 36O is applied across the secondary voltage divider 32. The secondary voltage divider 32 comprises a secondary resistor string 60 and a secondary switch unit 64, otherwise known as a "secondary voltage divider switch 64." The secondary voltage divider 32 is configured to receive the coarse primary output voltage $V_p$ at the coarse primary output voltage terminals 34O, 36O as a secondary DAC input voltage $V_{sec\_in}$ applied across the secondary DAC input voltage terminals 34I, 36I. The secondary voltage divider 32 is further configured to receive an LSB code 66. The DAC output voltage $V_{out}$ 38 is selected based on a least significant bit (LSB) code 66 of the DAC input code 15 in this example. The LSB code 66 is also known as the "secondary DAC input code 66." The LSB code 66 controls the secondary switch unit 64, which is configured to select a DAC output voltage $V_{out}$ 38 from a selected secondary resistor node $N_{sr}(0)$-$N_{sr}(Y-1)$, where Y=LSB code 66.

Figure 3:
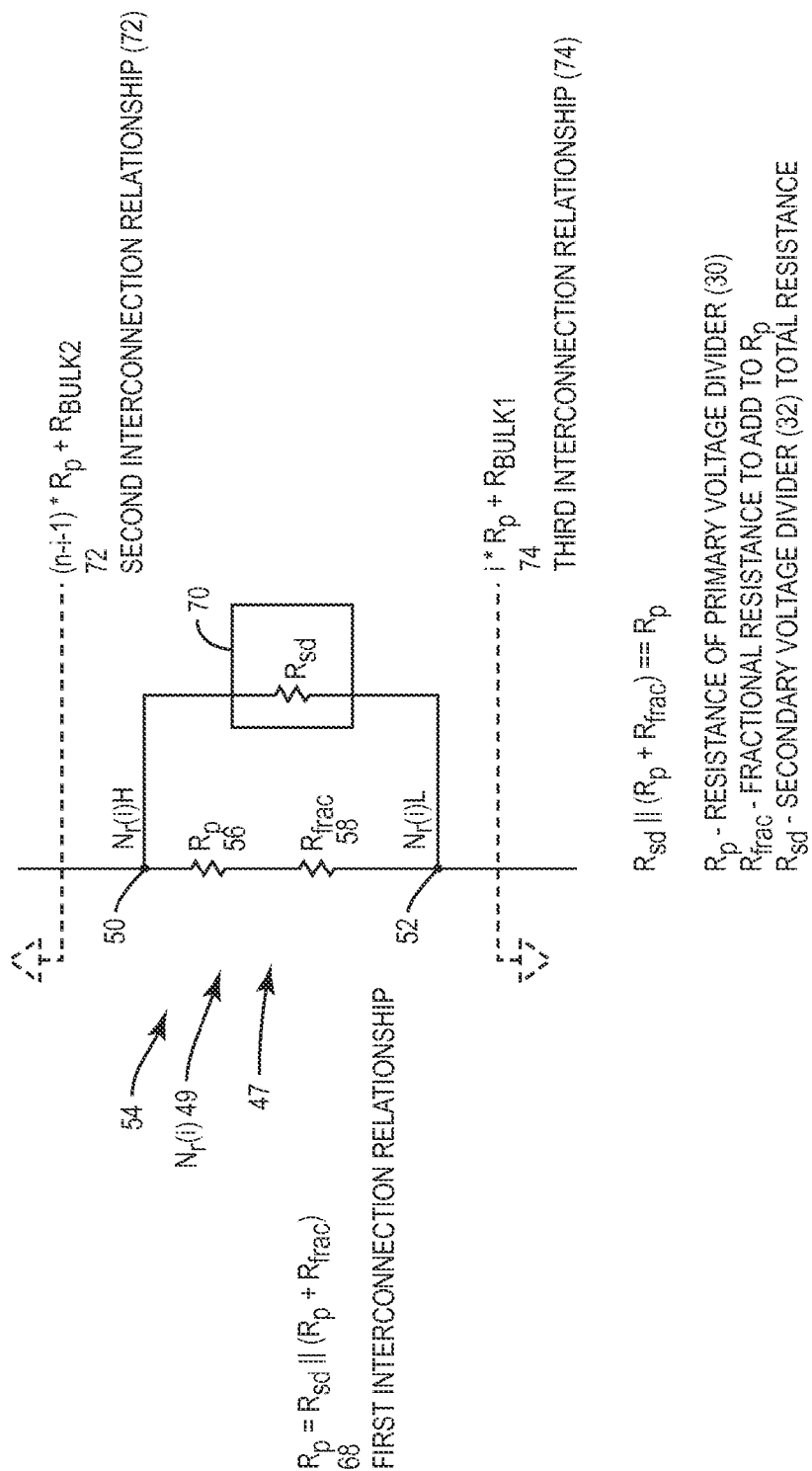
FIG. 3 is an exemplary dual-string DAC that includes an adjusting circuit comprising a primary resistor and a fractional resistor, wherein the adjusting circuit is configured to maintain an ideal voltage provided by a primary voltage divider circuit across a secondary voltage divider circuit, without requiring impedance isolation between the primary voltage divider circuit and the secondary voltage divider circuit.

Maintaining an ideal voltage $V_{ideal}$ as applied across the secondary voltage divider 32 of the dual-string DAC 28 in FIG. 2 has three (3) exemplary interconnection principles when the primary voltage divider 30 and the secondary voltage divider 32 are interconnected without impedance isolation. In this regard, FIG. 3 is an exemplary illustration of these three (3) interconnection principles represented by three exemplary interconnection relationships with further reference to FIGS. 1 and 2. The first interconnection relationship 68 illustrates resistance provided in the first adjusting circuit 54 that is coupled to the selected resistor node pair $N_r(i)$ 49 in the primary voltage divider 30 to maintain the resistance characteristics of the selected resistor node pair $N_r(i)$ 49 as if the secondary voltage divider 32 was impedance isolated from the primary voltage divider 30. In this regard, the first interconnection relationship 68 provides as follows:

$R_p = R_{sd} \| (R_p + R_{frac})$, which can be mathematically represented as:

$1/(1/(R_p + R_{frac}) + (1/R_{sd})) = R_p$

The primary resistance $R_p$ 56 and the first fractional resistance $R_{frac}$ 58 of the first adjusting circuit 54 are coupled between the selected lower selected resistor node $N_r(i)L$ 52 and the higher selected resistor node $N_r(i)H$ 50 of the primary voltage divider 30. The combined primary resistance of the first adjusting circuit 54 comprises the serial resistance of the primary resistance $R_p$ 56 and the fractional resistance $R_{frac}$ 58. A combined secondary serial resistance $R_{sd}$ 70 of the secondary resistor string 60 comprises the total serial resistance of the plurality of secondary resistors $R_s(0)$-$R_s(Y-1)$ of the secondary resistor string 60. Thus, when the first adjusting circuit 54 is coupled in parallel to the secondary resistor string 60 without impedance isolation, the resistance of the first adjusting circuit 54 (i.e., primary resistance $R_p$ 56+fractional resistance $R_{frac}$ 58) is coupled in parallel with the combined secondary serial resistance $R_{sd}$ 70. Thus, the first interconnection relationship 68 is stated as the primary resistance $R_p = R_{sd} || (R_p + R_{frac})$ or $1/(1/(R_p + R_{frac})) + 1/R_{sd})) = R_p$.

The resistances of the primary resistance $R_p$ 56 and the first fractional resistance $R_{frac}$ 58 of the first adjusting circuit 54 are specific to the resistance of the secondary resistor string 60. The resistances of the primary resistance $R_p$ 56 and the first fractional resistance $R_{frac}$ 58 are selected such that when the secondary resistor string 60 is coupled to the selected resistor node pairs $N_r(i)$ 49, the resistance across the selected resistor node pairs $N_r(i)$ 49 is the same as if the secondary voltage divider 32 was impedance isolated from the primary voltage divider 30.

To maintain the ideal voltage $V_{ideal}$ at selected resistor node pair $N_r(i)$ 49 in the dual-string DAC 28 in FIG. 2, in addition to maintaining the resistance across the selected resistor node pair $N_r(i)$ 49, it is also necessary in this example to maintain the resistance above the selected resistor node pair $N_r(i)$ 49 to the voltage rail node $V_{top}$ 44 and the resistance below the selected resistor node pair $N_r(i)$ 49 to the ground rail node $V_{bot}$ 46. In this manner, the total resistance of the primary resistor string 40 is adjusted to maintain the ideal voltage $V_{ideal}$ at resistor node pair $N_r(i)$ 49, without the need for impedance isolation between the primary resistor string 40 and the secondary resistor string 60. Otherwise, the coarse divided primary output $V_p$ divided across the selected resistor node pair $N_r(i)$ 49 will be different from its ideal voltage $V_{ideal}$.

With continuing reference to FIG. 3, a second interconnection relationship 72 is provided to illustrate the total resistance value coupled between the voltage rail node $V_{top}$ 44 (FIG. 2) and the higher selected resistor node $N_r(i)H$ 50. The resistance between the voltage rail node $V_{top}$ 44 and the higher selected resistor node $N_r(i)H$ 50 is adjusted to compensate for adjustments in the selection of the selected resistor node pair $N_r(i)$ 49. The second interconnection relationship 72 provides the total resistance that would be coupled between the voltage rail node $V_{top}$ 44 and the higher selected resistor node $N_r(i)H$ 50, to maintain the resistance of the primary resistor string 40. In this manner, the voltage at the higher selected resistor node $N_r(i)H$ 50 will be maintained equal or substantially equal to the voltage of the equivalent selected resistor node in an ideal primary voltage divider (not shown) with impedance isolation. In this regard, the second interconnection relationship 72 is provided, as follows:

$$(N-i-1)*R_p + R_{bulk2},$$

where $R_{bulk2}$ may be equal to zero (0),

N is the number of selectable selected resistor node pairs $N_r(i)$ 49 (i.e., selectable resistor node pairs) in the primary resistor string 40, and i is the current decoded MSB code 48.

The second interconnection relationship 72 determines the total resistance between the voltage rail node $V_{top}$ 44 and the higher selected resistor node $N_r(i)H$ 50. For an ideal primary resistor string 40, the total resistance would be equal or substantially equal to the number of selectable unique resistor node pairs between the voltage rail node $V_{top}$ 44 and the higher selected resistor node $N_r(i)H$ 50 multiplied by the primary resistance $R_p$ 56. An optional second bulk resistance $R_{bulk2}$ may be included if further calibrations to the resistance are needed based on any biasing in the dual-string DAC 28.

With continuing reference to FIG. 3, a third interconnection relationship 74 is provided to illustrate the total resistance value coupled between the ground rail node $V_{bot}$ 46 (FIG. 2) and the lower selected resistor node $N_r(i)L$ 52. The resistance between the ground rail node $V_{bot}$ 46 and the lower selected resistor node $N_r(i)L$ 52 is adjusted to compensate for adjustments in the selection of the selected resistor node pair $N_r(i)$ 49. The third interconnection relationship 74 provides the total resistance that would be coupled between the ground rail node $V_{bot}$ 46 and the lower selected resistor node $N_r(i)L$ 52, to maintain the resistance of the primary resistor string 40. In this manner, the voltage at the lower selected resistor node $N_r(i)L$ 52 will be maintained at equal or substantially equal to the voltage of the equivalent selected resistor node in an ideal primary voltage divider (not shown) with impedance isolation. In this regard, the third interconnection relationship 74 is provided, as follows:

$$i*R_p + R_{bulk1},$$ where $R_{bulk1}$ may be equal to zero (0).

N is the number of selectable selected resistor node pairs $N_r(i)$ 49 (i.e., selectable resistor node pairs) in the primary resistor string 40, and i is the current decoded MSB code 48.

The third interconnection relationship 74 determines the total resistance between the ground rail node $V_{bot}$ 46 and the lower selected resistor node $N_r(i)L$ 52. For an ideal primary resistor string 40, the total resistance would be equal or substantially equal to the number of selectable unique resistor node pairs between the ground rail node $V_{bot}$ 46 and the lower selected resistor node $N_r(i)L$ 52 multiplied by the primary resistance $R_p$ 56. An optional second bulk resistance $R_{bulk1}$ may be included if further calibrations to the resistance are needed based on any biasing in the dual-string DAC 28. The ideal voltage will be maintained at $Nr(i)L$ 52 and $Nr(i)H$ 50 when all three interconnection relationships are simultaneously met.

In each of the following exemplary embodiments, the resistances, referred to as the primary resistance $R_p$ 56 and the at least one first fractional resistance $R_{frac}$ 58, may be comprised of a single resistor or a plurality of resistor units $R_u$. Resistor unit $R_u$ is a common resistive unit value that may be combined to total the necessary resistive values for the primary resistance $R_p$ 56 and the at least one first fractional resistance $R_{frac}$ 58. It should be noted that based on the design choices, the resistance of resistor unit R may be a common factor or a common unit included in the primary resistance $R_p$ 56 and the first fractional resistance $R_{frac}$ 58.

Figure 4:
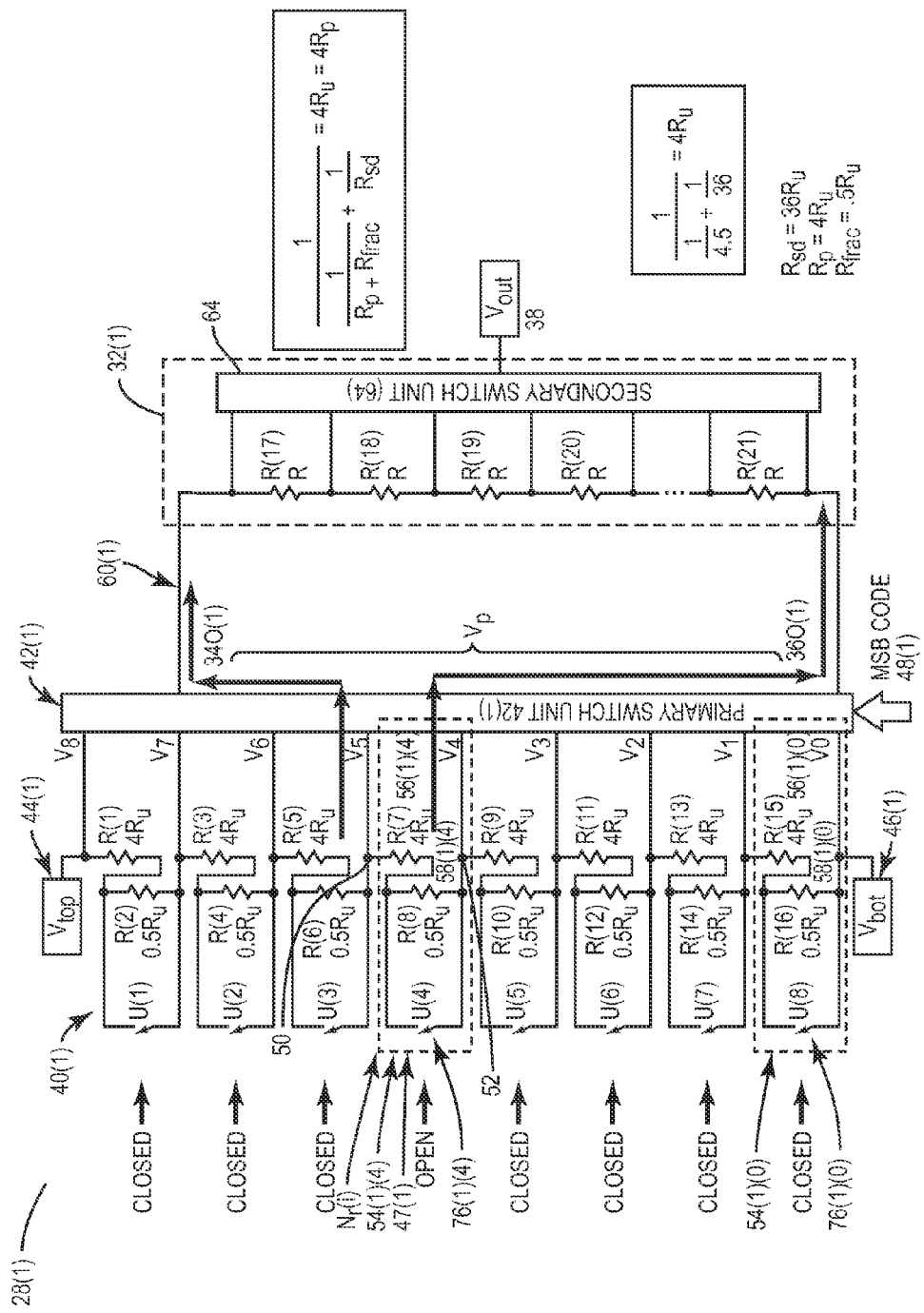
FIG. 4 is an exemplary dual-string DAC that includes an adjusting circuit configured to provide fractional resistance to a selected resistor node circuit to maintain an ideal voltage of a selected resistor node pair across a secondary voltage divider circuit.

FIG. 4 is an exemplary embodiment of a dual-string DAC 28(1) configured to maintain an ideal voltage of a selected resistor node pair across a secondary voltage divider 32(1). The dual-string DAC 28(1) in this example comprises a primary resistor string 40(1) coupled to a secondary resistor string 60(1). The primary switch unit 42(1) is configured to select a resistor node circuit 47(1) among a plurality of resistor node circuits, the resistor node circuit comprises a selected resistor node pair $N_r(i)$ 49(1). The primary resistor string 40(1) being coupled to the secondary resistor string 60(1) creates a parallel resistance when interconnected without isolation circuits. The parallel resistance created is compensated for in accordance with the first interconnection relationship

68, the second interconnection relationship 72, and the third interconnection relationship 74, as discussed above in FIG. 3. To conform to the first, second, and third interconnection relationships 68, 72, 74 in FIG. 3, the primary resistor string 40(1) is comprised of a plurality of first adjusting circuits 54(1)(0)-54(1)(N−1). The number of first adjusting circuits 54(1) is equal to N, where N is the number ($2^{MSB}$) of selectable unique resistor node pairs $N_r(1)(0)$ to $N_r(1)(N−1)$ 49(1) in this example. For purposes of this embodiment, the index "i" will be used to indicate the index of the selected resistor node pair, and "not i" will be used to indicate the index(es) of any non-selected resistor node pairs. For example, if i=three (3) out of a range of 0 to 7, "$N_r(1)(3)$ 49(1)" indicates the fourth selected resistor node pair $N_r(1)(3)$ 49(1), where the indexes begin at 0. As an example of "not i", this will indicate any other selected resistor node pair $N_r(1)$(not 3) not represented by the selected resistor node pair $N_r(1)(3)$ 49(1).

With continued reference to FIG. 4, a selected unique resistor node pair $N_r(1)(i)$ 49(1) from among the selectable unique resistor node pairs $N_r(1)(0)-N_r(1)(N−1)$ 49(1) is comprised of one of the first adjusting circuits 54(1)(0)-54(1)(N−1). The selected unique resistor node pair $N_r(1)(i)$ 49 comprises a primary resistance $R_p$ 56(1), at least one first fractional resistance $R_{frac}$ 58(1), and a first switch $S_p1$ 76(1). One of the at least one first adjusting circuits 54(1)(0)-54(1)(N−1) is configured with the primary resistance $R_p$ 56(1) and the at least one first fractional resistance $R_{frac1}$ 58(1) coupled in series. To satisfy the first interconnection relationship 68 relationship in FIG. 3, the first adjusting circuits 54(1)(0)-54(1)(N−1) are further configured with respective first switches $S_p1$ 76(1)(0)-76(1)(N−1) coupled in parallel with corresponding first fractional resistances $R_{frac1}$ 58(1)(0)-58(1)(N−1). The selected resistor node pair $N_r(1)(i)$ 49(1) is configured to place the first switch $S_p1$ 76(1)(i) in a coupling mode by opening the first switch $S_p1$ 76(1)(i). The first switch $S_p1$ 76(1)(i) is associated with the selected resistor node pair $N_r(1)(i)$ 49(1), thus creating a combined serial resistance of the primary resistance $R_p$ 56(1)(i) and the first fractional resistance $R_{frac1}$ 58(1)(i) for the selected resistor node pair $N_r(1)(i)$ 49(1). This combined serial resistance, coupled in parallel with the total secondary serial resistance $R_d$ 70 of the secondary resistor string 60(1), will create an effective parallel resistance of $R_p$ 56(1)=$R_{sd}\|(R_p+R_{frac})$. The value of the primary resistance $R_p$ 56(1) will be determined based in accordance with the first interconnection relationship 68 of $R_p=R_{sd}\|(R_p+R_{frac})$ in FIG. 3. The primary resistance $R_p$ 56(1) is a calculated resistance value. Within the selected resistor node pair $N_r(1)(i)$ 49(1) the primary resistance $R_p$ 56(1) will be substantially the same. While the calculated value of the primary resistance $R_p$ 56(1) will be substantially the same, it is possible the actual value of the physically coupled resistances between the selected resistor node pair $N_r(1)(i)$ 49(1) may vary as required based on design choices made.

With continuing reference to FIG. 4, to satisfy the second interconnection relationship 72 and the third interconnection relationship 74 in FIG. 3, any non-selected resistor node pairs $N_r(1)$(not i) are configured to place the first switches $S_p1$ 76(1)(not i) in a decoupling mode. By placing the non-selected resistor node pairs $N_r(1)$(not i) in decoupling mode, the corresponding resistance of the non-selected resistor node pairs $N_r(1)$(not i) will equal or substantially equal the primary resistance $R_p$ 56(1). Decoupling mode is where first switches $S_p1$ 76(1)(not i) are closed. By closing the first switch $S_p^1$ 76(1)(not i) of the non-selected resistor node pairs $N_r(1)$(not i), a short circuit bypassing the corresponding first fractional resistance $R_{frac1}$ 58(1)(not i) is created. By bypassing the corresponding first fractional resistance $R_{frac1}$ 58(1)(not i) the first adjusting circuits 54(1)(not i) are adjusted to substantially equal the primary resistance $R_p$ 56(1). The second interconnection relationship 72 and the third interconnection relationship 74 are met since the first fractional resistance $R_{frac1}$ 58(1)(not i) is removed from the primary resistor string 40(1) when the respective non-selected resistor node pairs $N_r(1)$(not i) are placed in a decoupled mode.

For example, with continuing reference to FIG. 4, as a non-limiting example, MSB code 48(1) has three (3) bits with a bit value of "$100_2$" equal to decimal four $4_{10}$. In normalized resistive units $R_u$, primary resistance $R_p$ is equal to $4R_u$, fractional resistance $R_{frac}$ 58(1)(4) is equal to $0.5R_u$, and the secondary serial resistance $R_{sd}$ 70(1) is equal to $36R_u$. With these design choices, all three of the first, second, and third interconnection relationships 68, 72, 74 in FIG. 3 are satisfied in this example. The first interconnection relationship 68, $R_p=R_{sd}\|(R_p+R_{frac})$, is satisfied based on the equation $1/(1/(R_p+R_{frac})+(1/R_{sd}))=R_p$ with the exemplary values above provided in the parallel resistive equation $1/(1/(4R_u+0.5R_u)+(1/36R_u))=4R_u=1R_p$. In addition, both the second interconnection relationship 72 and the third interconnection relationship 74 in FIG. 3 are satisfied, since the non-selected resistor node pairs $N_r(1)$(not i) are configured to close the first fractional resistance switches $S_{p1}$ 76(1)(not i) associated with the non-selected resistor node pairs $N_r(1)$(not i). The second interconnection relationship 72, $(N−i−1)*R_p+R_{bulk2}$, is satisfied, because the total resistance between the voltage rail node $V_{top}$ 44(1) and the selected resistor node pair $N_r(1)(i)$ 49(1) equals $(N−i−1)*R_p+R_{bulk2}$ 72, where $R_{bulk2}$ equals zero (0). In this example, N is equal to the maximum value of the MSB code 48(1) (e.g., N is equal to eight (8), if MSB code 48(1) has three (3) bits). Also in this example, the selected resistor node pair $N_r(1)(i)$ 49(1) is determined by "i," where "i" is equal to the binary number "$100_2$" or "$4_{10}$", primary resistance $R_p$ 56(1) (4)=$4R_u$ and $R_{bulk2}$=zero (0). Based on the second interconnection relationship 72 $(N−i−1)*R_p+R_{bulk2}$ from FIG. 3, the resistance between the voltage rail node $V_{top}$ 44(1) and the selected resistor node pair $N_r(1)(4)$ 49(1) equals $(8−4−1)*4Ru+0$. The second interconnection relationship 72 in this example further reduces to $3*4Ru+$ or 12Ru. The second interconnection relationship 72 relationship, $(N−i−1)*R_p+R_{bulk2}$ 72, is satisfied since the primary resistance $R_p$ 56(1) equals 4Ru. There are three (3) primary resistances $R_p$ 56(1) provided between the voltage rail node $V_{top}$ 44(1) and the selected resistor node pair $N_r(1)(4)$ 49(1).

With continued reference to FIG. 4, the third interconnection relationship 74, $i*R_p+R_{bulk1}$ 74, will also be satisfied using the same example, where $R_{bulk1}$ is equal to zero (0). The equation reduces to $4*(R_p)+0$ or $4R_p=16R_u$. In the example in FIG. 4, the first fractional resistance switches $S_{p1}$ 76(1)(not i) are all closed. This will short circuit the corresponding fractional resistance $R_{frac}$ 58(1) for each of the four (4) non-selected resistor node pairs $N_r(1)(0)-N_r(1)(3)$ 49(1) located between the ground rail node $V_{bot}$ 46(1) and the selected resistor node pair $N_r(1)(4)$ 49(1). The total resistance between the ground rail node $V_{bot}$ 46(1) and the selected resistor node pair $N_r(1)(4)$ 49(1) is $4R_p=16R_u$.

As described above, FIG. 4 illustrates an exemplary embodiment of a dual-string DAC 28(1) that conforms to each of the three first, second, and third interconnection relationships 68, 72, 74 in FIG. 3. However, there are numerous exemplary embodiments that may utilize these first, second, and third interconnection relationships 68, 72, 74 in many possible configurations. These exemplary embodiments can reduce the number of resistors in a dual-string DAC based on the use or application requirements. It is equally important to minimize unused components because valuable space is wasted if a component has to be built into device and at times during operation when the component is not used. Additionally, one design goal of certain embodiments herein is to eliminate, where possible, isolation circuits that can consume large segments of device area and even slow performance as discussed above.

Figure 5:
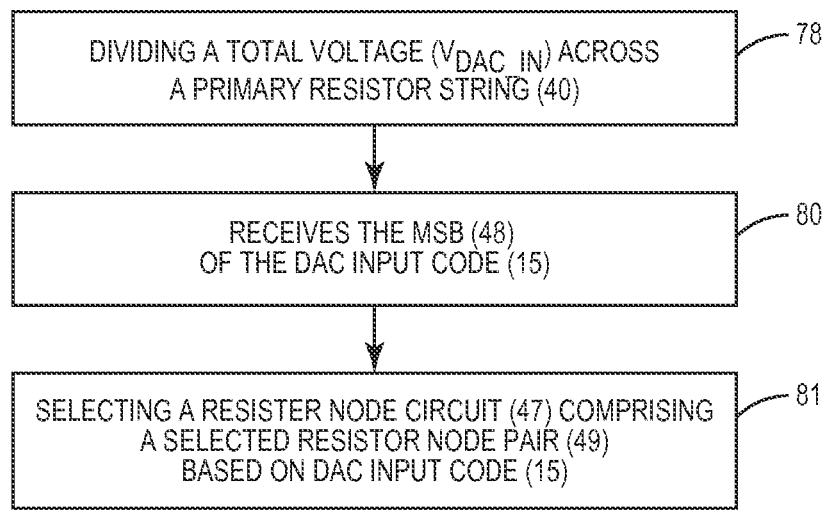
FIG. 5 is a flowchart of an exemplary process of the dual-string DAC in FIG. 4 converting the DAC input code into a representative analog signal while maintaining the ideal voltage of the selected resistor node pair across the secondary voltage divider circuit.

To supplement the discussion of the dual-string DAC 28 above with regard to FIG. 2, FIG. 5 is provided. FIG. 5 is an exemplary process to explain the operation of the dual-string DAC 28. First, the primary voltage divider 30 divides a DAC input voltage ($V_{dac\_in}$) across the primary resistor string 40 having a total resistance into a plurality of coarse divided primary voltages based on the DAC input code 15 (block 78). As discussed above, the primary resistor string 40 comprises a plurality of selectable resistor node pairs $N_r(i)$ 49 configured to divide the DAC input voltage ($V_{dac\_in}$) applied across the primary resistor string 40 into the plurality of coarse divided primary voltages. The primary switch unit 42 receives the MSB code 48 of the DAC input code 15 (block 80), the MSB code 48 is decoded and then converted to select the resistor node pair $N_r(i)$ 49 (block 81) from among a plurality of resistor node pairs $N_r(i)$ 49. The primary switch unit 42 is configured to select a resistor node circuit 47 among a plurality of resistor node circuits, the resistor node circuit comprises a selected resistor node pair $N_r(i)$ 49.

Figure 6:
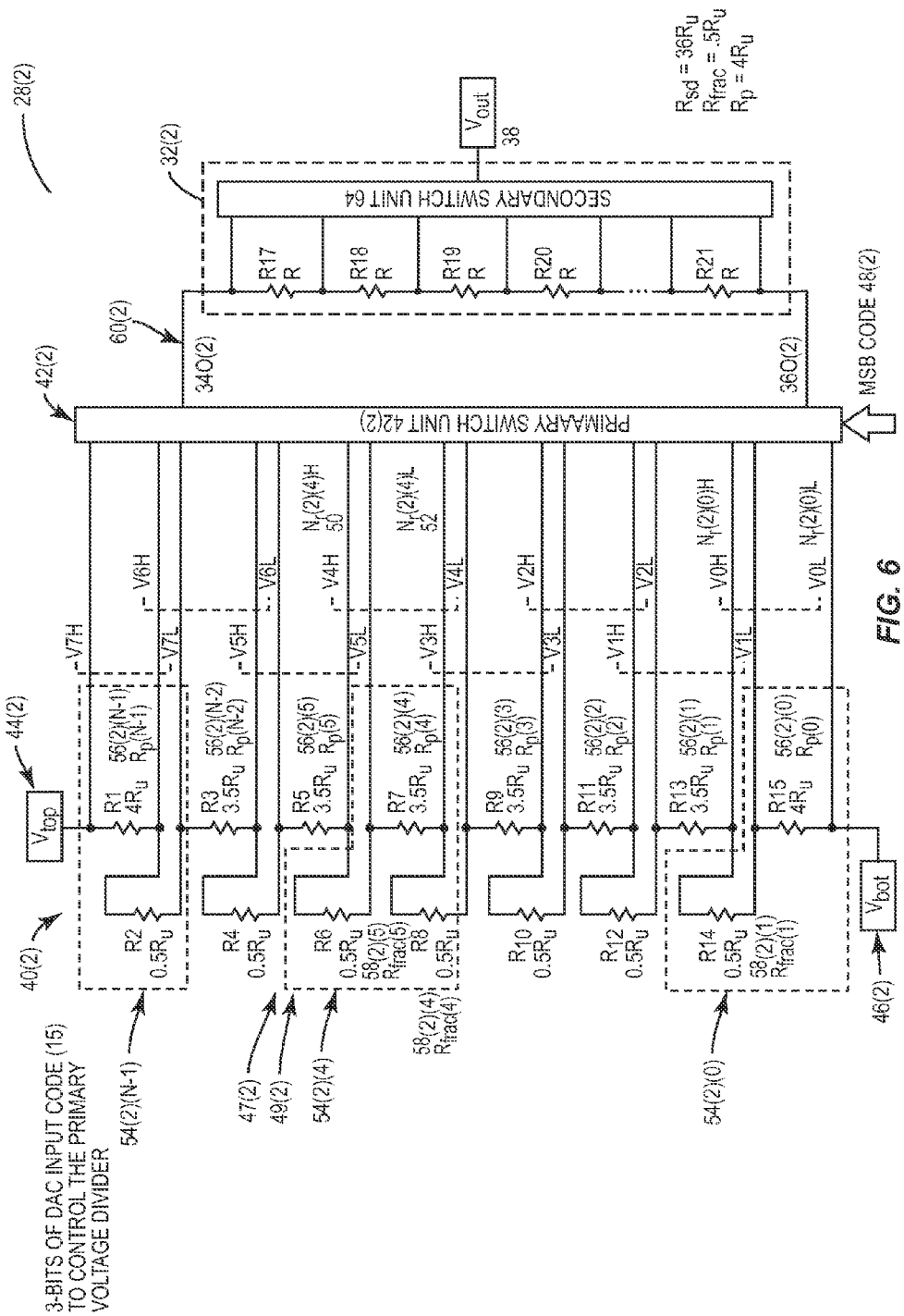
FIG. 6 is another exemplary dual-string DAC that includes an alternative adjusting circuit of the adjusting circuit in the dual-string DAC of FIG. 3.

In this regard, FIG. 6 illustrates another exemplary embodiment of a dual-string DAC 28(2). This exemplary embodiment reduces the total number of resistances coupled in the primary resistor string 40(2), and eliminates the first switch $S_p1$ 76(1) as discussed in FIG. 4 above. The dual-string DAC 28(2) comprises a primary switch unit 42(2) configured to select resistor node circuit 47(2) among a plurality of resistor node circuits, the resistor node circuit comprises a selected resistor node pair $N_r(2)(i)$ 49(2) with a resistance equal to $R_p(2)+R_{frac}(2)$. The selection is made wherein the $R_p(2)$ and $R_{frac}(2)$ resistance values are a design choice with $R_p$ and $R_{frac}$ determined by the first interconnection relationship 68 $R_p(2)=R_{sd}(2)\equiv(R_p(2)+R_{frac}(2))$. The primary switch unit 42(2) is configured to combine a plurality of adjacent resistances such that the combination of adjacent resistances is determined by the three interconnection relationships.

With continued reference to FIG. 6, the primary resistor string 40(2) comprises at least one first adjusting circuit 54(2)(0) to 54(2)(N−1). The first adjusting circuit 54(2)(N−1) is coupled immediately adjacent to the voltage rail node $V_{top}$ 44(2) and is comprised of two resistances, a primary resistance $R_p$ 56(2)(N−1) and a first fractional resistance $R_{frac1}$ 58(2)(N−1). Another first adjusting circuits 54(2)(0) is coupled immediately adjacent to the ground rail node $V_{bot}$ 46(2) and is comprised of two resistances a primary resistance $R_p$ 56(2)(0) and a first fractional resistance $R_{frac1}$ 58(2)(0). Each of the plurality of first adjusting circuits 54(2)(0) 54(2)(N−1) in this example share the at least one first fractional resistance $R_{frac1}$ 58(2)(1) 58(2)(N−1) with the first adjusting circuits 54(2)(1) and 54(2)(N−2) that are immediately adjacent. However, each of the plurality of first adjusting circuits 54(2)(1) to 54(2)(N−2) use an alternate configuration which still conforms to the first interconnection relationship 68, $R_p=R_{sd}\|(R_p+R_{frac})$ 68.

In this regard, in FIG. 6, in each of the plurality of first adjusting circuits 54(2)(1) to 54(2)(N−2) a combination of fractional resistances and primary resistances will be used to construct the total resistance required. The first adjusting circuits 54(2)(1) to 54(2)(N−2) comprise a plurality of primary resistances $R_p$ 56(2)(1) to 56(2)(N−2) equal to the design choice value of the primary resistance $R_p$, based on the first interconnection relationship 68, minus the fractional resistance $R_{frac}$. The primary switch unit 42(2) is configured to include an adjacent combination of the at least one first fractional resistance $R_{frac1}$ 58(2)(1) to 58(2)(N−1) to create a total resistance of primary resistance $R_p$ 56(2)+the fractional resistance $R_{frac}$ 58(2) in the first adjusting circuits 54(2)(i). The resistance value of the plurality of primary resistances $R_p$ 56(2)(1) to 56(2)(N−2) will be adjusted where a resistance value substantially equal to that of the fractional resistance $R_{frac}$ 58(2) is removed from the plurality of primary resistances $R_p$ 56(2)(1) to 56(2)(N−2). The adjustment to the resistance value is necessary because the primary switch unit 42(2) will include the two immediately adjacent first fractional resistances $R_{frac}$ 58(2) into the selected resistor node pair $N_r(2)(1)-N_r(2)(N−2)$ 49. In this configuration, the value of the primary resistances $R_p$ 56(2)(1) to 56(2)(N−2) have been reduced by shrinking their equivalent resistive units, first fractional resistances $R_{frac}$ 58(2) are being reused were possible and additional first fractional resistance resistances have been eliminated saving physical space consumed by the circuit design.

For example, with continuing reference to FIG. 6, MSB code 48(2) has 3 bits so $N=2^3$ or eight (8) and i is equal to the binary value of $100_2$. The decimal equivalent of the binary value of $100_2$ is four ($4_{10}$). In normalized resistive units $R_u$, $R_p=4R_u$, $R_{frac}=0.5R_u$ and $R_{sd}=36R_u$. The first interconnection relationship 68, $R_p=R_{sd}\|(R_p+R_{frac})$, will be met based on resolving the first interconnection relationship 68 with the values above $1/(1/(4R_u+0.5R_u))+\frac{1}{36}R_u))=4R_u=R_p$. The second interconnection relationship 72, $(N-i-1)*R_p+R_{bulk2}$, is met if the total resistance between the voltage rail node $V_{top}$ 44(2) and the selected resistor node pair $N_r(2)(4)$ 49 equals $(N-i-1)*R_p+R_{bulk2}$, where $R_{bulk2}$ may equal zero. In this example, i=four (4), primary resistance $R_p$ 56(2)(4)=$3.5R_u$ and $R_{bulk2}$=zero (0). Based on the second interconnection relationship 72, $(N-i-1)*R_p+R_{bulk2}$, the resistance between the voltage rail node $V_{top}$ 44(2) and the selected resistor node pair must equal $(8-4-1)*4R_u+0$. This reduces to $3*4R_u+0$, and further reduces to 12Ru or 3Rp. The resistances between the voltage rail node $V_{top}$ 44(2) and the selected resistor node pair $N_r(2)(4)$ 49(2) add up as follows: $R_p$ 56(2)(5)+$R_p$ 56(2)(6)+$R_p$ 56(2)(7)+$R_{frac}$ 58(2)(6)+$R_{frac}$ 58(2)(7). With the resistance values inserted the formula reduces to $3.5R_u+3.5R_u+4R_u+0.5R_u+0.5\ R_u$ which equals 12Ru, thus the second interconnection relationship 72 is met. The third interconnection relationship 74, $i*R_p+R_{bulk1}$, where $R_{bulk1}$ may equal to zero (0) reduces to $4*(R_p)+0$ or $4R_p$. Counting the resistance between the ground rail node $V_{bot}$ 46(2) and the selected resistor node pair $N_r(2)(4)$ 49(2) there are $4R_u+3*3.5R_u+3*0.5R_u$ or $16R_u$ or $4R_p$.

In a second example and with continued reference to FIG. 6, the first adjusting circuits 54(2)(0) and 54(2)(N−1) are configured differently from the previous first adjusting circuits 54(2)(1) and 54(2)(N−2), however, the all first adjusting circuits yield the same result. With all other parameters the same, except that MSB code 48(2) will now equal $000_2$, the interconnection relationships 68, 72, 74 will continue to be met. The selected resistor node pair $N_r(2)(0)$ 49(2) comprises the primary resistance $R_p$ 56(2)(0)+the first fractional resistance $R_{frac}$ 58(2)(1) which equals $4.5R_u$. The resistive value of $4.5R_u$ coupled in parallel to $36R_u$ equals $4R_u$ based on the parallel resistive equation as discussed above. The second interconnection relationship 72 is met and reduces to $6*3.5R_u+4R_u+6*0.5R$ further reducing, mathematically, to $28R_u$. 28Ru is the equivalent of seven (7) selectable resistor node pairs $N_r(2)(i)$ 49(2) between the voltage rail node $V_{top}$ 44(2) and the upper selected resistor node $N_r(2)(0)H$ 50(2).

The third interconnection relationship 74, $i*R_p+R_{bulk1}$, where $R_{bulk1}$ is equal to zero (0), reduces to $0*(R_p)+0=0R_u$ between the ground rail node $V_{bot}$ 46(2) and the lower selected resistor node $N_r(2)(0)L$ 52(2). Since the selected resistor node pair $N_r(2)(0)L$ 49(2) is coupled to the ground rail node $V_{bot}$ 46(2), the third interconnection relationship 74 is met. FIGS. 4 and 6 describe exemplary embodiments that comprise selecting a different resistor node pair 49 with a different primary resistance 56 with each unique value of i. It is also possible to eliminate switches in the primary voltage divider 30 by configuring the primary resistance $R_p$ 56 and the fractional resistance $R_{frac}$ 58 to remain constant. In this manner, instead of selecting different resistor node pairs 49, it may be desired to configure the adjusting circuits to reconfigure coupling of primary resistors. It may be desired to reconfigure coupling between a voltage rail node $V_{top}$ 44(2) and the selected resistor node pair $N_r(2)(i)$ 49(2), and a ground rail node $V_{bot}$ 46(2) and the selected resistor node pair $N_r(2)(i)$ 49(2), to maintain the ideal voltage of the selected resistor node pair $N_r(2)(i)$ 49(2) across the secondary voltage divider 32(2), as discussed below.

Figure 7:
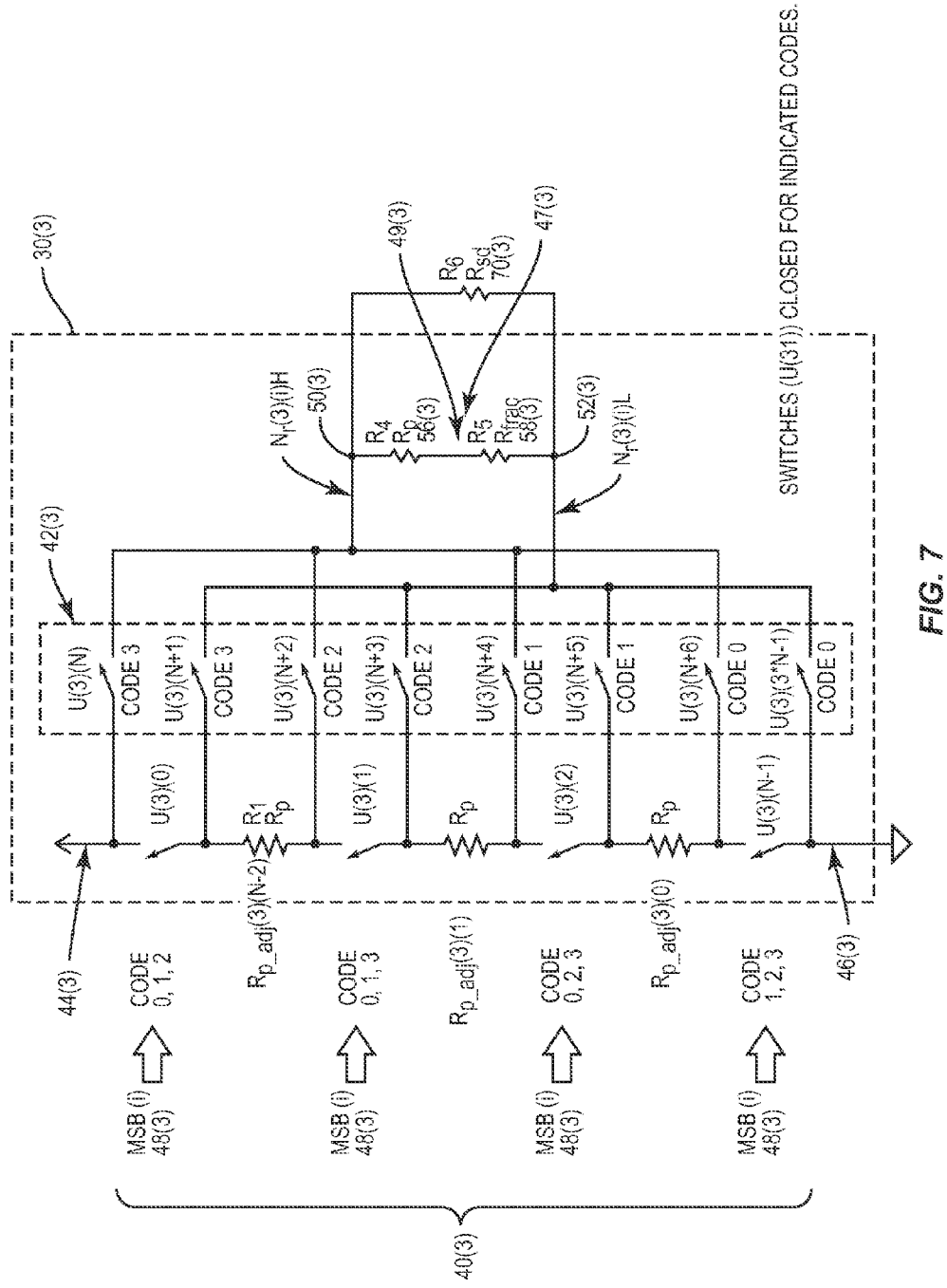
FIG. 7 is another exemplary dual-string DAC that includes alternative adjusting circuits to the adjusting circuit in the dual-string DAC of FIG. 3, wherein one of the adjusting circuits is configured to reconfigure coupling of primary resistors between a voltage rail node and the selected resistor node pair, and a ground rail node and the selected resistor node pair, to maintain an ideal voltage of the selected resistor node pair across the secondary voltage divider circuit.

In this regard, FIG. 7 illustrates an exemplary embodiment of a primary resistor string 40(3) comprising a primary resistance $R_p$ 56(3) and at least one first fractional resistance $R_{frac}$ 58(3). The primary switch unit 42(3) is configured to select a resistor node circuit 47(3) among a plurality of resistor node circuits 47, the resistor node circuit 47(3) comprises a selected resistor node pair $N_r(3)(i)$ 49(3). The first fractional resistance $R_{frac}$ 58(3) may also be referred to as a "shared fractional resistance". The primary resistor string 40(3) in FIG. 7 is designed to operate based on the first, second, and third interconnection relationships 68, 72, 74 in FIG. 3, and included in the operation of the dual-string DACs 28 in FIGS. 4 and 6. However, the primary resistor string 40(3) is an alternative configuration comprising a plurality of adjusting primary resistances $R_{p\_adj}(3)(0)$ to $R_{p\_adj}(3)(N-2)$. The embodiment in FIG. 7 reconfigures the plurality of adjusting primary resistances $R_{p\_adj}(3)(0)$ to $R_{p\_adj}(3)(N-2)$ from between a voltage rail node $V_{top}$ 44(3) and a higher selected resistor node $N_r(3)(i)H$ 50(3) to between the ground rail node $V_{bot}$ 46(3) and a lower selected resistor node $N_r(3)(i)L$ 52(3) with each increment of the MSB code 48(3). In this manner, the voltages of the selected resistor node pair $N_r(3)(i)$ 49(3) will increment by the corresponding number of coarse divided primary voltages. The primary resistance $R_p$ 56(3) is serially coupled to the first fractional resistance $R_{frac}$ 58(3). The serial coupling of the primary resistance $R_p$ 56(3) and the first fractional resistance $R_{frac}$ 58(3) is further coupled in parallel to the secondary resistor string 60(3). The parallel coupling will satisfy the first interconnection relationship 68, $R_p=R_{sd}||(R_p+R_{frac})$. The second interconnection relationship 72 $(N-i-1)*R_p+R_{bulk2}$ defines the resistance between the voltage rail node $V_{top}$ 44(3) and the higher selected resistor node $N_r(3)(i)H$ 50(3). The third interconnection relationship 74, $i*R_p+R_{bulk1}$, defines the resistance between the ground rail node $V_{bot}$ 46(3) and the lower selected resistor node $N_r(3)(i)L$ 52(3).

With continuing reference to FIG. 7, the decoded output of the MSB code 48(3) will control a plurality of primary resistor string switches U(30(0) to U(3)(3*N-1). The first N of the plurality of primary resistor string switches U(3)(0) to U(3)(N-1) are coupled between the plurality of adjusting primary resistances $R_{p\_adj}(3)(0)$ to $R_{p\_adj}(3)(N-2)$. A remaining plurality of primary resistor string switches U(3)(N) to U(3)(3*N-1) are coupled between the plurality of primary resistances $R_{p\_adj}(3)(0)$ to $R_{p\_adj}(3)(N-2)$ and the shared serial coupling of the primary resistance $R_p$ 56(3) and the at least one first fractional resistance $R_{frac}$ 58(3). Based on the decoded output of the MSB code 48(3), the remaining plurality of primary resistor string switches U(3)(N) to U(3)(3*N-1) will selectively couple the shared serial coupling of the primary resistance $R_p$ 56(3) and the first fractional resistance $R_{frac}$ 58(3) within the primary resistor string 40(3). This selective coupling based on the MSB code 48(3) will be configured according to the second interconnection relationship 72 and the third interconnection relationship 74 as discussed below.

Figure 8A:
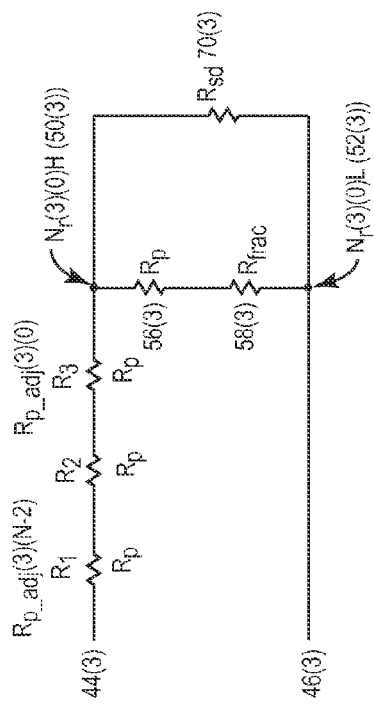
FIG. 8A is an exemplary circuit diagram showing the resistive configuration of the exemplary dual-string DAC of FIG. 6, wherein the primary voltage divider circuit of the dual-string DAC is controlled by a DAC input code of zero (0)

In continuing reference to FIG. 7, FIG. 8A shows an example of operation where MSB code 48(3) has two (2) bits with a maximum value of $N=2^2$=four (4) and for this example has a MSB code 48(3) value equal to $00_2$ or in a decimal conversion $i$=zero $(0_{10})$. In normalized resistive units $R_u$: $R_p=4Ru$, $R_{frac}=0.5R_u$, $R_{p\_adj}(3)(0)$ to $R_{p\_adj}(3)(N-2)=R_p$, and $R_{sd}=36R_u$. The first interconnection relationship 68, $R_p=R_{sd}||(R_p+R_{frac})$, resolves to $1/(1/(4R_u+0.5R_u)+(1/36R_u)) =4R_u=R_p$. The second interconnection relationship 72, $(N-i-1)*R_p+R_{bulk2}$, where $R_{bulk2}$ is equal to zero (0), resolves to $(4-0-1)*R_p+0$ or $3R_p$. When i=zero (0), primary resistor string switches U(3)(0) U(3)(1) U(3)(2) U(3)(10) U(3)(11) are closed. These adjusting primary resistor string switch closures insert three (3) adjusting primary resistances $R_{p\_adj}(3)(0)$ to $R_{p\_adj}(3)(N-2)$ in series between the voltage rail node $V_{top}$ 44(3) and the higher selected resistor node $N_r(3)(0)H$ 50(3). This insertion of adjusting primary resistances $R_{p\_adj}(3)(0)$ to $R_{p\_adj}(3)(N-2)$ causes the second interconnection relationship 72 to be met. The third interconnection relationship 74, $i*R_p+R_{bulk1}$, where $R_{bulk1}$ is equal to zero (0), reduces to $0*R_p+0$ or $0R_p$. This couples the lower selected resistor node $N_r(3)(0)L$ 52(3) to the ground rail node $V_{bot}$ 46(3) and the resistance is equal to $0R_p$, thus the third interconnection relationship 74 is met.

Figure 8B:
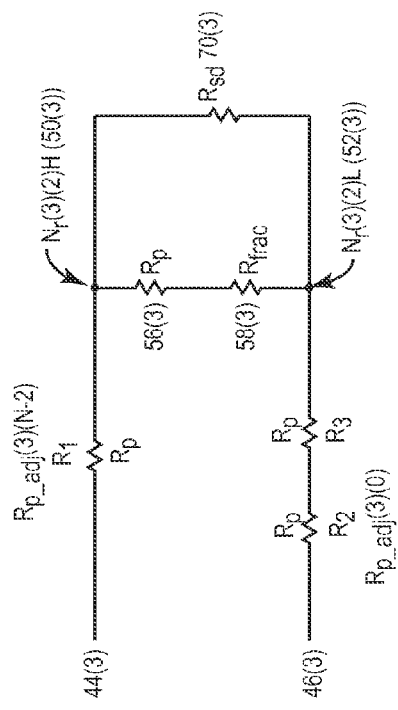
FIG. 8B is an exemplary circuit diagram showing the resistive configuration of the exemplary dual-string DAC of FIG. 6, wherein the primary voltage divider circuit of the dual-string DAC is controlled by a DAC input code of two ($2_{10}$)

In continuing reference to FIG. 7, FIG. 8B shows an additional example of operation where MSB code 48(3) has 2 bits with a maximum value of $N=2^2$=four (4) and for this example has a MSB code 48(3) value equal to $10_2$ or decimally converted, i is equal to two $(2_{10})$. In normalized resistive units $R_u$: $R_p$ is equal to $4R_u$; $R_{frac}=0.5R_u$; $R_{p\_adj}(3)(0)$ to $R_{p\_adj}(3)(N-2)=R_p$; and $R_{sd}=36R_u$. The first interconnection relationship 68, $R_p=R_{sd}||(R_p+R_{frac})$, resolves to $1/(1/(4R_u+0.5R_u)+1/36R_u))=4R_u=R_p$. The second interconnection relationship 72, $(N-i-1)*R_p+R_{bulk2}$, where $R_{bulk2}$ is equal to zero (0) resolves to $(4-2-1)*R_p+0$ or $1R_p$. When i=2, primary resistor string switches U(3)(0) U(3)(2) U(3)(3) U(3)(6) U(3)(7) are closed. This places one (1) $R_{p\_adj}(3)(2)$ between the voltage rail node $V_{top}$ 44(3) and the higher selected resistor node $N_r(3)(0)H$ 50(3), or $1R_p$, thus the second interconnection relationship 72 is met. The third interconnection relationship 74, $i*R_p+R_{bulk1}$, where $R_{bulk1}$ is equal to zero (0). Resolving the third interconnection relationship 74 equals $2*R_p+0$ or $2R_p$. This inserts $2R_p$ between the ground rail node $V_{bot}$ 46(3) and the lower selected resistor node $N_r(3)(2)L$ 52(3), thus the third interconnection relationship 74 is met.

Figure 9:
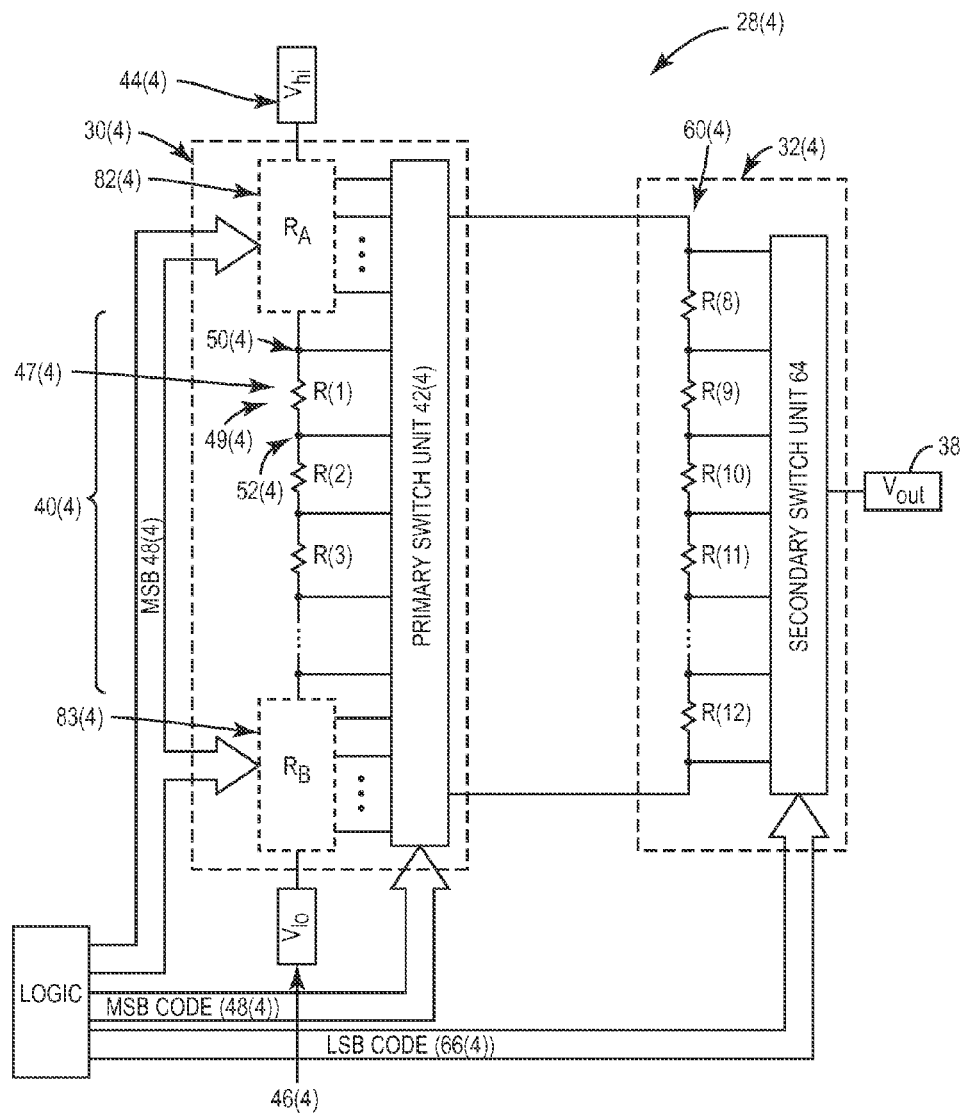
FIG. 9 is an exemplary dual-string DAC including a first and second adjusting circuit configured to provide fractional resistance to a selected resistor node circuit. The first and second adjusting circuits are configured to maintain an ideal voltage of a selected resistor node pair, the first adjusting circuit is coupled between a voltage rail and the selected resistor node pair, and the second adjusting circuit is coupled between a ground rail and the selected resistor node pair.

FIGS. 5-8 are exemplary embodiments using an adjusting circuit embedded within the primary resistor string 40 and more particularly, within the selected resistor node pairs $N_r(i)$ 49. However, further embodiments are possible by introducing at least one additional adjusting circuit between the voltage rail node $V_{top}$ 44 and the primary resistor string 40, or between the ground rail node $V_{bot}$ 46 and the primary resistor string 40, or both. In this regard, FIG. 9 is a generalized approach of a dual-string DAC 28(4) with a configuration comprising at least one additional adjusting circuit. In this example, there is a primary voltage divider 30(4) coupled to a secondary voltage divider 32(4). The primary voltage divider 30(4) comprises a primary resistor string 40(4), a primary switch unit 42(4) and may include a second adjusting circuit 82(4) and/or a third adjusting circuit 83(4). The primary switch unit 42(4) is configured to select a resistor node circuit 47(4) among a plurality of resistor node circuits 47, the resistor node circuit 47(4) comprises a selected resistor node pair $N_r(i)$ 49(4). The second adjusting circuit 82(4) is coupled between a voltage rail node $V_{top}$ 44(4) and the primary resistor string 40(4). The third adjusting circuit 83(4) is coupled between a ground rail node $V_{bot}$ 46(4) and the primary resistor string 40(4). The decoded MSB code 48(4) will determine the setting of the primary switch unit 42(4), and the necessary adjustments in the second adjusting circuit 82(4) and the third adjusting circuit 83(4). A decoded LSB code 66(4) will determine the setting for the secondary switch unit 64, or otherwise known as the "secondary voltage divider switch 64."

Figure 10:
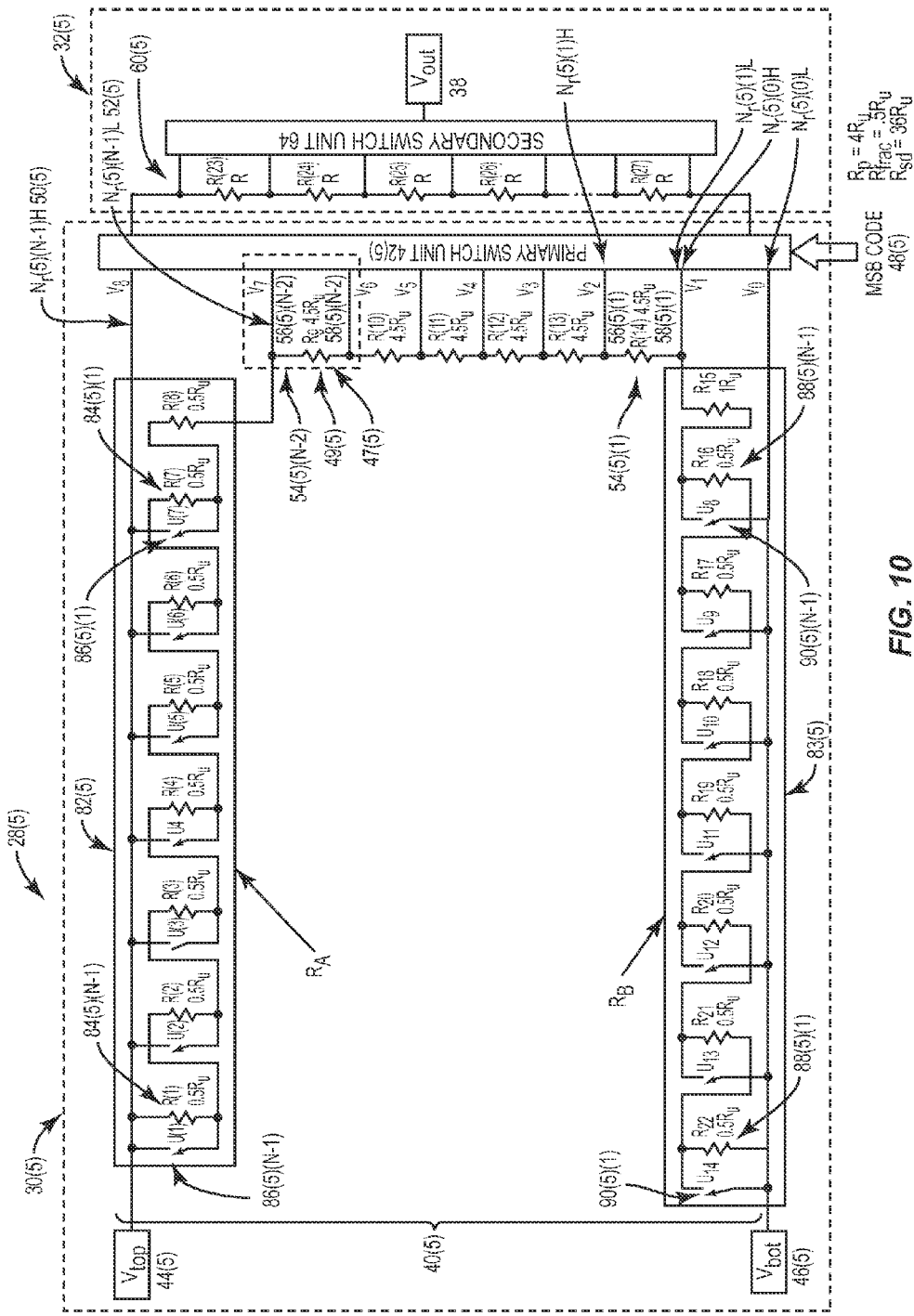
FIG. 10 is an exemplary dual-string DAC including at least one first adjusting circuit as a part of a selected resistor node pair, and other adjusting circuits coupled between a voltage rail and a ground rail of a primary resistor string, wherein the adjusting circuits in conjunction are configured to maintain an ideal voltage of the selected resistor node pair across a secondary voltage divider circuit.

In this regard, FIG. 10 is an illustration of an exemplary embodiment of a dual-string DAC 28(5) with three adjusting circuits. The dual-string DAC 28(5) of FIG. 10 comprises a primary voltage divider 30(5) and a secondary voltage divider 32(5). The primary voltage divider 30(5) comprises at least one first adjusting circuit 54(5)(1) to 54(5)(N−2), a second adjusting circuit 82(5), a third adjusting circuit 83(5) and a primary switch unit 42(5). The primary switch unit 42(5) is configured to select a resistor node circuit 47(5) among a plurality of resistor node circuits 47, the resistor node circuit 47(5) comprises a selected resistor node pair $N_r(5)(i)$ 49(5). The plurality of the first adjusting circuits 54(5)(1) to 54(5)(N−2) comprises a primary resistance $R_p$ 56(5)(1) to 56(5)(N−2) and at least one first fractional resistance $R_{frac}$ 58(5)(1) to 58(5)(N−2). Each of the plurality of first adjusting circuits 54(5)(1) to 54(5)(N−2) are similarly configured to the first adjusting circuits 54(1) to 54(4) discussed above in FIGS. 5-9 comprising a total resistance ($R_p$ 56(5)+$R_{frac}$ 58(5)) to conform to the first interconnection relationship 68, $R_p=R_{sd}\|(R_p+R_{frac})$.

In this regard, the second adjusting circuit 82(5) is coupled between a voltage rail node $V_{top}$ 44(5) and the lower selected resistor node $N_r(5)(N-1)L$ 52(5). The second adjusting circuit 82(5) is comprised of a plurality of second fractional resistances $R_{frac}$ 84(5)(1) to 84(5)(N−1) coupled in parallel to a plurality of second switches 86(5)(1) to 86(5)(N−1). The second adjusting circuit 82(5) is configured to add an additional one of the plurality of second fractional resistances $R_{frac}$ 84(5)(1) to 84(5)(N−1) for each incremental increase in the MSB code 48(5) from zero (0) to N−1. The second adjusting circuit 82(5) does this by initially closing the plurality of second switches 86(5)(1) to 86(5)(N−1) and incrementally opening the plurality of second switches 86(5)(1) to 86(5)(N−1) as the MSB code 48(5) increments from 0 to N−1. In this manner, the second adjusting circuit 82(5) will compensate for any of the plurality of first fractional resistances $R_{frac}$ 58(5)(1) to 58(5)(N−2) being removed from between the voltage rail node $V_{top}$ 44(5) and the high selected resistor node $N_r(5)(i)H$ 50(5) with each of the successively selected resistor node pairs $N_r(5)(0)$ to $N_r(5)(N-1)$ 49(5). By compensating for the first fractional resistance $R_{frac}$ 58(5) changes, the total resistance of the primary resistor string 40(5) from the voltage rail node $V_{top}$ 44(5) to the ground rail node $V_{bot}$ 46(5) will remain substantially constant. The substantially constant total resistance prevents non-linearities when successively selecting the selected resistor node pairs $N_r(5)(0)$ to $N_r(5)(N-1)$ 49(5).

With continuing reference to FIG. 10, the third adjusting circuit 83(5) is coupled between the ground rail node $V_{bot}$ 46(5) and the higher selected resistor node $N_r(5)(0)H$ 50(5). As the MSB code 48(5) increases incrementally from zero (0) to N−1, the third adjusting circuit 83(5) compensates for the additional second fractional resistance $R_{frac}$ 84(5) incrementally added in the second adjusting circuit 82(5). The third adjusting circuit 83(5) compensates by incrementally removing one of a plurality of third fractional resistances $R_{frac}$ 88(5)(1) to 88(5)(N−1). The third adjusting circuit 83(5) performs the compensation by initially opening a plurality of third switches 90(5)(1) to 90(5)(N−1) when the MSB code 48(5) is zero (0). This will add the plurality of third fractional resistances $R_{frac}$ 88(5)(1) to 88(5)(N−1) comprising the third adjusting circuit 83(5) between the selected resistor node pair $N_r(5)(0)$ 49(5) and the ground rail node $V_{bot}$ 46(5). The plurality of third switches 90(5)(1) to 90(5)(N−1) are incrementally closed as the MSB code 48(5) increments from zero (0) to N−1. The incremental closure of the third switches 90(5)(1) to 90(5)(N−1) will compensate for any of the additional first fractional resistances $R_{frac}$ 58(5)(1) to 58(5)(N−2) that are added between the selected resistor node pair $N_r(5)(i)$ 49(5) and the ground rail node $V_{bot}$ 46(5). The primary voltage divider 30(5) is further configured to reverse this process as the MSB code 48(5) is incrementally decreased from N−1 to zero (0). The second adjusting circuit 82(5) removes one of the plurality of second fractional resistances $R_{frac}$ 84(5) by incrementally closing a corresponding one of the plurality of second switches 86(5)(1) to 86(5)(N−1). Simultaneously, the third adjusting circuit 83(5) will incrementally add one of the plurality of third fractional resistances $R_{frac}$ 88(5)(1) to 88(5)(N−1) by incrementally opening a corresponding one of the plurality of third switches 90(5)(1) to 90(5)(N−1).

In the example embodiment of FIG. 10, MSB code 48(5) has three (3) bits, $N=2^3$=eight (8), $R_p=4R_u$, $R_{frac}=0.5R_u$, and $R_{sd}=36R_u$. When MSB code 48(5)=i=zero (0), the primary switch unit 42(5) selects the selected resistor node pair $N_r(5)(0)$ 49(5) comprising the third adjusting circuit 83(5). In this example, the selected resistor node pair $N_r(5)(0)$ 49(5) will have a resistance of $4.5R_u$ which satisfies the first interconnection relationship 68, $R_p=R_{sd}\|(R_p+R_{frac})$, by reducing to $(4R_u+0.5R_u)\|36R_u=4R_u$. As discussed above, the second adjusting circuit 82(5) will incrementally add one of the plurality of second fractional resistances $R_{frac}$ 84(5)(1) to 84(5)(N−1) to the primary resistor string 40(5) with each incremental increase in MSB code 48(5). Initially the second adjusting circuit 82(5) begins with the plurality of second switches 86(5)(1) to 86(5)(N−1) closed when i=zero (0). By incrementally opening one of the plurality of second switches 86(5)(1) to 86(5)(N−1), one of the plurality of second fractional resistances $R_{frac}$ 84(5)(1) to 84(5)(N−1) are incrementally added to the primary resistor string 40(5). The second interconnection relationship 72, $(N-i-1)*R_p+R_{bulk2}$, where $R_{bulk2}$ equals zero (0), resolves to $(8-0-1)*(4Ru)+0=28Ru$ between the voltage rail node $V_{top}$ 44(5) and the higher selected resistor node $N_r(5)(0)H$ 50(5). This will result in 28Ru between the voltage rail node $V_{top}$ 44(5) and the higher selected resistor node $N_r(5)(0)H$ 50(5), thus the second interconnection relationship 72 is met. The third interconnection relationship 74, $i*R_p+R_{bulk1}$, where $R_{bulk1}$ equals zero (0), resolves to $0*4R_{u30}$ 0=0Ru between the ground rail node $V_{bot}$ 46(5) and the lower selected resistor node $N_r(5)(0)L$ 52(5). Since the lower selected resistor node $N_r(5)(0)L$ 52(5) is coupled to ground, there is 0Ru between the ground rail node $V_{bot}$ 46(5) and the lower selected resistor node $N_r(5)(0)L$ 52(5), thus the third interconnection relationship 74 is met.

With continuing reference to FIG. 10, MSB code 48(5) increments from zero (0) to one (1), then i=one (1) and the selected resistor node pair $N_r(5)(1)$ 49(5) comprises one of the plurality of first adjusting circuits 54(5)(1). In this example, the selected resistor node pair $N_r(5)(1)$ 49(5) will have a resistance of $4.5R_u$ which satisfies the first interconnection relationship 68, $R_p=R_{sd}\|(R_p+R_{frac})$, by reducing to $(4R_u+0.5R_u)\|36R_u=4R_u$. The second adjusting circuit 82(5) is configured to incrementally add one of the plurality of second fractional resistances $R_{frac}$ 84(5)(1) to the primary resistor string 40(5). The purpose for this is to compensate for the first fractional resistance 58 that is being removed from the primary resistor string 40(5) with each successive increment of the MSB code 48(5). One of the plurality of second fractional resistances $R_{frac}$ 84(5)(1) is incrementally added to the primary resistor string 40(5) between the voltage rail node $V_{top}$ 44(5) and the higher selected resistor node $N_r(5)(1)H$ 50(5). The incremental addition is a result of an increase in MSB code 48(5) and the opening of a corresponding one of the plurality of second switches 86(5)(1). The second interconnection relationship 72, $(N-i-1)*R_p+R_{bulk2}$, resolves to $(8-1-1)*4R_u+0=24R_u$. The resistance between the voltage rail node $V_{top}$ 44(5) and the higher selected resistor node $N_r(5)(1)H$ 50(5) is $24R_u$. With the incremental increase in MSB code 48(5), the third adjusting circuit 83(5) is also configured to incrementally remove one of the plurality of third fractional resistances $R_{frac}$ 88(5)(1) from the primary resistor string 40(5) by closing one of the plurality of third switches 90(5)(1). This causes the third interconnection relationship 74, $i*Rp+R_{bulk1}$, to resolve to $1*4R_u+0=4R_u$ between the ground rail node $V_{bot}$ 46(5) and the lower selected resistor node $N_r(5)(1)L$ 52(5). The total resistance between the ground rail node $V_{bot}$ 46(5) and the lower selected resistor node $N_r(5)(1)L$ 52(5) is $4R_u$. This example embodiment introduces the technique of using a combination of first, second, and third adjusting circuits 54, 82, 83 to adjust the resistances such that the primary voltage divider 30(5) maintains a linear transfer function through each successive resistor node pair $N_r(5)(i)$ 49(5). It is also possible to combine the exemplary embodiments creating a hybrid embodiment. The hybrid may use a combination of first adjusting circuits 54, second adjusting circuits 82 and third adjusting circuits 83 where fractional resistances $R_{frac}$ 58 are shared by adjacent selected resistor node pairs 49, thus further reducing the number of switches and resistances.

Figure 11:
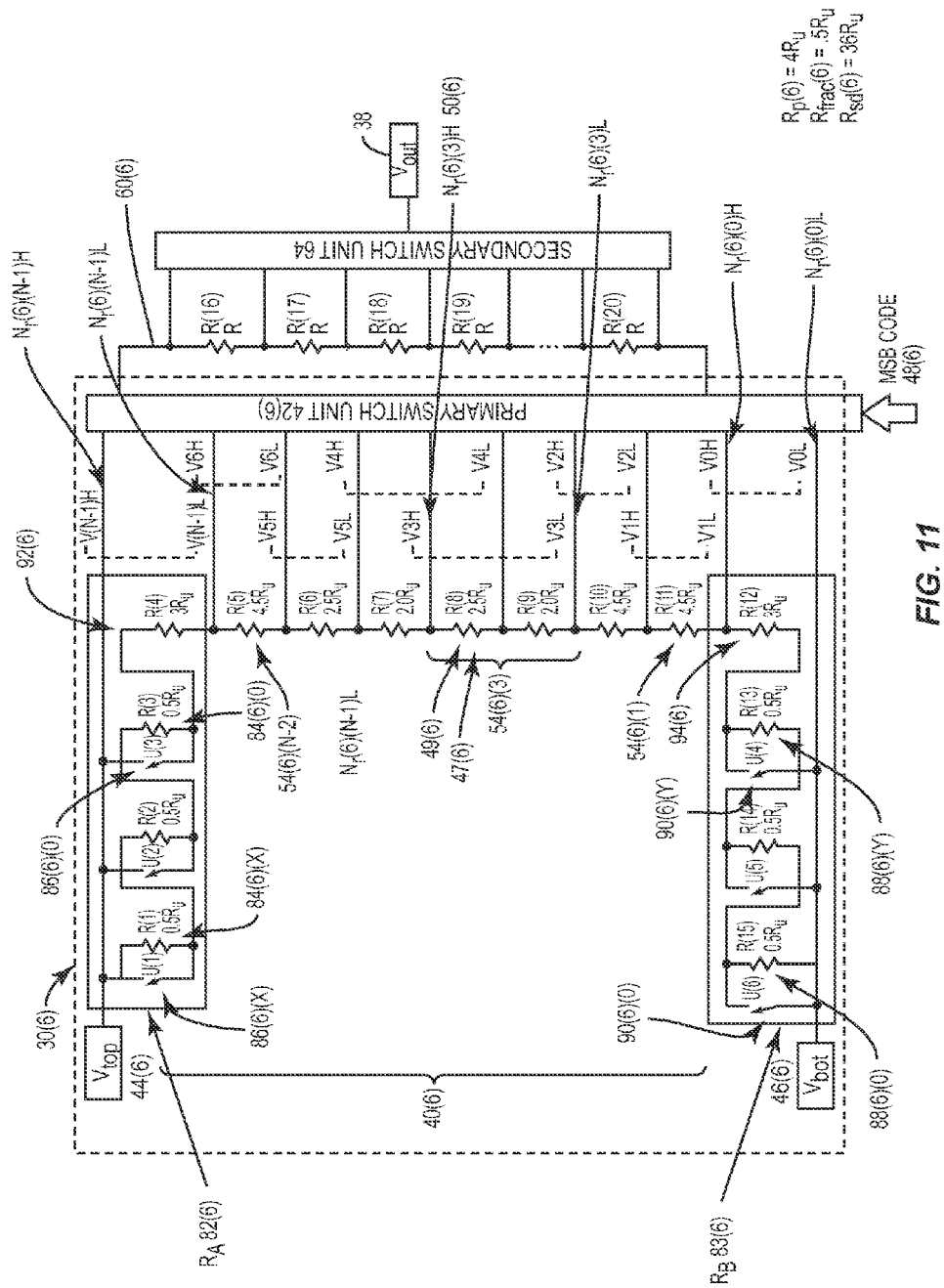
FIG. 11 is another exemplary dual-string DAC that includes alternative adjusting circuits to the adjusting circuits in the dual-string DAC of FIG. 9, wherein the exemplary dual-string DAC configures the primary switch unit to share coupled fractional resistances.

In this regard, FIG. 11 is a hybrid of the exemplary embodiments in FIGS. 6 and 10. The exemplary embodiment of FIG. 11 uses the first, second, and third adjusting circuits 54, 82, 83 to maintain the first, second, and third interconnection relationships 68, 72, 74 as discussed above in FIG. 10. The primary switch unit 42(6) is configured to select a resistor node circuit 47(6) among a plurality of resistor node circuits 47, the resistor node circuit 47(6) comprises a selected resistor node pair $N_r(6)(i)$ 49(6). In addition, the primary switch unit 42(6) is configured such that adjacent and overlapping resistor node pairs 49 defined by resistor node pairs $N_r(6)(i)$ 49(6) are able to combine and share resistances as described in FIG. 6. As a result of the overlapping technique, this embodiment is able to also reduce the number of the second fractional resistances $R_{frac}$ 84(6) and second switches 86(6) in a second adjusting circuit 82(6). The number of third fractional resistances $R_{frac}$ 88(6) and third switches 90(6) in a third adjusting circuit 83(6) may also be reduced.

The exemplary embodiment of FIG. 11 comprises a primary resistor string 40(6) and the primary switch unit 42(6). The primary switch unit 42(6) is configured such that the primary switch unit 42(6) selects a selected resistor node pair $N_r(6)(0)$ to $N_r(6)(N-1)$ 49(6) based on a decoded MSB code 48(6). The resistance of the selected resistor node pair $N_r(6)(0)$ to $N_r(6)(N-1)$ 49(6) equals a design choice value primary resistance $R_p(6)$+fractional resistance $R_{frac}(6)$. This exemplary embodiment may use resistances from adjacent adjusting circuits to create a total selected resistor node pair resistance of $R_p(6)+R_{frac}(6)$. Where the $R_p(6)$ and $R_{frac}(6)$ resistance values are a design choice such that $R_p(6)=R_{sd}(6)\|(R_p(6)+R_{frac}(6))$. The primary switch unit 42(6) is also configured to combine a plurality of adjacent resistances such that the combination of adjacent resistances conform to the first, second, and third interconnection relationships 68, 72, 74. The primary resistor string 40(6) comprises at least one first adjusting circuit 54(6)(1) to 54(6)(N−2), a second adjusting circuit 82(6), and a third adjusting circuit 83(6). The second adjusting circuit 82(6) is coupled between a voltage rail node $V_{top}$ 44(6) and the lower selected resistor node $N_r(6)(N-1)L$ 52(6). The second adjusting circuit 82(6) is comprised of a plurality of second fractional resistances $R_{frac}$ 84(6)(1) to 84(6)(X), a plurality of second switches 86(6)(1) to 86(6)(X) and a second adjusting resistance 92(6). Where X is a design choice dependent on a combination of resistor values in both the primary voltage divider 30(6), the secondary voltage divider 32(6) and may depend on the number of selectable resistor node pairs $N_r(6)(0)$-$N_r(6)(N-1)$ 49(6). The third adjusting circuit 83(6) is coupled to a ground rail node $V_{bot}$ 46(6) and the higher selected resistor node $N_r(6)(0)H$ 50(6). The third adjusting circuit 83(6) is comprised of a plurality of third fractional resistances $R_{frac}$ 88(6)(1) to 88(6)(Y), a plurality of third switches 90(6)(1) to 90(6)(Y) and a third adjusting resistance 94(6). Where Y is a design choice dependent on a combination of resistor values in both the primary voltage divider 30(6), the secondary voltage divider 32(6) and may depend on the number of selectable resistor node pairs $N_r(6)(0)$-$N_r(6)(N-1)$ 49(6). The primary switch unit 42(6) is configured to include a combination of adjacent first fractional resistances $R_{frac}$ 58 for a total resistance of $R_p+R_{frac}$, such that the first interconnection relationship 68, $R_p=R_{sd}\|(R_p+R_{frac})$ in each of the first adjusting circuits 54(6)(1) to 54(6)(N−2) is satisfied. The second adjusting circuit 82(6) is configured to incrementally add or remove second fractional resistances $R_{frac}$ 84(6) that will conform to the second interconnection relationship 72, $(N-i-1)*R_p+R_{bulk2}$, where $R_{bulk2}$ may be zero (0). The third adjusting circuit 83(6) is configured to incrementally remove or add third fractional resistances $R_{frac}$ 88(6) that will conform to the third interconnection relationship 74, $i*R_p+R_{bulk1}$, where $R_{bulk1}$ may be zero (0). In this configuration, because of the reuse of the resistive units in contiguous selected resistor node pairs $N_r(6)$ 49(6) the size of the resistances throughout the primary resistor string 40(6) may be reduced to be a fraction of the primary resistance RP 56 in previous embodiments.

In the exemplary embodiment of FIG. 11, the MSB code 48(6) has three (3) bits. $N=2^3=$eight (8), $R_p=4R_u$, $R_{frac}=0.5R_u$, and $R_{sd}=36R_u$, $R_{bulk1}=Rt_{bulk2}=0$, when MSB code 48(6)=i=zero ($0_{10}$) the selected resistor node pair will be $N_r(6)(0)$ 49(6), which will comprise the third adjusting circuit 83(6). In this example, the third adjusting circuit 83(6) comprising the plurality of third switches 90(6)(0) to 90(6)(Y) are all open, adding the plurality of third fractional resistances $R_{frac}$ 88(6)(0) to 88(6)(Y) into the selected resistor node pair $N_r(6)(0)$ 49(6). The resistance in the selected resistor node pair $N_r(6)(0)$ 49(6) will have a total resistance of $4.5R_u$ which satisfies the first interconnection relationship 68, $R_p=R_{sd}\|(R_p+R_{frac})$, or $(4R_u+0.5R_u)\|36R_u=4R_u$. The second adjusting circuit 82(6) is configured to close the one of the plurality of second switches 86(6)(0), thus removing the plurality of second fractional resistances $R_{frac}$ 84(6)(0) to 84(6)(X) from the primary resistor string 40(6). A number of resistive units $R_u$ coupled between the voltage rail node $V_{top}$ 44(6) and the higher selected resistor node $N_r(6)(0)H$ 50(6) is $28R_u$. The second interconnection relationship 72, $(N-i-1)*R_p+R_{bulk2}$, resolves to (8−0−1)*$4R_{u30}$ 0=$28R_u$. A resistance of 28Ru is the correct resistance between the voltage rail node $V_{top}$ 44(6) and the higher selected resistor node $N_r(6)(0)H$ 50(6). The third adjusting circuit 83(6) is configured to open the plurality of third switches 90(6)(0) to 90(6)(Y), thus adding the plurality of third fractional resistances $R_{frac}$ 88(6)(0) to 88(6)(Y) to the primary resistor string 40(6). Since the lower selected resistor node $N_r(6)(0)L$ 52(6) is coupled to the ground rail node $V_{bot}$ 46(6), the number of resistive units R coupled between the ground rail node $V_{bot}$ 46(6) and the lower selected resistor node $N_r(6)(0)L$ 52(6) is $0R_u$. The third interconnection relationship 74, i*$R_p$+$R_{bulk1}$, resolves to (8−0−1)*$4R_u$+0=$0R_u$ which, in this first example, is the resistance between the ground rail node $V_{bot}$ 46(6) and the lower selected resistor node $N_r(6)(0)L$ 52(6).

In continuing reference to FIG. 11, a second example for setting the MSB code 48(6) to $011_2$ which converts decimally to i equal to three ($3_{10}$), is provided. All other settings remaining constant will result in the primary switch unit 42(6) selecting the selected resistor node pair $N_r(6)(3)$ 49(6). The resistance of the selected resistor node pair $N_r(6)(3)$ 49(6) is $2R_u$+$2.5R_u$ or $4.5R_u$. The first interconnection relationship 68 remains the same and $36R_u$||($4R_u$+$0.5R_u$)=$4R_u$. The second interconnection relationship 72 resolves to (8−3−1)*$4R_u$+0=$16R_u$. The second adjusting circuit 82(6) is configured to open the plurality of second switches 86(6). Opening the plurality of second switches 86(6) adds 1.5Ru to the primary resistor string 40(6) for a total resistance between the voltage rail node $V_{top}$ 44(6) and the higher selected resistor node $N_r(6)(3)H$ 50(6) of $16R_u$. The third interconnection relationship 74 resolves to 3*$4R_u$+0=$12R_u$. The third adjusting circuit 83(6) is configured to close one of the plurality of third switches 90(6)(3). Closing one of the plurality of third switches 90(6)(3) removes 1.5Ru from the primary resistor string 40(6) for a total resistance between the ground rail node $V_{bot}$ 46(6) and the lower selected resistor node $N_r(6)(3)L$ 52(6) of $12R_u$. This hybrid embodiment leverages adjacent resistances and in this manner also reduces the number of switches and resistances in the second adjusting circuit 82 and third adjusting circuit 83.

Figure 12:
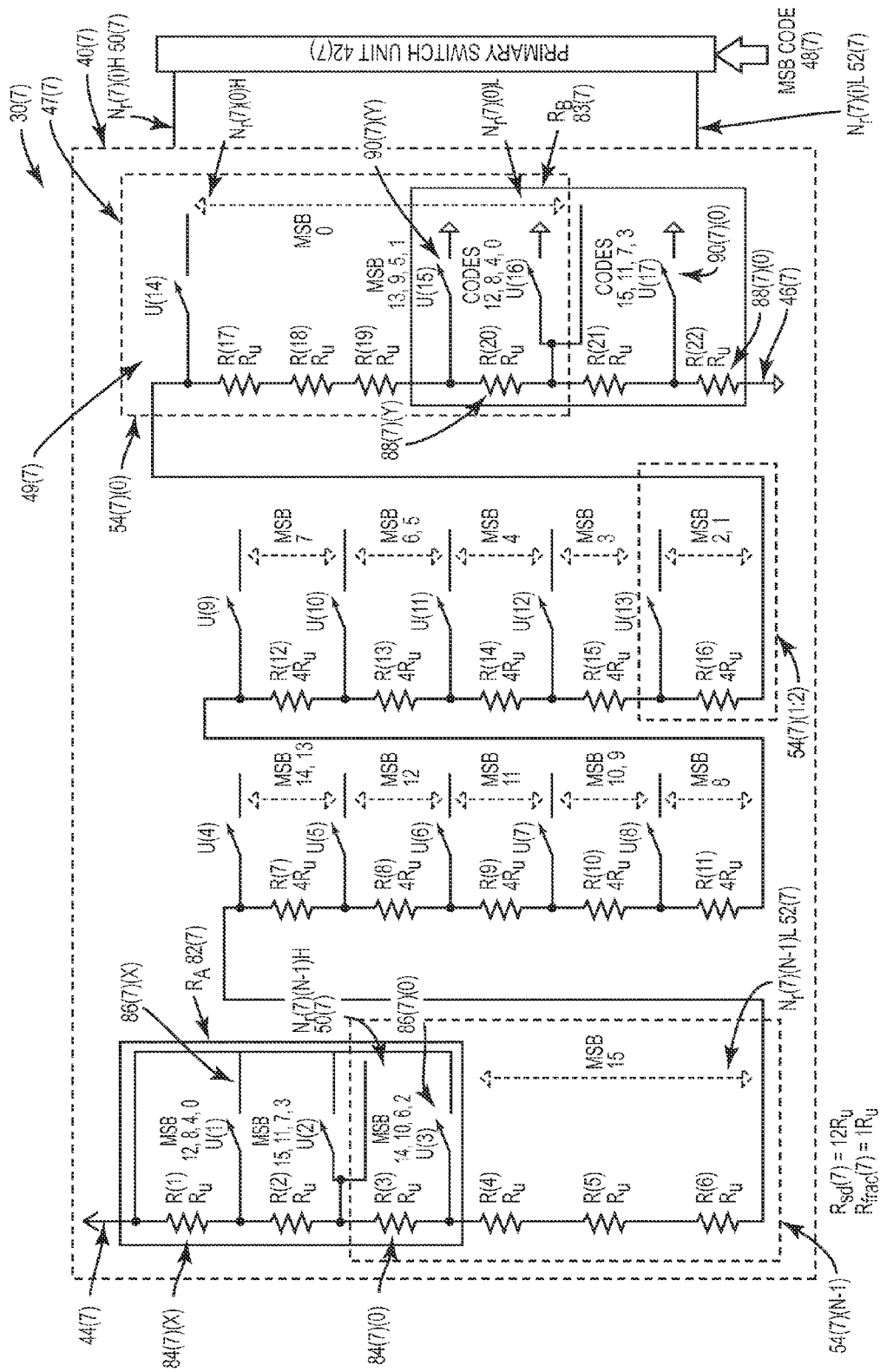
FIG. 12 is another exemplary dual-string DAC that includes alternative adjusting circuits to the adjusting circuits in the dual-string DAC of FIG. 9, wherein the dual-string DAC configures a primary switch unit to share coupled fractional resistances.

In this regard, FIG. 12 is an exemplary embodiment which allows at least one first adjusting circuit 54(7)(0) to 54(7)(N−1) to further reduce the number of switches and resistances by allowing several of the plurality of first adjusting circuits 54(7) to be completely identical for a plurality of unique MSB codes 48(7). That is, this embodiment has selectable resistor node pairs $N_r(6)(i)$ 49(6) that are identical for a plurality of unique MSB codes 48(7) (not shown). This has the advantage of reducing by nearly half the number of resistive units and switches required to construct the primary resistor string 40(7). In this exemplary embodiment, a primary voltage divider 30(7) comprises a primary resistor string 40(7), a primary switch unit 42(7), at least one first adjusting circuit 54(7)(0) to 54(7)(N−1), a second adjusting circuit 82(7), and a third adjusting circuit 83(7). The second adjusting circuit 82(7) is coupled between a voltage rail node $V_{top}$ 44(7) and the primary resistor string 40(7). The third adjusting circuit 83(7) is coupled between a ground rail node $V_{bot}$ 46(7) and the primary resistor string 40(7). The primary switch unit 42(7) coupled to the primary resistor string 40(7) is configured to select a resistor node circuit 47(7) among a plurality of resistor node circuits 47, the resistor node circuit 47(7) comprises a selected resistor node pair $N_r(7)(i)$ 49(7).

In FIG. 12, each one of the plurality of first adjusting circuits 54(7)(0) to 54(7)(N−1) are comprised of a resistance value equaling $R_p(7)$+$R_{frac}(7)$. The resistance value of $R_p(7)$+$R_{frac}(7)$ allows each one of the plurality of first adjusting circuits 54(7)(0) to 54(7)(N−1) to meet the first interconnection relationship 68, $R_p$=$R_{sd}$||($R_p$+$R_{frac}$). The second adjusting circuit 82(7) comprises a plurality of second switches 86(7)(0) to 86(7)(X) configured to add or remove a corresponding one of the plurality of second fractional resistances $R_{frac}$ 84(7)(0) to 84(7)(X) to the primary resistor string 40(7) based on the MSB code 48(7). Adding or removing one of the plurality of second fractional resistances $R_{frac}$ 84(7)(0) to 84(7)(X) enables the second adjusting circuit 82(7) to meet the second interconnection relationship 72, (N−i−1)*$R_p$+$R_{bulk2}$ resistive units between the voltage rail node $V_{top}$ 44(7) and a higher selected resistor node $N_r(7)(i)H$ 50(7).

With continuing reference to FIG. 12, the third adjusting circuit 83(7) comprises a plurality of third switches 90(7)(0) to 90(7)(Y) configured to remove or add a corresponding one of the plurality of third fractional resistances $R_{frac}$ 88(7)(0) to 88(7)(Y) between the ground rail node $V_{bot}$ 46(7) and a lower selected resistor node $N_r(7)(i)L$ 52(7) based on the MSB code 48(7). Adding or removing one of the plurality of third fractional resistances $R_{frac}$ 88(7)(0) to 88(7)(Y) enables the third adjusting circuit 83(7) to meet the third interconnection relationship 74, i*$R_p$+$R_{bulk1}$ resistive units between the ground rail node $V_{bot}$ 46(7) and the lower selected resistor node $N_r(7)(i)L$ 52(7). Adding or removing one of the plurality of second fractional resistances $R_{frac}$ 84(7)(0) to 84(7)(X) and one of the plurality of third fractional resistances $R_{frac}$ 88(7)(0) to 88(7)(Y) compensates for the changing of the selected resistor node pair $N_r(7)(0)$ to $N_r(7)(N−1)$ 49(7). As the equivalent of the first fractional resistances 58 R are removed from between the voltage rail node $V_{top}$ 44(7) and the higher selected resistor node $N_r(7)(i)H$ 50(7), it is necessary for the second adjusting circuit 82(7) to add another fractional resistance 58 $R_{frac}$ into the primary resistor string 40(7). It is also necessary to remove a fractional resistance 58 $R_{frac}$ from the primary resistor string 40(7) between the ground rail node $V_{bot}$ 46(7) and the lower selected resistor node $N_r(7)(i)L$ 52(7) as the MSB code 48(7) is incremented. The adding or removing of fractional resistances 58 $R_{frac}$ is because of the additional first fractional resistance 58 from the previously selected resistor node pair 49 that has just been added between the ground rail node $V_{bot}$ 46(7) and the lower selected resistor node $N_r(7)(i)L$ 52(7).

With regard to FIG. 12, an exemplary embodiment is shown with the following settings: the MSB code 48(7) has four (4) bits with N=$2^4$=sixteen (16), $R_p$=$3R_u$, $R_{frac}$=$1R_u$, and $R_{sd}$=$12R_u$, $R_{bulk1}$=$R_{bulk2}$=0. When MSB code 48(7) equals $0000_2$, converting decimally to i equal to zero ($0_{10}$), this will cause the primary switch unit 42(7) to select a selected resistor node pair $N_r(7)(0)$ 49(7). In this example, the selected resistor node pair $N_r(7)(0)$ 49(7) will comprise the third adjusting circuit 83(7) comprising the plurality of third switches 90(7)(0) to 90(7)(Y). Y is a function of a combination of the resistor value design choice and number of selectable resistor node pairs $N_r(7)(0)$ to $N_r(7)(N−1)$ 49(7). One of the plurality of third switches 90(7)(1) is closed thereby coupling the lower selected resistor node $N_r(7)(0)L$ 52(7) to the ground rail node $V_{bot}$ 46(7), and one of the plurality of third switches 90(7)(Y) is opened. Opening one of the plurality of third switches 90(7)(Y) adds one of the plurality of the third fractional resistances $R_{frac}$ 88(7)(Y) to the selected resistor node pair $N_r(7)(0)$ 49(7). The resistance between the selected resistor node pair $N_r(7)(0)$ 49(7) will have a total resistance of $4R_u$ which satisfies the first interconnection relationship 68, $R_p$=$R_{sd}$||($R_p$+$R_{frac}$) or $3R_u$=$12R_u$||($3R_u$+$1R_u$). The second adjusting circuit 82(7) is configured to close one of the plurality of second switches 86(7)(X) and open two (2) of the plurality of second switches 86(7)(0) to 86(7)(1). In this manner, the second adjusting circuit 82(7) removes one of the plurality of second fractional resistances $R_{frac}$ 84(7)(X) from the primary resistor string 40(7) and adds two (2) of the plurality of second fractional resistances $R_{frac}$ 84(7)(0) to 84(7)(1) to the primary resistor string 40(7). The second interconnection relationship 72, $(N-i-1)*R_p+R_{bulk2}$, resolves to $(16-0-1)*3R+0=45R_u$, which is the resistance between the voltage rail node $V_{top}$ 44(7) and the higher selected resistor node $N_r(7)(0)H$ 50(7). The number of resistive units $R_u$ coupled between the voltage rail node $V_{top}$ 44(7) and the higher selected resistor node $N_r(7)(0)H$ 50(7) is 45Ru and meets the second interconnection relationship 72.

As discussed above, in continuing reference to FIG. 12, the selected resistor node pair $N_r(7)(0)$ 49(7) comprises the third adjusting circuit 83(7), however it is still necessary to meet the third interconnection relationship 74. In this manner, the third adjusting circuit 83(7) is configured to close one of the plurality of third switches 90(7)(1) and open two (2) of the plurality of third switches 90(7)(0) and 90(7)(Y). This configuration removes two (2) of the plurality of third fractional resistances $R_{frac}$ 88(7)(0) to 88(7)(1) and adds one of the plurality of third fractional resistances $R_{frac}$ 88(7)(Y) to the primary resistor string 40(7). In this manner, the third interconnection relationship 74, $i*R_p+R_{bulk1}$ resolves to $0*3R_u+0=0R_u$, which is the resistance between the ground rail node $V_{bot}$ 46(7) and the lower selected resistor node $N_r(7)(0)L$ 52(7). Since the lower selected resistor node $N_r(7)(0)L$ 52(7) is coupled to the ground rail node $V_{bot}$ 46(7), the number of resistive units $R_u$ is zero, thus meeting the third interconnection relationship 74.

With continuing reference to FIG. 12, a second example setting the MSB code 48(7)=i=one (1) and keeping all other settings constant will result in the primary switch unit 42(7) selecting the selected resistor node pair $N_r(7)(1)$ 49(7). The resistance between selected resistor node pair $N_r(7)(1)$ 49(7) is $4R_u$. The first interconnection relationship 68 remains the same as in the example above where the MSB code 48(7) equals zero (0) and is satisfied by the parallel equation $R_p=R_{sd}||(R_p+R_{frac})$ or $(3R_u+1R_u)||12R_u=3R_d$. The second interconnection relationship 72 resolves to $(16-1-1)*3R_u+0=42R_u$. The second adjusting circuit 82(7) is configured to open the plurality of second switches 86(7)(0) to 86(7)(X), thus adding $3R_u$ to the primary resistor string 40(7) between the voltage rail node $V_{top}$ 44(7) and the higher selected resistor node $N_r(7)(1)H$ 50(7) of $42R_u$. The third interconnection relationship 74 resolves to $1*3R_u+0=3R_u$. The third adjusting circuit 83(7) is configured to close one of the plurality of third switches 90(7)(Y), thus removing $3R_u$ from the primary resistor string 40(7) for a total resistance between the ground rail node $V_{bot}$ 46(7) and the lower selected resistor node $N_r(7)(1)L$ 52(7) of $3R_u$. This hybrid embodiment may leverage the same selectable resistor node pairs 49 for unique instances of the MSB code 48(7) based on an alternative configuration of the second adjusting circuit 82(7) and the third adjusting circuit 83(7).

In this regard, and in continuing reference to FIG. 12, when MSB code 48(7) is equal to two (2), the selected resistor node pair $N_r(7)(2)$ 49(7) will remain the same as the selected resistor node pair $N_r(7)(1)$ 49(7) discussed in detail above even with a different MSB code 48(7). The difference is in the second adjusting circuit 82(7) configuration which closes one of the plurality of second switches 86(7)(0) that will remove the plurality of second fractional resistances $R_{frac}$ 84(7)(0) to 84(7)(X) from the primary resistor string 40(7). The removal of the plurality of second fractional resistances $R_{frac}$ 84(7)(0) to 84(7)(X) has the effect of removing $3R_u$ or $1R_u$ from between the voltage rail node $V_{top}$ 44(7) and the higher selected resistor node $N_r(7)(2)H$ 50(7). The third adjusting circuit 83(7) is configured to open the plurality of third switches 90(7)(0) to 90(7)(Y), adding the plurality of third fractional resistances $R_{frac}$ 88(7)(0) to 88(7)(Y) to the primary resistor string 40(7). The adding of the plurality of third fractional resistances $R_{frac}$ 88(7)(0) to 88(7)(Y) has the effect of adding $3R_u$ or $1R_p$ between the ground rail node $V_{bot}$ 46(7) and the lower selected resistor node $N_r(7)(2)L$ 52(7). Fractional resistances R are being reconfigured from between the voltage rail node $V_{top}$ 44(7) and the higher selected resistor node $N_r(7)(1)H$ 50(7) to between the ground rail node $V_{bot}$ 46(7) and the lower selected resistor node $N_r(7)(2)L$ 52(7). The adding and removal of fractional resistances $R_{frac}$ has the effect of increasing the selected resistor node pair $N_r(7)(2)$ 49(7) by one (1) coarse voltage division and yet maintaining the same physically selected resistor node pair $N_r(7)(1)$ 49(7) as when the MSB code 48(7) equals one (1). The number of required fractional resistances $R_{frac}$ used in the second adjusting circuit 82(7) and the third adjusting circuit 83(7) will depend on design choices. The design choices for the resistance values may be made by the designer based for example on area and function, as non-limiting examples. While the exemplary embodiment of FIG. 12 shows a plurality of second fractional resistances $R_{frac}$ 84(7) and a plurality of third fractional resistances $R_{frac}$ 88(7) comprising three (3) resistances, it is possible to even further reduce the number of fractional resistances in the adjusting circuits 54, 82, 83.

Figure 13:
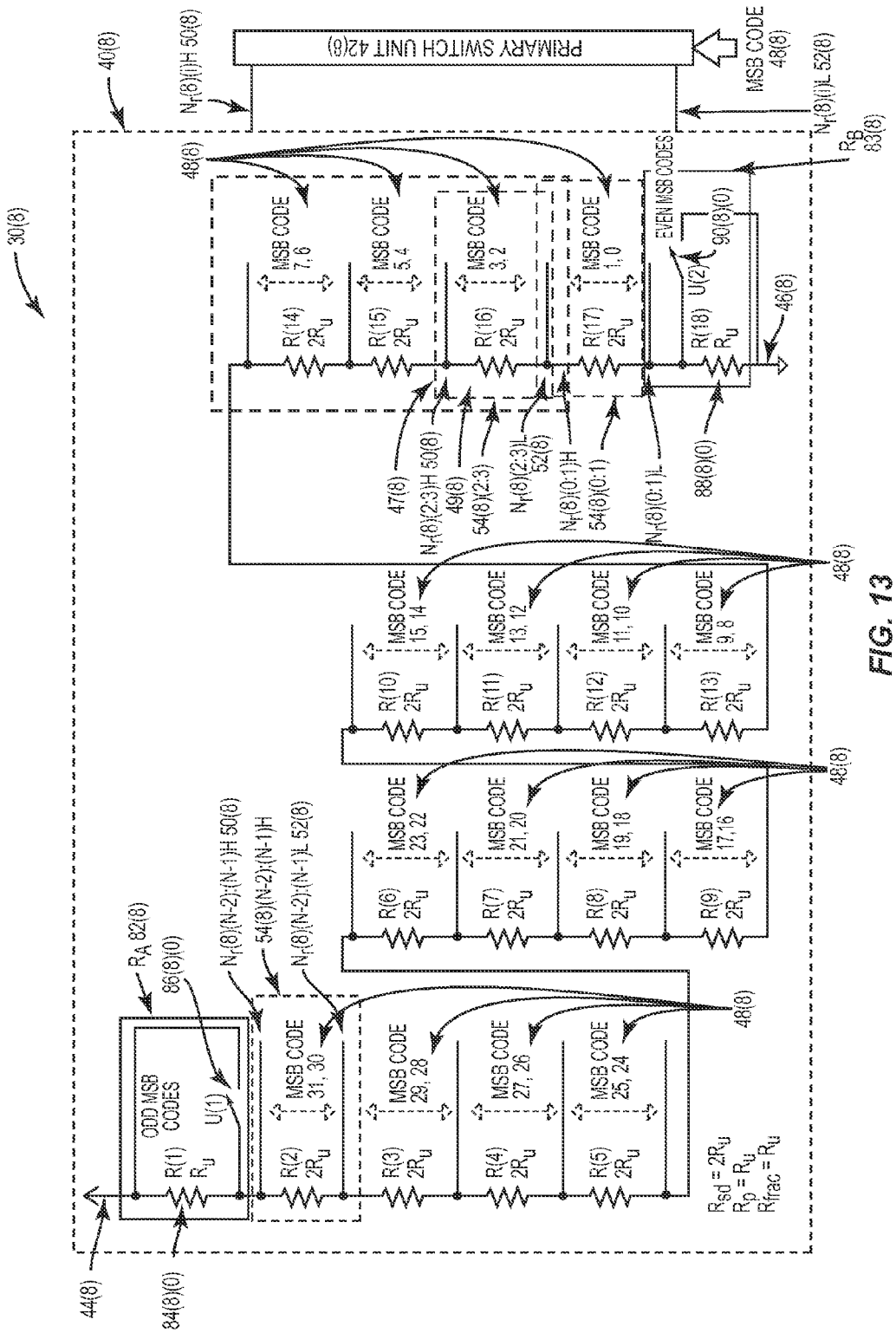
FIG. 13 is another exemplary dual-string DAC that includes alternative adjusting circuits to the adjusting circuits in the dual-string DAC of FIG. 9, wherein the dual-string DAC configures a primary switch unit to share each of at least one first adjusting circuit.

In this regard, FIG. 13 uses a design choice of the MSB code 48(8) having five (5) bits with $N=2^5=$thirty-two (32), $R_p=1R_u$, $R_{frac}=1R_u$, and $R_{sd}=2R_u$, $R_{bulk1}=R_{bulk2}=0$. This exemplary embodiment is comprised of a primary resistor string 40(8), a primary switch unit 42(8), at least one first adjusting circuit 54(8)(0) to 54(8)(N-1), a second adjusting circuit 82(8), and a third adjusting circuit 83(8). The primary switch unit 42(8) is configured to select a resistor node circuit 47(8) among a plurality of resistor node circuits 47, the resistor node circuit 47(8) comprises a selected resistor node pair $N_r(8)(i)$ 49(8). The selected resistor node pair Nr(8)(i) 49(8) is selected based on the corresponding MSB code 48(8) associated with the selected resistor node pair 49(8) in FIG. 13. The switches U1 and U2 are closed for the indicated codes. The first, second, and third interconnection relationship 68, 72, 74 equations remain the same as discussed above. In this example, the secondary serial resistance $R=2R_u$, which allows the primary resistance $R_p=$fractional resistance $R_{frac}=$resistive unit $R_u$, is based on the first interconnection relationship 68, $R_p=R_{sd}||(R_p+R_{frac})$. As a result of $R_p=R_{frac}=R_u$, the second adjusting circuit 82(8) may comprise a single second fractional resistance $R_{frac}$ 84(8), and the third adjusting circuit 83(8) may comprise a single third fractional resistance $R_{frac}$ 88(8). The first interconnection relationship 68, $R_p=R_{sd}||(R_p+R_{frac})$ resolves to $(1R_u+1R_u)||2R_u=1R_u$. The first adjusting circuit 54(8)(0) in the selected resistor node pair $N_r(8)(0)$ 49(8) comprises $2R_u$ or $(R_p+R_{frac})$.

With continuing reference to FIG. 13, when MSB code 48(8) is equal to zero (0), the second adjusting circuit 82(8) opens a single second switch 86(8) adding the single second fractional resistance $R_{frac}$ 84(8) between the voltage rail node $V_{top}$ 44(8) and the higher selected resistor node $N_r(8)(0)H$ 50(8). The adding of a second fractional resistance $R_{frac}$ 84(8) creates a total resistance between the voltage rail node $V_{top}$ 44(8) and the higher selected resistor node $N_r(8)(0)H$ 50(8) of $31R_u$. The second interconnection relationship 72, $(N-i-1)*R_p+R_{bulk2}$ resolves to $(32-0-1)*1R_u+0=31R_u$. The third interconnection relationship 74, $i*R=R_p+R_{bulk1}$ resolves to $0*1R_u+0=0R_u$. Since the lower selected resistor node $N_r(8)$ (0)L 52(8) is coupled to the ground rail node $V_{bot}$ 46(8), the resistance between them is equal to $0R_u$.

Incrementing the MSB code 48(8) of FIG. 13 by one (1) so MSB code 48(8)=i=1, the first adjusting circuit 54(8)(1) for the selected resistor node pair $N_r$(8)(1) 49(8) will remain the same as previously selected resistor node pair $N_r$(8)(0) 49(8). However, as was discussed in greater detail in FIG. 12, the single second fractional resistance $R_{frac}$ 84(8) in the second adjusting circuit 82(8) is removed from between the voltage rail node $V_{top}$ 44(8) and the higher selected resistor node $N_r$(8)(0)H 50(8) by closing the single second switch 86(8). The third adjusting circuit 83(8) adds a single third fractional resistance $R_{frac}$ 88(8)(0) in the third adjusting circuit 83(8) between the ground rail node $V_{bot}$ 46(8) and the lower selected resistor node $N_r$(8)(1)L 52(8) by opening a single third switch 90(8). This has the circuit equivalent effect of reconfiguring the second fractional resistance 84(8) from the second adjusting circuit 82(8) to the third adjusting circuit 83(8). In this manner, the first, second, and third interconnection relationship 68, 72, 74 equations are met, and a linear output voltage is maintained on the selected resistor node pairs $N_r$(8)(0) to $N_r$(8)(N-1) 49(8). This exemplary embodiment and all of the previously discussed primary voltage dividers 30 are voltage sourced driven. The primary voltage divider 30(1) to 30(8) then divides the voltage between the voltage rail node $V_{top}$ 44(1) to 44(8) and the ground rail node $V_{bot}$ 46(1) to 46(8).

Figure 14:
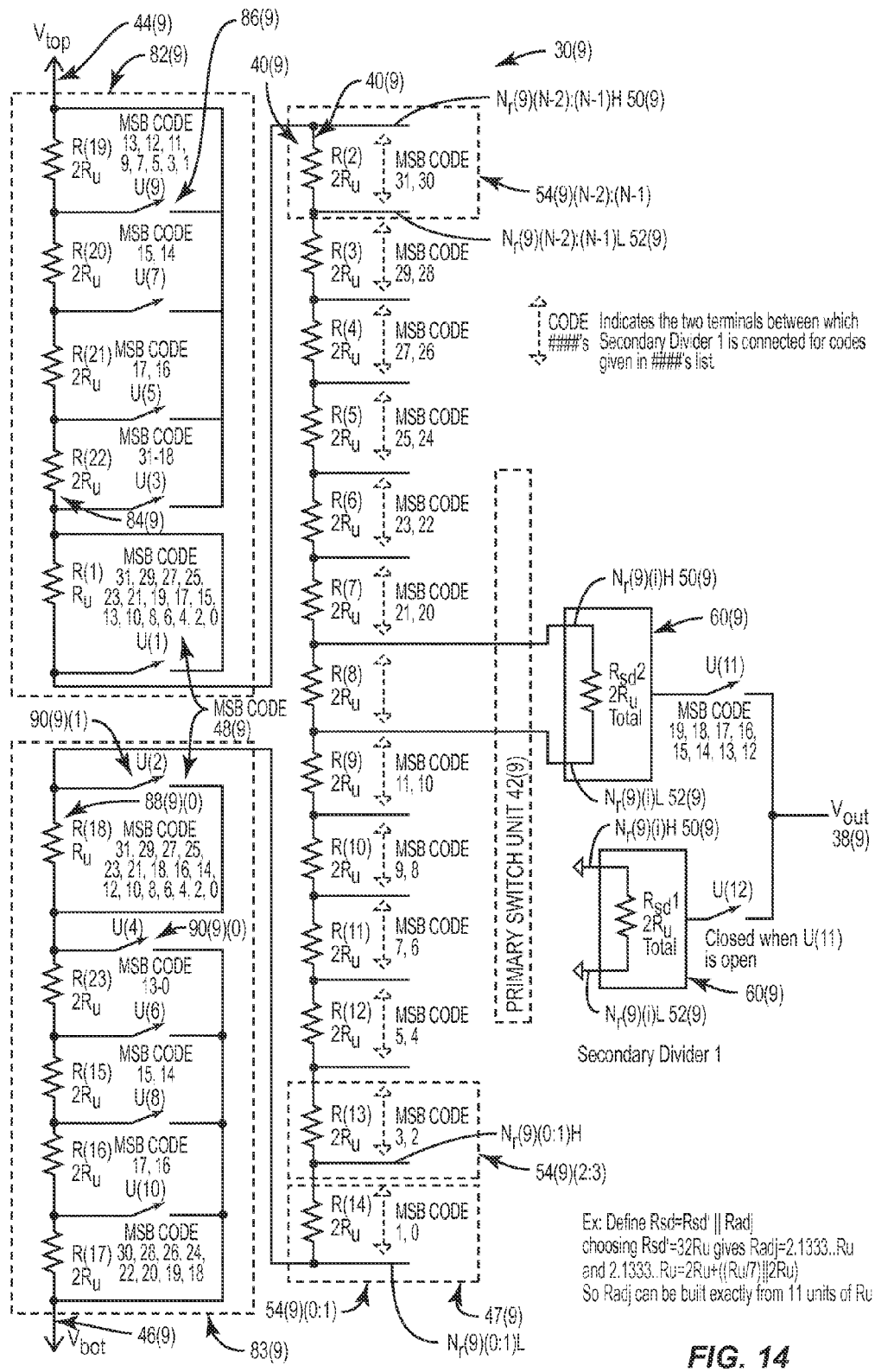
FIG. 14 is another exemplary dual-string DAC that includes alternative adjusting circuits to the adjusting circuits in the dual-string DAC of FIG. 9, wherein the dual-string DAC configures a primary switch unit to share each of at least one first adjusting circuit, wherein an alternative configuration of having a plurality of secondary voltage dividers is shown.

FIG. 14 illustrates an exemplary embodiment of a dual-string DAC 28, which operates in a similar fashion to the embodiments described above in FIGS. 12 and 13. The exemplary embodiment in FIG. 14, will function in conformance with the first, second, and third interconnection relationships 68, 72, 74 as described above. FIG. 14 uses a non-limiting design choice of the MSB code 48(9) having five (5) bits with N=$2^5$=thirty-two (32), $R_p$=$1R_u$, $R_{frac}$=$1R_u$, and $R_{sd1}$=$R_{sd2}$=$2R_u$, $R_{bulk1}$=$R_{bulk2}$=0. This exemplary embodiment is comprised of a primary resistor string 40(9), a primary switch unit 42(9), at least one first adjusting circuit 54(9)(0) to 54(9)(N-1), a second adjusting circuit 82(9), and a third adjusting circuit 83(9). The primary switch unit 42(9) is configured to select a resistor node circuit 47(9) among a plurality of resistor node circuits 47, the resistor node circuit 47(9) comprises a selected resistor node pair $N_r$(9)(i) 49(9). The selected resistor node pair $N_r$(9)(i) 49(9) is selected based on the corresponding MSB code 48(9) associated with the selected resistor node pair 49(9). The switches U1 to U12 are closed for the indicated MSB codes 48(9). The first, second, and third interconnection relationship 68, 72, 74 equations remain the same as discussed the embodiments above. In this example, the secondary serial resistance $R_{sd2}$=$R_{sd1}$=$2R_u$, which allows the primary resistance $R_p$=fractional resistance $R_{frac}$=resistive unit $R_u$. The value of the primary resistance $R_p$=fractional resistance $R_{frac}$=resistive unit $R_u$ is based on the first interconnection relationship 68, $R_p$=$R_{sd}$||($R_p$+$R_{frac}$). The first interconnection relationship 68, $R_p$=$R_{sd}$||($R_p$+$R_{frac}$) resolves to $(1R_u+1R_u)||2R_u=1R_u$. The first adjusting circuit 54(9)(0) in the selected resistor node pair $N_r$(9)(0) 49(9) comprises $2R_u$ or ($R_p$+$R_{frac}$).

With continuing reference to FIG. 14, when MSB code 48(9) is equal to zero (0), the second adjusting circuit 82(9) closes the corresponding switch U1 and opens the remaining switches in the second adjusting circuit 82(9). In this manner, the second adjusting circuit 82(9) adds 8Ru between the voltage rail node $V_{top}$ 44(9) and the higher selected resistor node $N_r$(9)(0)H 50(9). It is important to note that the resistor R8 is 2Ru and has a parallel resistance $R_{sd2}$ of 2Ru. The total parallel resistance at resistor R8 is 1Ru. The adding of the second fractional resistances $R_{frac}$ 84(9) creates a total resistance between the voltage rail node $V_{top}$ 44(9) and the higher selected resistor node $N_r$(9)(0)H 50(9) of $31R_u$. The second interconnection relationship 72, (N-i-1)*$R_p$+$R_{bulk2}$ resolves to $(32-0-1)*1R_u+0=31R_u$. The third interconnection relationship 74, i*R=$R_p$+$R_{bulk1}$ resolves to $0*1R_u+0=0R_u$. Since the lower selected resistor node $N_r$(9)(0)L 52(9) is coupled to the ground rail node $V_{bot}$ 46(9), the resistance between them is equal to $0R_u$.

With continuing reference to FIG. 14, this embodiment provides for a secondary voltage divider represented by a plurality of secondary voltage dividers. As a non-limiting example, FIG. 14 will show an exemplary two (2) secondary voltage dividers represented by the secondary resistor string $R_{sd1}$ and $R_{sd2}$ 60(9). It may be possible for the embodiments in FIGS. 4-14 to comprise a plurality of secondary voltage dividers as may be necessary based on design choices, material limitations and construction techniques, etc. Which secondary resistor string, $R_{sd1}$ or $R_{sd2}$ 60(9), is coupled to the DAC output voltage $V_{out}$ 38(9) will be based on the MSB code 48(9) that is input into the primary switch unit 42(9). As in the example above, if the MSB code 48(9) is zero (0) the primary switch unit 42(9) will open switch U11 and close switch U12. Opening the switch U11 will not remove the secondary resistor string $R_{sd2}$ 60(9) from being coupled to the resistor node pair at R8. However, by closing switch U12, the DAC output voltage $V_{out}$ 38(9) will be provided by the secondary resistor string $R_{sd1}$ 60(9) through the coupling by the switch U12. Further, the secondary resistor string $R_{sd1}$ will also be coupled to the corresponding selected resistor node pair $N_r$(9)(i) 49(9) based on the MSB code 48(9). If the MSB code 48(9) were incremented to twelve (12), the secondary resistor string $R_{sd1}$ 60(9) would be decoupled from both the DAC output voltage $V_{out}$ 38(9) and the primary resistor string 40(9). In addition, based on the MSB code 48(9)=twelve ($12_{10}$) the secondary resistor string $R_{sd2}$ 60(9) is coupled to DAC output voltage Vout 38(9).

Incrementing the MSB code 48(9) of FIG. 14 by one (1) will set i=1. The first adjusting circuit 54(9)(1) for the selected resistor node pair $N_r$(9)(1) 49(9) will remain the same as previously selected resistor node pair $N_r$(9)(0) 49(9). The third adjusting circuit 83(9) adds a single third fractional resistance $R_{frac}$ 88(9)(0) in the third adjusting circuit 83(9) between the ground rail node $V_{bot}$ 46(9) and the lower selected resistor node $N_r$(9)(1)L 52(9) by opening a third switch U2 90(9)(1). In this manner, the first, second, and third interconnection relationship 68, 72, 74 equations are met, and a linear output voltage is maintained on the selected resistor node pairs $N_r$(9)(0) to $N_r$(9)(N-1) 49(9). This exemplary embodiment and all of the previously discussed primary voltage dividers 30 are voltage sourced driven. The primary voltage divider 30(1) to 30(9) then divides the voltage between the voltage rail node $V_{top}$ 44(1) to 44(9) and the ground rail node $V_{bot}$ 46(1) to 46(9). However, instead of driving the primary voltage divider 30 by a voltage source, it is also possible to drive the primary voltage divider 30 with a current source. The voltages across the selected resistor node pair 49 will become a function of the current multiplied by the resistance.

Figure 15:
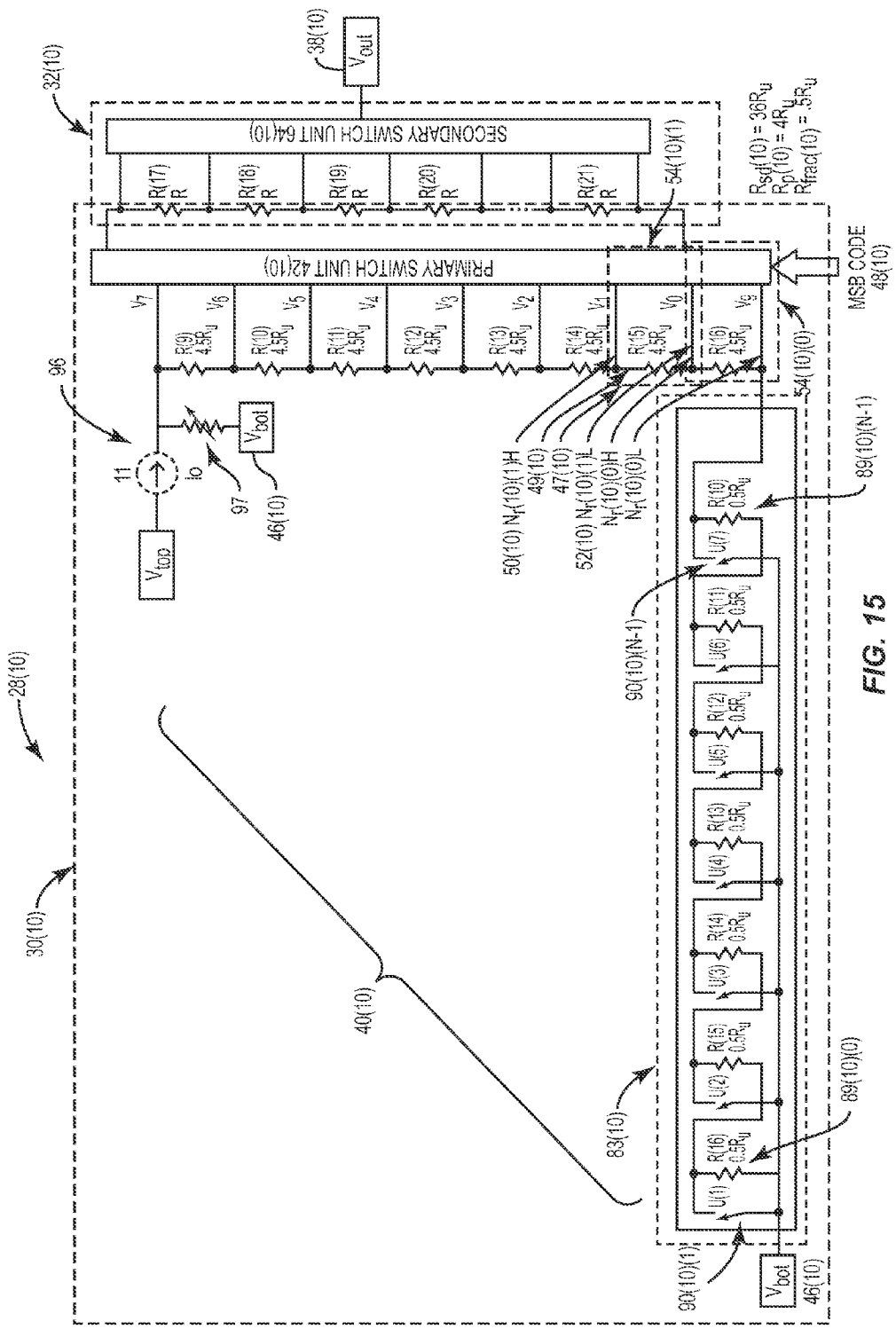
FIG. 15 is another exemplary dual-string DAC including at least one first adjusting circuit configured as a current source coupled to a primary voltage divider circuit, and a second adjusting circuit configured to controllably include at least one second fractional resistance in a total resistance of a primary resistor string, wherein the adjusting circuits in combination are configured to maintain an ideal voltage of a selected resistor node pair across a secondary voltage divider circuit.

In this regard, FIG. 15 illustrates an exemplary embodiment of a dual-string DAC 28 with a current sourced primary voltage divider 30(10). The primary voltage divider 30(10) comprises at least one current source 96, a primary resistor string 40(10), a third adjusting circuit 83(10), and a primary switch unit 42(10). The primary switch unit 42(10) is configured to select a resistor node circuit 47(10) among a plurality of resistor node circuits 47, the resistor node circuit 47(10)

comprises a selected resistor node pair $N_r(i)$ 49(10). The at least one current source 96 is coupled to the primary resistor string 40(10) at a higher selected resistor node $N_r(10)(N-1)H$ 50(10). The at least one current source 96 coupled to the primary resistor string 40(10) may optionally be coupled to a trim resistor 97. The resistance of the trim resistor 97, if present, is adjusted to maintain a constant current at Vtop 44(10), The third adjusting circuit 83(10) is coupled between the ground rail node $V_{bot}$ 46(10) and the primary resistor string 40(10) at the lower selected resistor node $N_r(10)(0)L$ 52(10). While this is a current sourced primary voltage divider 30(10), the operation is similar to the voltage sourced primary voltage dividers 30 of FIGS. 9-13. In an alternative embodiment, the at least one current source 96 and the third adjusting circuit 83(10) would switch positions in the primary voltage divider 30(10). In the alternative embodiment, the at least one current source 96 would be coupled between the ground rail node $V_{bot}$ 46(10) and the lower selected resistor node $N_r(10)(0)L$ 52(10). The third adjusting circuit 83(10) would then be coupled between the voltage rail node $V_{top}$ 44(10) and the higher selected resistor node $N_r(10)(N-1)H$ 50(10).

In continuing reference to FIG. 15, and in both the exemplary and the alternative embodiments referenced above, the selected resistor node pair $N_r(10)(i)$ 49(10) is selected based on the MSB code 48(10), the MSB code 48(10) has three (3) bits, $N=2^3$=eight (8), $R_p(10)=4R_u$, $R_{frac}(10)=0.5R_u$, and $R_{sd}(10)=36R_u$, $R_{bulk1}(10)=R_{bulk2}(10)=0$. Where MSB code 48(10)=i, the resistance between the selected resistor node pair $N_r(10)(i)$ 49(10) is $R_p(10)+R_{frac}(10)$ and meets the first interconnection relationship 68, $R_p=R_{sd}||(R_p+R_{frac})$, as discussed in the previous figures. As the MSB code 48(10) is incremented, the resistance between the ground rail node $V_{bot}$ 46(10) and the lower selected resistor node $N_r(10)(i)L$ 52(10) should only increase by the primary resistance $R_p(10)$ or $4R_u$. However, it will in fact increase by the primary resistance $R_p(10)$+the fractional resistance $R_{frac}(10)$ or $4.5R_u$, and the third adjusting circuit 83(10) must incrementally remove the added fractional resistance from between the ground rail node $V_{bot}$ 46(10) and the lower selected resistor node $N_r(10)(i)L$ 52(10). One of the third fractional resistances $R_{frac}$ 88(10)(i) is removed by closing one of the plurality of third switches 90(10)(i). In this manner, the resistance between the lower selected resistor node $N_r(10)(i)L$ 52(10) and the ground rail node $V_{bot}$ 46(10) will remain substantially constant and therefore meet the third interconnection relationship 74, $i*R_p+R_{bulk1}$. This will have the effect of ensuring the voltage at the higher selected resistor node $N_r(10)(N-1)H$ 50(10) of the last selection equals the lower selected resistor node $N_r(10)(i)L$ 52(10) of the next selected resistor node pairs 49, $N_r(10)(i)H$ 50(10)=$N_r(10)(i+1)L$ 52(10), as the MSB code 48(10) is incremented by one (1). As the MSB code 48(10) is decremented, the process will reverse itself and one of the plurality of third switches 90(10)(i) will open, therefore adding one of the plurality of third fractional resistances $R_{frac}$ 88(10)(i) between the ground rail node $V_{bot}$ 46(10) and the lower selected resistor node $N_r(10)(i)L$ 52(10). In this manner, maintaining a constant and predictable voltage at the selected resistor node pair $N_r(10)(i)$ 49(10) is possible.

As an example of the exemplary embodiment in FIG. 15. MSB code 48(10) has three (3) bits, $N=2^3$=eight (8), $R_p(10)=4R_u$, $R_{frac}(10)=0.5R_u$, and $R_{sd}(10)=36R_u$, $R_{bulk1}(10)=R_{bulk2}(10)=0$. When MSB code 48(10)=i=zero (0), the selected resistor node pair $N_r(10)(0)$ 49(10) will be selected. The at least one current source 96 will maintain a constant current flow through the primary resistor string 40(10) in order to maintain constant divided voltages at each of the selectable resistor node pairs $N_r(10)(0)$ to $N_r(10)(N-1)$ 49(10). In the exemplary embodiment, the third adjusting circuit 83(10) will continue to maintain the resistance coupled between the ground rail node $V_{bot}$ 46(10) and the lower selected resistor node $N_r(10)(0)L$ 52(10) as discussed above. With MSB code 48(10)=zero (0), the third adjusting circuit 83(10) will initially begin with the plurality of third switches 90(10)(1) to 90(10)(N-1) open. In this manner, the plurality of the third fractional resistances $R_{frac}$ 88(10)(1) to 88(10)(N-1) in the third adjusting circuit 83(10) will initially be included in the primary resistor string 40(10).

With continued reference to FIG. 15, as the MSB code 48(10) is incremented to one (1), the selected resistor node pair $N_r(10)(1)$ 49(10) is then selected. An additional first fractional resistance $R_{frac}$ 58(10) from the previous selected resistor node pair $N_r(10)(0)$ 49(10) is now added into the primary resistor string 40(10) between the ground rail node $V_{bot}$ 46(10) and the lower selected resistor node $N_r(10)(1)L$ 52(10). The third adjusting circuit 83(10) compensates for this additional fractional resistance $R_{frac}$ 58(10) by closing one of the plurality of third switches 90(10)(1). The closing of one of the plurality of third switches 90(10)(1) removes one of the plurality of third fractional resistances $R_{frac}$ 88(10)(1) from the primary resistor string 40(10) between the ground rail node $V_{bot}$ 46(10) and the lower selected resistor node $N_r(10)(1)L$ 52(10). The exemplary embodiments in FIGS. 2-14 have a common goal to reduce the number and size of the required resistances and switches. The reduction in the number and size of the required resistances and switches is accomplished while still allowing the primary voltage divider 30 to be interconnected with the secondary voltage divider 32 without the isolation circuits VF1, VF2 found, as an example, in FIG. 1. One of the consequences of reducing the number and size of the required resistances and switches is the polarity of the coarse divided primary output voltage $N_r(10)(i)$ 49(10) may reverse. The resulting reverse or flip in the voltage polarity of the primary voltage output would create trend reversals of the voltage output increase or decrease and the dual-string DAC 28 will not maintain monotonicity.

In this regard, embodiments disclosed herein also include polarity compensating dual-string DACs. Related circuits, systems, and methods are also disclosed. In embodiments disclosed herein, a secondary voltage divider of a dual-string DAC includes a switch logic unit. The switch logic unit is configured to compensate for polarity changes in the dual-string DAC to maintain monotonicity in the dual-string DAC. The dual-string DAC being montonic means that the dual-string DAC will convert a digital input code into an representative analog output voltage that increases (or stays constant) or decreases (or stays constant) for a given incremental change in the digital input code. Montonicity may be desired if it is desired for a DAC to convert digital codes to representative analog signals in a linear fashion. The incremental change in the DAC input code 15 may be either an increase or a decrease in the DAC input code 15 value. The switch logic unit is configured to select a secondary switch among the plurality of secondary switches to divide an input voltage from a primary voltage divider, based on a polarity indicator and a DAC input code. Each of the secondary switches is connected to a resistor node in a secondary resistor string of a secondary voltage divider. The switch logic unit is configured to select the secondary switch among the plurality of secondary switches to compensate for polarity changes in the input voltage from the primary voltage divider to the secondary resistor string. Thus, as a non-limiting example, the dual-string DAC can avoid the need to provide two switches for each resistor node in a primary resistor string to maintain monotonicity.

In this regard, the secondary voltage divider divides the $V_p$ that has been selected and otherwise known as a selected primary DAC output voltage. The selected primary DAC output voltage is applied across the secondary resistor string and divided into finer secondary voltage levels. A finer secondary voltage level is selected and applied to the DAC output voltage $V_{out}$ 38. The secondary switch unit comprises a plurality of secondary switches and the switch logic unit is comprised of a decoder and a polarity logic switching unit. In this manner, a polarity change in the voltage applied across the $2^{nd}$ rank or secondary resistor string may be compensated for, thus creating a dual-string DAC with a monotonic transfer function. The dual-string DAC maintains a monotonic transfer function even though the isolation circuits between the interconnected primary and secondary voltage dividers may have been eliminated. Eliminating isolation circuits will have the benefit of saving circuit size, semiconductor die area, cost, and performance increase. In the alternative, isolation circuits may not be eliminated.

Figure 16:
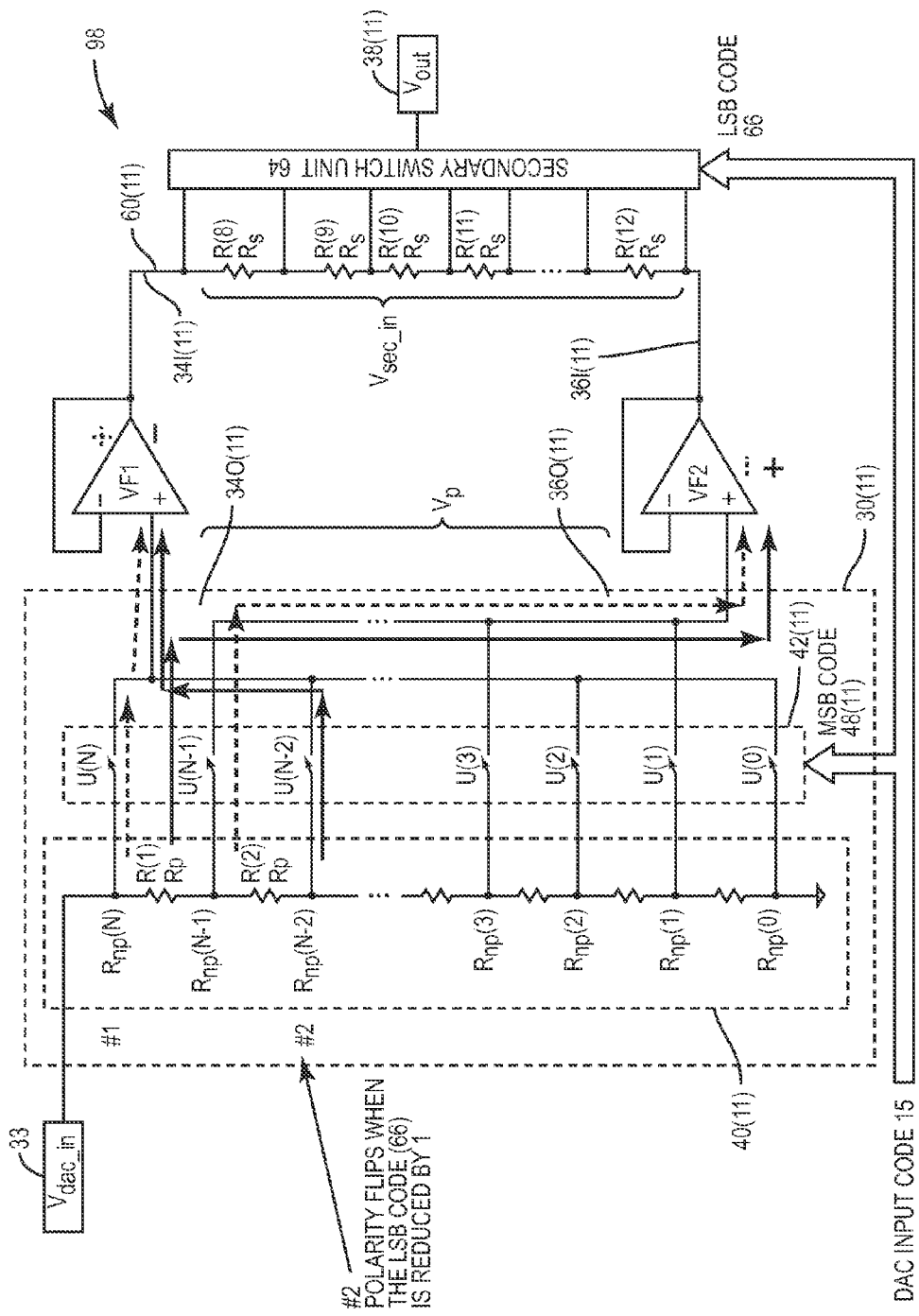
FIG. 16 is an exemplary dual-string DAC circuit used to illustrate exemplary polarity and monotonicity issues when the primary switch count provided for each selected resistor node in a primary voltage divider circuit is reduced.

For example, FIG. 16 illustrates a non-monotonic dual-string DAC 98 (referred to herein as "DAC 98"). A primary voltage divider 30(11) provides coarse divided primary voltage values by dividing the DAC input voltage ($V_{dac\_in}$) across a plurality of primary resistors R(0)-R(N-1) in a primary resistor string 40(11) at selected resistor node pair N, 49(11). A coarse divided primary voltage value is selected by a primary switch unit 42(11). The primary switch unit 42(11) selects a selected resistor node pair $N_r$ 49(11) among the plurality of selected resistor node pairs $N_r(0)$-$N_r(N)$ in the primary resistor string 40(11) as a selected coarse divided primary voltage $V_p$. This selected coarse divided primary voltage $V_p$ is then applied as $V_{sec\_in}$ across a secondary resistor string 60(11).

In this respect, with continuing reference to FIG. 16, the DAC 98 functions in a very similar fashion to the DAC 10 in FIG. 1. However, in order to properly convert the DAC input code 15 into the DAC output voltage $V_{out}$ 38, the DAC 98 transfer function must remain monotonic throughout the range of possible digital codes. Remaining monotonic means the dual-string DAC is either monotonically increasing or monotonically decreasing. If the dual-string DAC is monotonically increasing, the voltage either increases or stays constant. If the dual-string DAC is monotonically decreasing, the voltage either decreases or stays constant. A monotonic transfer function means the selected coarse divided primary voltage $V_p$ and the DAC output voltage $V_{out}$ 38 either increases or stays constant for a monotonically increasing function or either decreases or stays constant for a monotonically decreasing function given an incremental change in a DAC input code 15. For example, as the DAC input code 15 increases in value, the selected coarse divided primary voltage $V_p$ and the DAC output voltage $V_{out}$ 38 must increase or remain constant (i.e., not decrease) for the DAC 98. Likewise, as the DAC input code 15 decreases in value, the selected coarse divided primary voltage $V_p$ and the DAC output voltage $V_{out}$ 38 must decrease or remain constant for the DAC 98. In the alternative, the selected coarse divided primary voltage $V_p$ may increase or remain constant for an incrementally decreased DAC input code 15, where the DAC input code 15 has been inverted. Additionally, in the alternative, the selected coarse divided primary voltage $V_p$ may decrease or remain constant for an incrementally increased DAC input code 15, where the DAC input code 15 has been inverted. The incremental adjustment to the DAC input code 15 may be either an increase or a decrease in the incremental adjustment. In both cases, a monotonic change in the selected coarse divided primary voltage $V_p$ results. In FIG. 1, to provide monotonicity in the selected coarse divided primary voltage $V_p$, primary switches U(0)-U(2N-1) are provided and configured to open and close to select resistor nodes $N_r(0)$-$N_r(N)$ with no polarity changes or polarity flips. The primary switches U(0)-U(2N-1) are configured such that the voltage of the upper respective selected resistor node $N_r(i)H$ 50 of the two (2) selected resistor node pair $N_r(i)$ 49 is always greater. In FIG. 15, however, there is an issue when half of the primary switches U(0)-U(2N-1) are removed. The exemplary embodiment of FIG. 16 has only one (1) of the primary switches U(0)-U(2N-1) coupled to the selected resistor nodes $N_r(0)$-$N_r(N)$. When the MSB code 48(11) is incremented or decremented by the primary switch unit 42(11) one selected resistor node is maintained and the other will skip to the next consecutive selected resistor node. This results in every other selection of selected resistor node pairs 49 alternating the voltage polarity of the selected coarse divided primary voltage $V_p$.

As an example of the circuit in FIG. 16, the MSB code 48(11) code has a maximum value equal to N-1, where $N=2^{MSB}$. In this example, the first selected resistor node pair 49 will be selected by MSB code 48(11)=N-1, or the maximum value. This selection causes the primary switch unit 42(11) to select the selected resistor node pair $N_r(N)$ and $N_r(N-1)$. The selected resistor node pairs $N_r(N)$ and $N_r(N-1)$ will be coupled to the selected coarse divided primary voltage $V_p$ and then subsequently be further divided by the secondary voltage divider 32(11). The primary switch unit 42(11) causes the higher selected resistor node $N_r(N)$ to be coupled to the coarse primary output voltage terminal 34O(11) and also cause the lower selected resistor node $N_r(N-1)L$ 52(11) to be coupled to the coarse primary output voltage terminal 36O(11) terminal. However, a polarity reversal problem arises when the MSB code 48(11) is decremented to N-2. The polarity is then reversed, because the positive pole of $V_p$ is now coupled to the selected resistor node $N_r(N-1)$. The selected resistor node $N_r(N-1)$ is coupled to the coarse primary output voltage terminal 36O(11) and the coarse primary output voltage terminal 34O(11) now coupled to selected resistor node $N_r(N-2)$. Since the voltage at $N_r(N-1)$ is greater than the voltage at $N_r(N-2)$, the secondary DAC input voltage $V_{acc\_in}$ applied across the secondary DAC input voltage terminals 34I(11), 36I(11) is reversed and this pattern, flipping the positive and negative terminals, will continue as the MSB code 48(11) is further decremented. Because of the flipping or reversing of the polarity, a monotonic transfer function is lost.

Figure 17:
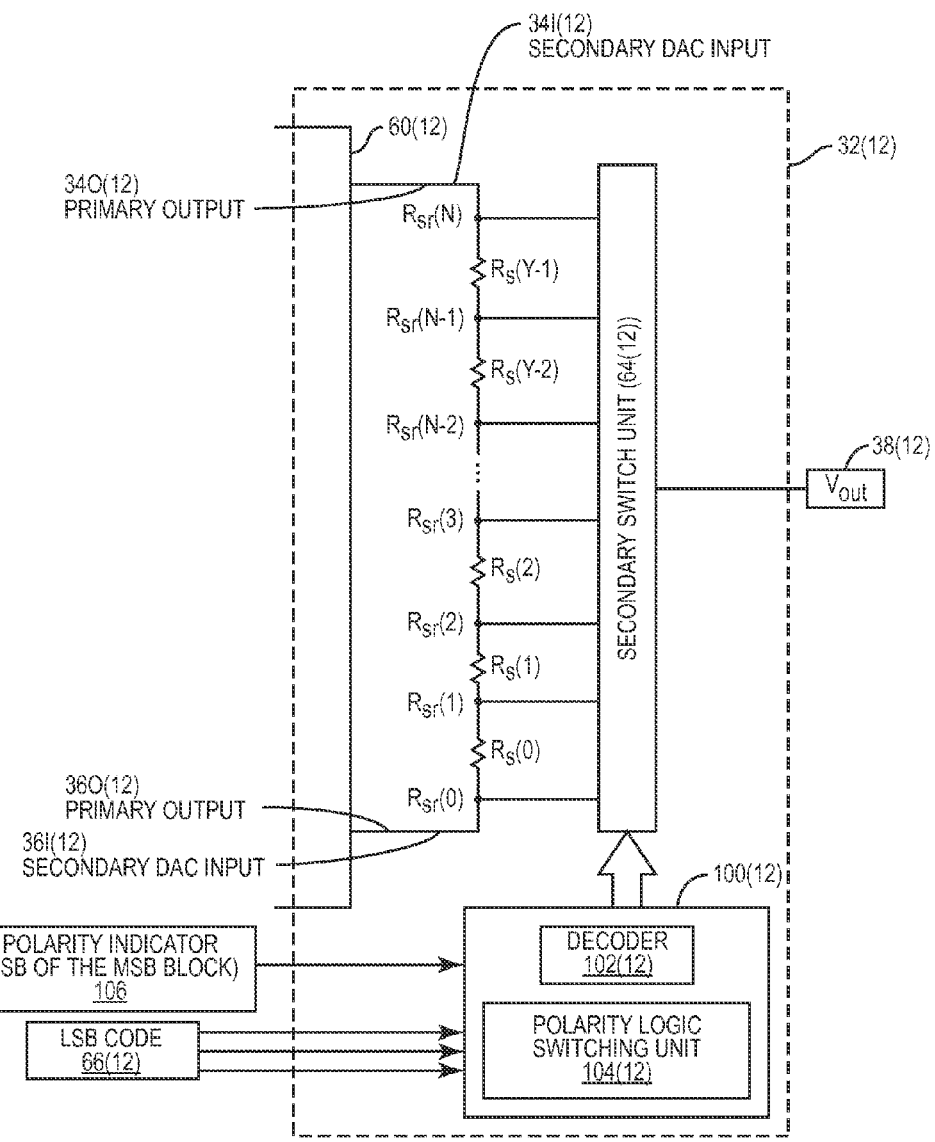
FIG. 17 is an exemplary generalized representation of a secondary voltage divider circuit of a dual-string DAC configured to receive a DAC input code and a polarity indicator, used to control selection of a corresponding secondary switch for selecting a finer, voltage output to be provided as a DAC voltage output of a dual-string DAC.

In this regard, FIG. 17 is a generalized embodiment of a secondary voltage divider 32(12). The secondary voltage divider 32(12) is coupled to the selected coarse divided primary voltage $V_p$ at a top node of the coarse primary output voltage terminal 34O(12), and a bottom node of the coarse primary output voltage terminal 36O(12). As discussed above, and as a non-limiting example, the coupling between the primary voltage divider (not shown) and the secondary voltage divider 32(12) is without any isolation circuits. The secondary voltage divider 32(12) comprises a secondary resistor string 60(12), a secondary switch unit 64(12), and a switch logic unit 100(12). The secondary resistor string 60(12) comprises a plurality of secondary resistors $R_s(0)$-$R_s(Y-1)$ coupled in a serial configuration. In this manner, dividing a coarse primary output voltage $V_p$ across the coarse primary output voltage terminals 34O(12), 36O(12) that has been selected is otherwise known as a selected primary DAC output voltage. The selected primary DAC output voltage $V_p$ is applied across the secondary resistor string 60(12) into divided secondary voltage levels.

With continuing reference to FIG. 17, the secondary switch unit 64(12) comprises a plurality of secondary switches (not shown) that are each coupled to the secondary resistor string 60(12) at a plurality of secondary resistor nodes $N_{sr}(0)$-$N_{sr}(N-1)$. The switch logic unit 100(12) is comprised of a decoder 102(12) and a polarity logic switching unit 104(12). The switch logic unit 100(12) is configured to receive the LSB code 66(12) and a polarity indicator 106. The MSB code 48 (not shown) and the LSB code 66(12) may be both incremented and decremented, causing a step up or a step down, selecting a correspondingly incremented or decremented secondary resistor node, as will be discussed below in FIG. 19. Each bit of the LSB code 66(12) corresponds to a voltage division step in the secondary resistor string 60(11). In one embodiment, the LSB code 66(12) is coupled to the decoder 102(12), and in an alternative embodiment the LSB code 66(12) is coupled to the polarity logic switching unit 104(12) as discussed below. In continuing reference to FIG. 16, the polarity indicator 106 is comprised of the least significant single bit of the MSB code 48.

The generalized embodiment of FIG. 17 operates by reversing the operation of the secondary switch unit 64(12) with every change in the setting of the polarity indicator 106. For example, when the polarity indicator 106 is zero (0), there would be no reversal of the secondary switches in the secondary switch unit 64(12). If there is no reversal of the secondary switches in the secondary switch unit 64(12), operation of the secondary switches (not shown) would incrementally select the next selected resistor node. The selection shifts from a bottom secondary resistor node $N_{sr}(0)$ to a top secondary resistor node $N_{sr}(N-1)$. However, if the polarity indicator 106 is set to one (1), this will indicate that the coarse primary output voltage across the coarse primary output voltage terminals 34O(12), 36O(12) has reversed polarity. In this manner, the operation of the secondary switch unit 64(12) will reverse. By reversing the selection, the next selected resistor node $N_{sr}(i)$ will shift incrementally from the top resistor node $N_{sr}(N-1)$ to the bottom resistor node $N_{sr}(0)$. This coupling of the polarity indicator 106 and the LSB code 66(12) provides for a monotonic transfer function of the DAC input voltage ($V_{dac\_in}$) and the DAC output voltage $V_{out}$ 38.

Figure 18:
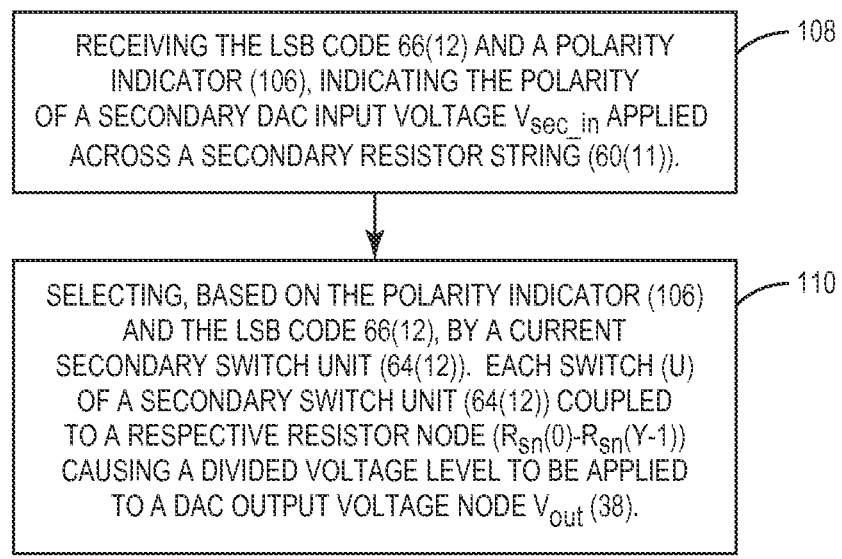
FIG. 18 is a flowchart of an exemplary generalized process of the dual-string DAC of FIG. 17 for controlling selection of a corresponding secondary switch in a secondary voltage divider circuit for selecting a finer, voltage output to be provided as the DAC voltage output of the dual-string DAC.

In this regard, FIG. 18 illustrates a process of receiving the LSB code 66(12) and a polarity indicator 106 indicating a polarity of a secondary DAC input voltage $V_{sec\_in}$ applied across a secondary resistor string 60(12) (block 108). The secondary DAC input voltage $V_{sec\_in}$ applied across the secondary DAC input voltage terminals 34I(12), 36I(12) is the coarse primary output voltage across coarse primary output voltage terminals 34O(12), 36O(12). The selected coarse primary output voltage $V_p$ at the coarse primary output voltage terminals 34O(12), 36O(12) is output from the primary voltage divider 30 and applied across the secondary resistor string 60(12) at the secondary DAC input voltage terminals 34I(12), 36I(12). Upon receiving the LSB code 66(12) and the polarity indicator 106, the switch logic unit 100 determines whether a reversal of the operation of the secondary switch unit 64(12) is necessary to maintain monotonicity. Based on the LSB code 66(12) and the polarity indicator 106, the secondary switch unit 64(12) selects a secondary switch within the secondary switch unit 64(12). The secondary switch unit 64 is coupled to a selected resistor node $N_{sr}(0)$-$N_{sr}(N-1)$ within the secondary resistor string 60(12). The selection of the secondary switch within the secondary switch unit 64(12) causes the divided voltage at the selected resistor node $N_{sr}$(0)-$N_{sr}$(N-1) to apply the divided voltage to the DAC output voltage $V_{out}$ 38 of the dual-string DAC 28 (block 110).

Figure 19:
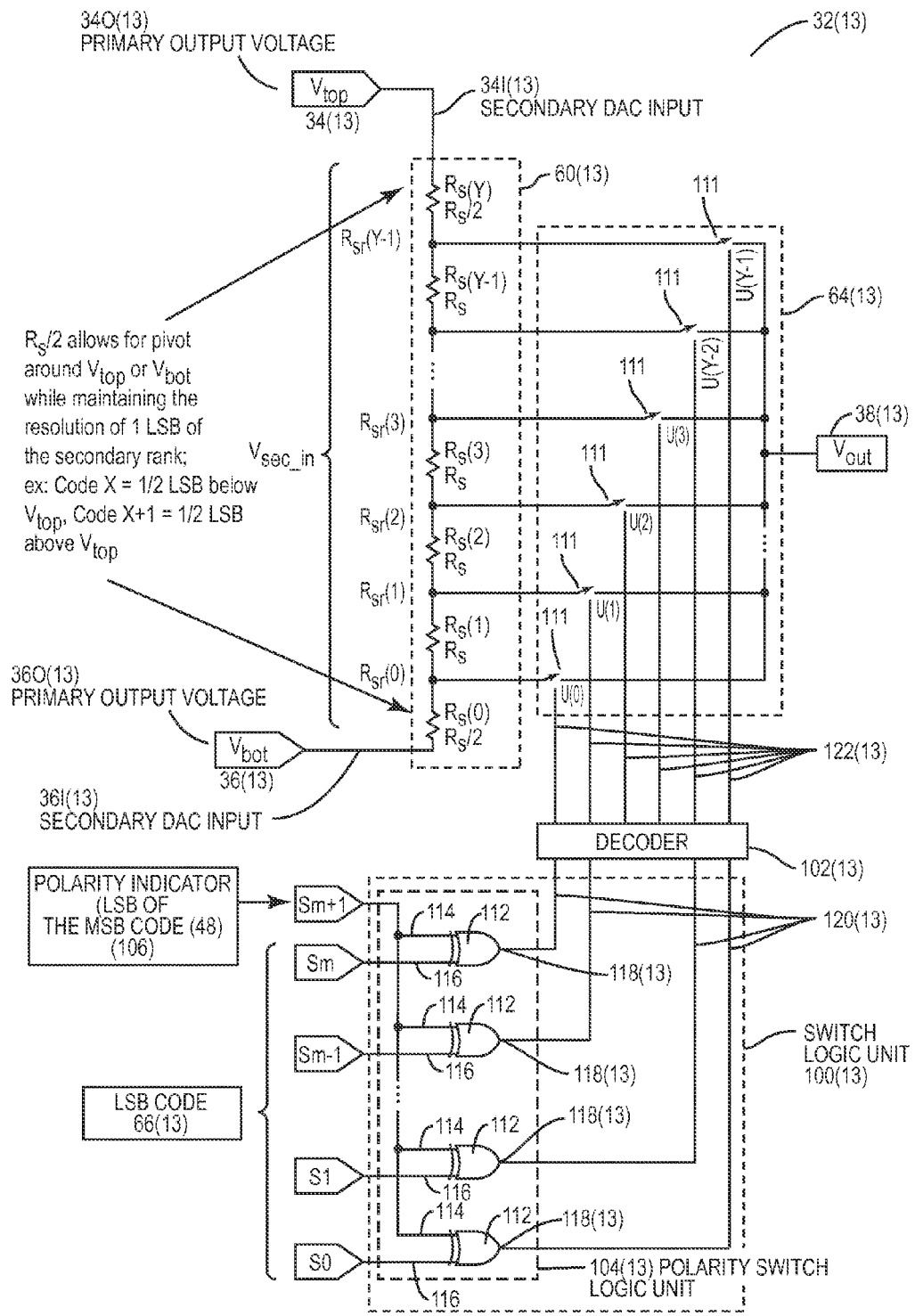
FIG. 19 is an exemplary secondary voltage divider circuit of a dual-string DAC, wherein the secondary voltage divider circuit includes a polarity logic switching unit configured to sense a polarity change in a primary voltage divider circuit to maintain monotonicity in the dual-string DAC.

FIG. 19 is an exemplary embodiment of the process of FIG. 18. In FIG. 19, a secondary voltage divider 32(13) for a dual-string DAC 28 is provided that comprises a secondary resistor string 60(13), a secondary switch unit 64(13) and a switch logic unit 100(13). The secondary resistor string 60(13) comprises a plurality of secondary resistors $R_s(0)$-$R_s(Y)$, where $Y=2^{LSB}$. The secondary resistor string 60(13) further comprises a top secondary resistor $R_s(Y)$ coupled to a top coarse primary output voltage terminal 34O(13), and a bottom secondary resistor $R_s(0)$ coupled to a bottom coarse primary output voltage terminal 36O(13). The top secondary resistor $R_s(Y)$ and the bottom secondary resistor $R_s(0)$ are equal to half the value of each of the plurality of secondary resistors $R_s(1)$-$R_s(Y-1)$. In the alternative, the top secondary resistor $R_s(Y)$ and the bottom secondary resistor $R_s(0)$ may be eliminated. The top secondary DAC input voltage terminal 34I(13) and the bottom secondary DAC input voltage terminal 36I(13) are configured to receive the selected coarse primary output voltage $V_p$ applied as the secondary DAC input voltage $V_{sec\_in}$. The secondary DAC input voltage $V_{sec\_in}$ is applied across the secondary DAC input voltage terminals 34I(13), 36I(13). As discussed above, each bit of the LSB code 66(13) corresponds to a voltage division step in the secondary resistor string 60(13). It is therefore also true that the voltage division step across the secondary resistor $R_s(0)$ and the secondary resistor $R_s(Y)$ will be one-half (½) of each bit of the LSB code 66(13). The secondary switch unit 64(13) is comprised of a plurality of secondary switches 111 U(0) to U(Y-1), each coupled to a respective resistor node $N_{sr}(0)$-$N_{sr}(N-1)$. The secondary switch unit 64(13) is further coupled to the switch logic unit 100(13). In this manner, the switch logic unit 100(13) controls the secondary switches 111 U(0)-U(Y-1). The switch logic unit 100(13) comprises a decoder 102(13) and a polarity logic switching unit 104(13). The decoder 102(13) is coupled to the plurality of secondary switches 111 U(0) to U(Y-1) and is also coupled to the polarity logic switching unit 104(13). The polarity logic switching unit 104(13) is coupled to the polarity indicator 106 and LSB code 66(13) and is also coupled to the decoder 102(13). The polarity logic switching unit 104(13) will control the reversal or non-reversal of the secondary switch unit 64(13), as will be explained below.

In this regard, to control the reversed or non-reversed operation of the switches, FIG. 19 also shows the polarity logic switching unit 104(13) comprising a plurality of Exclusive Or (XOR) logic gates 112. The XOR logic gates 112 comprise a first XOR input 114 and a second XOR input 116. The first XOR input 114 is coupled to the polarity indicator 106, and the second XOR input 116 is coupled to each one of the plurality of bits of the LSB code 66(13). The plurality of XOR logic gates 112 function to set each of a plurality of XOR logic gate outputs 118(13) to a one (1), if one and only one of the XOR logic gate inputs 114, 116 are set to one (1). The function of the polarity indicator 106 is to flip or reverse the corresponding bit of the plurality of corresponding bits output from the plurality of XOR logic gate outputs 118(13). The flip or reversal of the corresponding bit will occur when the polarity indicator 106 is set to one (1), indicating a reverse polarity mode. If a reverse polarity mode is set, the polarity logic switching unit 104(13) will reverse operation of the secondary switch unit 64(13). Reverse operation causes the resistor nodes $N_{sr}(0)$ to $N_{sr}(Y-1)$ to be selected sequentially in reverse order from the top secondary node $N_{sr}(Y-1)$ to the bottom secondary node $N_{sr}(0)$. Each of the plurality of XOR logic gate outputs 118(13) are coupled to a plurality of decoder inputs 120(13). The plurality of decoder inputs 120 (13) may become a polarity modified LSB code 66(13) based on the polarity indicator 106. The combination of the plurality of decoder inputs 120(13) cause the decoder 102(13) to output a plurality of decoder outputs 122(13). The plurality of decoder outputs 122(13) control a secondary switch 111 U(0)-U(Y−1), as will be discussed in reference to the truth table in FIG. 20 below.

With continuing reference to FIG. 19, the secondary resistor string 60(13) comprises two (2) secondary resistors $R_s(0)$ and $R_s(Y)$ of a plurality of secondary resistors $R_s(0)$-$R_s(Y)$. The two (2) secondary resistors $R_s(0)$ and $R_s(Y)$, as discussed above, are coupled to the top coarse primary output voltage terminal 34O(13) and the bottom coarse primary output voltage terminal 36O(13) respectively. The top secondary resistor $R_s(Y)$ and the bottom secondary resistor $R_s(0)$ are equal to half the value of each of the plurality of resistors $R_s(1)$ to $R_s(Y-1)$. The purpose for the modification of the resistor values equal to half of the remaining resistors $R_s(1)$-$R_s(Y-1)$ is to compensate for the functional pivot of the secondary resistor string 60(13). The functional pivot of the secondary resistor string 60(13) occurs around the top secondary node $N_{sr}(Y-1)$ or the bottom secondary node $N_{sr}(0)$. The functional pivot of the secondary resistor string 60(13) occurs whenever the polarity indicator 106 indicates a reversal of the polarity.

In this regard, in FIG. 19, if the secondary resistors $R_s(0)$ and $R_s(Y)$ were valued at zero (0) and both the decoded MSB code 48 and the decoded LSB code 66 are equal to all ones ($1111_2$), the DAC output voltage $V_{out}$ 38 is at the maximum. A problem would exist as the code counts down from $<1111><0000>_2$ to $<1101<1111>_2$, where both of these codes would select the voltage at the selected resistor node $N_r(N-1)$ in FIG. 16. This would result in the voltage at secondary switches 111 U(0) and U(N−1) being equal. The problem of the two adjacent codes producing the DAC output voltage $V_{out}$ 38, which is substantially equivalent, will happen at every carry or borrow between the MSB code 48 and LSB code 66. The problem of the two adjacent codes producing a DAC output voltage $V_{out}$ 38 which is substantially equivalent will occur even though a step up or a step down in DAC output voltage $V_{out}$ 38 is actually desired. The inclusion of the top secondary resistor $R_s(Y)$ and bottom secondary resistor $R_s(0)$, each equaling half the value of each of the plurality of resistors $R_s(1)$ to $R_s(Y-1)$, alleviates this problem. Each of these resistors will result with half LSB of voltage division regardless of the polarity of the voltage across the secondary voltage divider 32(13). Thus, when any of the MSB code 48 or LSB code 66 transitions, as indicated above, occur, there will be a total of 1 LSB of output voltage change. In this exemplary embodiment, the maximum output voltage of the DAC 28 would be the voltage at the top of the primary divider minus half LSB and the minimum output voltage would be half LSB above Vbot 36(13). In this manner, a monotonic and linear DAC transfer function is achieved.

The MSB code 48 and LSB code 66 transitions, the decoder inputs 120(13), the decoder outputs 122(13), and the resulting control of the secondary switches 111 U(0)-U(Y−1) of FIG. 19 may be illustrated as a truth table. The exemplary truth table in FIG. 20 illustrates an example of the secondary voltage divider 32(13) with a 4 bit LSB code 66. The exemplary truth table also shows how the polarity indicator 106 may cause the reverse polarity mode to reverse the operation of the secondary switch unit 64(13). If the polarity indicator 106 is set to zero (0), the non-reverse polarity mode is indicated and the LSB code 66 bits will not be changed. For instance, if the polarity indicator 106 is set to zero (0) and the corresponding LSB code 66 four (4) bits are $1011_2$, according to the truth table, the plurality of XOR logic gate outputs 118 will be $1011_2$. The XOR logic gate outputs 118 of $1011_2$ would correspond to the closing of the secondary switch U(11). However, if the polarity indicator 106 indicates reverse polarity mode because it is set to one (1), then the plurality of XOR logic gate outputs 118 will be $0100_2$, which would correspond to the closing of the secondary switch 111 U(4). The exemplary embodiment of FIG. 19 and the corresponding exemplary truth table of FIG. 20 illustrate the polarity switch logic driving the decoder 102, which in turn controls the secondary switch unit 64(13). In an alternative embodiment, it is possible to swap the function of the switch logic unit 100 and the decoder 102 such that the switch logic unit 100 controls the secondary switch unit 64(13) subsequent to the decoder 102 receiving the LSB code 66.

Figure 21:
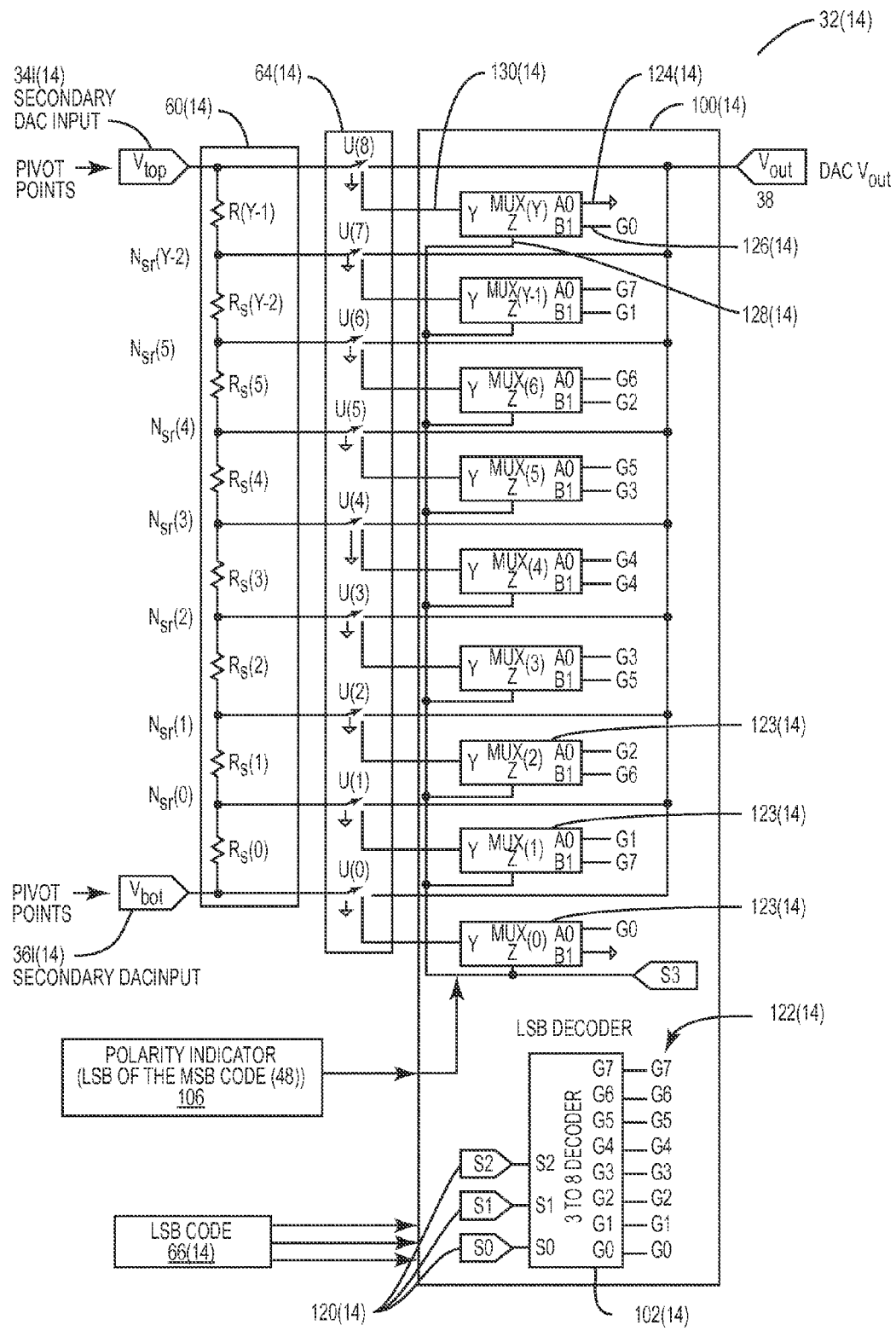
FIG. 21 is another exemplary secondary voltage divider circuit of a dual-string DAC, wherein the secondary voltage divider circuit is configured to sense a polarity change in a primary voltage divider circuit output and adjust switch logic using multiplexers and a decoder to maintain monotonicity of the dual-string DAC.

FIG. 21 shows an exemplary embodiment comprising a secondary resistor string 60(14), a secondary switch unit 64(14), and a switch logic unit 100(14). The secondary resistor string 60(14) comprises a plurality of secondary resistors $R_s(0)$-$R_s(Y-1)$, where Y is equal to $2^{LSB}$ and LSB is the number of bits in the LSB code 66. The secondary resistor nodes $N_{sr}(0)$-$N_{sr}(Y-2)$ are coupled to each of a plurality of secondary switches 111 U(0)-U(Y) in the secondary switch unit 64(14). The switch logic unit 100(14) comprises a decoder 102(14) configured to receive the LSB code 66 of the DAC input code 15, and decode the LSB code 66 to generate a DAC code selection output on one of a plurality of decoder outputs 122(14). The decoder 102(14) may be a LSB to a $2^{LSB}$ decoder. The switch logic unit 100(14) further comprises a plurality of multiplexers 123(14). Each of the plurality of multiplexers 123(14) comprises a first input 124(14), a second input 126(14), a control input 128(14), and a multiplexer output 130(14). The number of the plurality of multiplexers 123(14) may equal the number of the plurality of decoder outputs 122(14) plus one (1). The one (1) more than the number of the plurality of decoder outputs 122(14) accommodates a coupling to ground. The first input 124(14) is configured to receive a corresponding one of the plurality of decoder outputs 122(14) in non-reverse polarity mode. The second input 126(14) is configured to receive a corresponding one of the plurality of decoder outputs 122(14) in reverse mode. The first input 124(14) and the second input 126(14) are selected based on the control input 128(14) configured to receive the polarity indicator 106. In non-reverse polarity mode, each one of the decoder outputs 122(14), beginning with a first decoder output G0 corresponding to an LSB code 66 of $000_2$, is coupled to a corresponding first input 124 of one of the plurality of multiplexers 123(14). The corresponding first input 124 of the plurality of multiplexers 123(14) in the three (3) bit example of LSB code 66 equaling $000_2$ is Mux0. Each of the decoder outputs 122(14) from G1 to G(Y−1) is sequentially coupled to the first input 124(14) from Mux0 to Mux(Y). In reverse polarity mode, each one of the plurality of the decoder outputs 122(14), beginning with a last decoder output G(Y−1) corresponding to the LSB code 66 of $111_2$ in a three (3) bit example, is coupled to a corresponding second input 126 of one of the plurality of multiplexers 123(14). The corresponding second input 126 of the plurality of multiplexers 123(14) in the three (3) bit example of LSB code 66 equaling $111_2$ is Mux0. Each of the decoder outputs 122(14) from G(N−2) to G0 is sequentially coupled to the second input 126(14) from Mux0 to Mux(Y).

In continuing reference to FIG. 21, the decoder 102(14) will output on a corresponding one of the plurality of decoder outputs 122(14) based on the decoded result of the LSB code 66 input into the decoder 102(14). The one of the plurality of decoder outputs 122(14), G0 as an example, is coupled to the first input 124(14) of a first one of the plurality of multiplexers 123(14) and the second input 126(14) of a second one of the plurality of multiplexers 123(14). The polarity indicator 106 is coupled to the control input of each one of the plurality of multiplexers 123(14). The polarity indicator 106 can indicate a reverse polarity mode or a non-reverse polarity mode. If the polarity indicator 106 indicates a non-reverse polarity mode, the first one of the plurality of multiplexers 123(14) will pass through the switch selection to the corresponding secondary switch 111 U(0) to U(Y). If the polarity indicator 106 indicates reverse mode, the second one of the plurality of multiplexers 123(14) will pass through the switch selection to the corresponding secondary switch 111 U(0) to U(Y).

In this regard, FIG. 22 illustrates the exemplary truth table for FIG. 21 comprising values for the LSB code 66, the plurality of decoder outputs 122(14), the polarity indicator 106, and a corresponding secondary switch 111 U(0) to U(Y). The exemplary truth table illustrates the secondary voltage divider 32(14) with a three (3) bit LSB code 66. The exemplary truth table also illustrates how the polarity indicator 106 may cause the reverse polarity mode to reverse the operation of the secondary switch unit 64(14). If the polarity indicator 106 is set to zero (0), then non-reverse polarity mode is indicated and the LSB code 66 bits will not be changed. For example, if the polarity indicator 106 is set to zero (0) and the corresponding LSB code 66 is binary code of $101_2$, the exemplary truth table indicates the output of G5 will be set of the plurality of decoder outputs 122(14). A decoder output 122 on G5 would correspond to the closing of secondary switch 111 U(5). However, if the polarity indicator 106 indicates reverse polarity mode with a setting of one (1) and the corresponding LSB code 66 is binary code $101_2$, this would correspond to the closing of the secondary switch 111 U(2). The exemplary embodiment of FIG. 20 and the corresponding exemplary truth table of FIG. 21 illustrate the polarity switch logic driving the multiplexer 123(14), which in turn controls the secondary switch unit 64(13).

The dual-string DACs, and related circuits, systems, and methods according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 23:
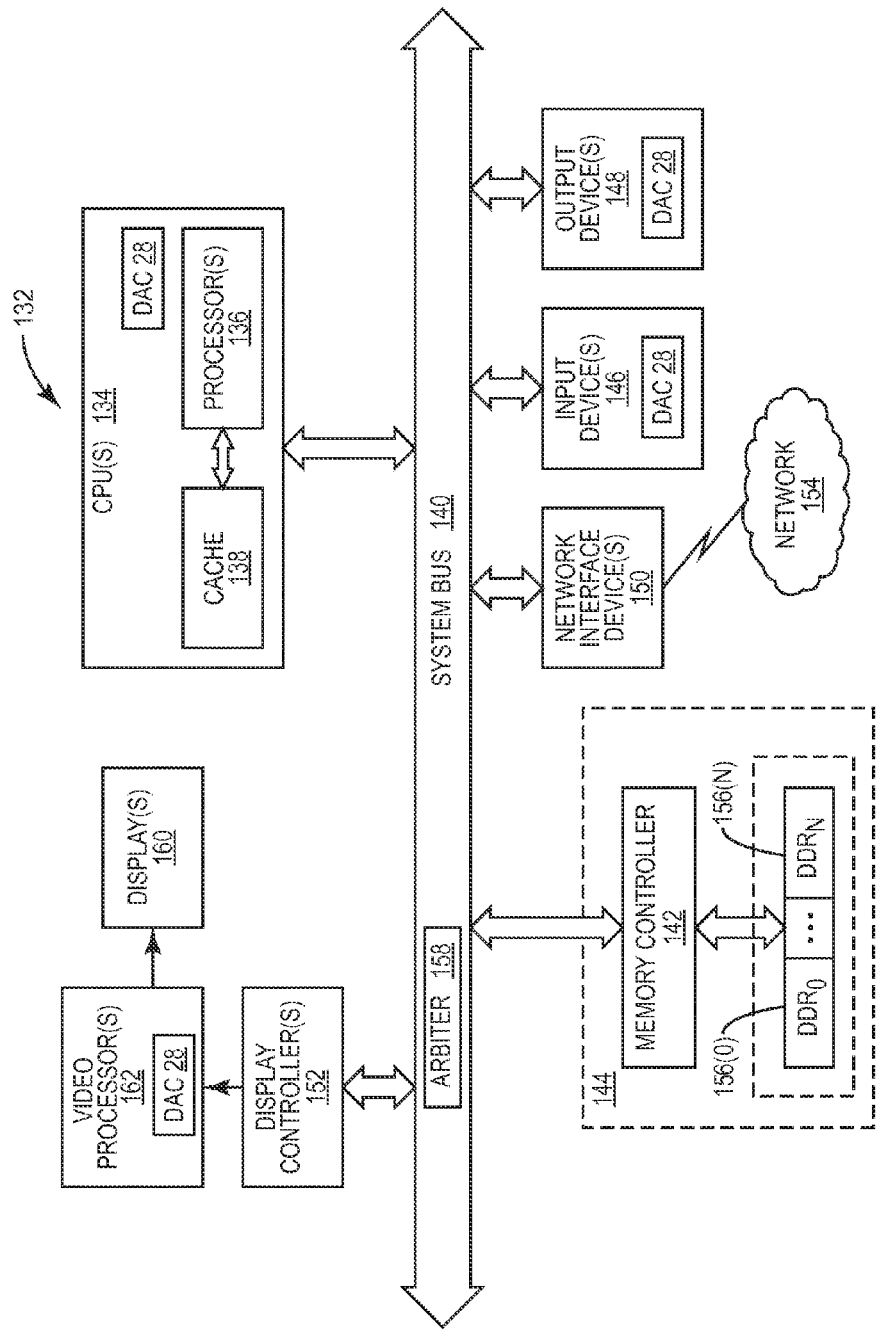
FIG. 23 is a block diagram of an exemplary processor-based system that can include dual-string DACs according to the embodiments disclosed herein, including but not limited to the dual-string DACs of FIGS. 2-22.

In this regard, FIG. 23 illustrates an example of a processor-based system 132 that can employ dual-string DACs 28 according to any of the embodiments disclosed herein. For example, the dual-string DACs 28 in the processor-based system 132 in FIG. 23 could include one or more adjusting circuits (not shown) configured to maintain the ideal voltage of the selected resistor node paired across the secondary voltage divider circuit 32 in the dual-string DAC 28. The dual-string DACs 28 in the processor-based system 132 in FIG. 23 could also include polarity compensating dual-string DACs 28 employing a switch logic unit configured to compensate for polarity changes in the dual-string DAC 28 to maintain monotonicity in the dual-string DAC 28. The dual-string DACs 28 in the processor-based system 132 in FIG. 22 could include both the aforementioned adjusting circuit(s) to maintain the ideal voltage of the selected resistor node paired across the secondary voltage divider circuit 32 in the dual-string DAC 28, and switch logic unit configured to compensate for polarity changes in the dual-string DAC 28 to maintain monotonicity in the dual-string DAC 28.

In this regard, the exemplary processor-based system 132 in FIG. 23 includes one or more central processing units (CPUs) 134 each including one or more processors 136. The CPU(s) 134, may have cache memory 138 coupled to the processor(s) 136 for rapid access to temporarily stored data. The CPU(s) 134 is coupled to a system bus 140 and can intercouple master and slave devices included in the processor-based system 132. As is well known, the CPU(s) 134 communicates with these other devices by exchanging address, control, and data information over the system bus 140. For example, the CPU(s) 134 can communicate bus transaction requests to a memory controller 142 as an example of a slave device. Although not illustrated in FIG. 23, multiple system buses 140 could be provided, wherein each system bus 140 constitutes a different fabric.

Other master and slave devices can be connected to the system bus 140. As illustrated in FIG. 23, these devices can include a memory system 144, one or more input devices 146, one or more output devices 148, one or more network interface devices 150, and one or more display controllers 152, as examples. The input device(s) 146 can include any type of input device, including but not limited to input keys, switches, voice processors, etc. The output device(s) 148 can include any type of output device, including but not limited to audio, video, other visual indicators, etc. The network interface device(s) 150 can be any devices configured to allow exchange of data to and from a network 154. The network 154 can be any type of network, including but not limited to a wired or wireless network, private or public network, a local area network (LAN), a wide local area network (WLAN), and the Internet. The network interface device(s) 150 can be configured to support any type of communication protocol desired. The memory system 144 can include one or more memory units 156(0-N). A bus interconnect arbiter 158 may be provided between the system bus 140 and master and slave devices coupled to the system bus 140, such as, for example, the memory units 156(0-N) provided in the memory system 144.

The CPU(s) 134 may also be configured to access the display controller(s) 152 over the system bus 140 to control information sent to one or more displays 160. The display controller(s) 152 sends information to the display(s) 160 to be displayed via one or more video processors 162, which process the information to be displayed into a format suitable for the display(s) 160. The display(s) 160 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a DSP, an Application Specific Integrated Circuit (ASIC), an FPGA or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but are to be accorded the widest scope consistent with the principles and novel features disclosed herein.

What is claimed is:

1. A secondary voltage divider of a dual-string digital-to-analog converter (DAC) comprising:

a secondary resistor string comprising a plurality of secondary resistors, the secondary resistor string comprising a plurality of secondary resistor nodes, the secondary resistor string configured to divide a selected primary DAC output voltage applied as a secondary DAC input voltage across the secondary resistor string into a plurality of divided voltage levels across the plurality of secondary resistors;

a secondary switch unit comprising a plurality of secondary switches each coupled to a respective secondary resistor node among the plurality of secondary resistor nodes, each secondary switch among the plurality of secondary switches configured to select a current secondary resistor node among the plurality of secondary resistor nodes of the secondary resistor string to provide a divided secondary voltage level across the current selected secondary resistor node to be applied to a DAC output voltage node of the dual-string DAC; and a switch logic unit configured to:
  receive a secondary DAC input code and a polarity indicator indicating a polarity of the secondary DAC input voltage; and
  select a current secondary switch among the plurality of secondary switches based on the polarity indicator and the secondary DAC input code to select a secondary resistor node coupled to a current selected secondary switch, to cause the divided secondary voltage level across the current selected secondary resistor node to be applied to the DAC output voltage node of the dual-string DAC.

2. The secondary voltage divider of claim 1, wherein the plurality of secondary resistors of the secondary resistor string comprises a top resistor coupled to a top node and a bottom resistor coupled to a bottom node, the top node and the bottom node configured to receive the selected primary DAC output voltage as the secondary DAC input voltage to apply the secondary DAC input voltage across the secondary resistor string.

3. The secondary voltage divider of claim 2, wherein the switch logic unit is further configured to select an adjacent secondary switch located between the current selected secondary switch and the top node of the secondary resistor string in response to an increment in the secondary DAC input code and based on the polarity indicator indicating a non-reverse polarity mode.

4. The secondary voltage divider of claim 2, wherein the switch logic unit is further configured to select an adjacent secondary switch located between the current selected secondary switch and the bottom node of the secondary resistor string in response to an increment in the secondary DAC input code and based on the polarity indicator indicating a reverse polarity mode.

5. The secondary voltage divider of claim 2, wherein the switch logic unit is further configured to select an adjacent secondary switch located between the current selected secondary switch and the bottom node of the secondary resistor string in response to a decrement in the secondary DAC input code and based on the polarity indicator indicating a non-reverse polarity mode.

6. The secondary voltage divider of claim 2, wherein the switch logic unit is further configured to select an adjacent secondary switch located between the current selected secondary switch and the top node of the secondary resistor string in response to an decrement in the secondary DAC input code and based on the polarity indicator indicating a reverse polarity.

7. The secondary voltage divider of claim 1, wherein the switch logic unit is not configured to change the polarity of the secondary DAC input voltage.

8. The secondary voltage divider of claim 2, wherein the switch logic unit comprises:
a polarity logic switching unit configured to:
receive the polarity indicator indicating the polarity of the secondary DAC input voltage and the secondary DAC input code; and
generate a polarity DAC input code based on the polarity indicator; and
a decoder configured to select the current secondary switch among the plurality of secondary switches based on the secondary DAC input code to cause the divided secondary voltage level across the current selected secondary resistor node to be applied to the DAC output voltage node of the dual-string DAC.

9. The secondary voltage divider of claim 8, wherein the polarity logic switching unit is configured to generate the polarity DAC input code as a polarity modified DAC input code from the received secondary DAC input code when the polarity indicator indicates a reverse polarity.

10. The secondary voltage divider of claim 8, wherein the polarity logic switching unit is configured to generate the polarity DAC input code as the received secondary DAC input code when the polarity indicator indicates a non-reverse polarity mode.

11. The secondary voltage divider of claim 8, wherein the polarity logic switching unit comprises a plurality of Exclusive OR (XOR) logic gates, each of the plurality of XOR logic gates configured to:
receive a bit of the secondary DAC input code and the polarity indicator; and
generate a corresponding bit of the polarity DAC input code based on an XOR of the bit of the secondary DAC input code and the polarity indicator.

12. The secondary voltage divider of claim 8, wherein the plurality of secondary resistors coupled in series between the top resistor and the bottom resistor in the secondary resistor string are equal or substantially equal in resistance (R).

13. The secondary voltage divider of claim 12, wherein the top resistor and the bottom resistor have one-half (½) resistance (½ R) of the resistance of the plurality of secondary resistors coupled in series between the top resistor and the bottom resistor, to maintain a resistance (R) for a next selected secondary resistor node when the polarity indicator received by the switch logic unit changes a polarity mode.

14. The secondary voltage divider of claim 2, wherein the switch logic unit comprises:
a decoder configured to:
receive the secondary DAC input code; and
decode the secondary DAC input code to generate a DAC code selection output on one of a plurality of decoder outputs based on the secondary DAC input code; and
a plurality of multiplexers, each multiplexer of the plurality of multiplexers configured to:
receive a first input coupled to a corresponding one of the plurality of decoder outputs for a non-reverse polarity mode;
receive a second input coupled to a corresponding one of the plurality of decoder outputs for a reverse polarity mode;
receive a control input coupled to the polarity indicator;
generate a multiplexer output based on the control input selecting the first input or the second input; and
select the current secondary switch from among the plurality of secondary switches based on the multiplexer output to cause the divided secondary voltage level across the current selected secondary resistor node to be applied to the DAC output voltage node of the dual-string DAC.

15. The secondary voltage divider of claim 14, wherein the decoder of the switch logic unit comprises an LSB to $2^{LSB}$ decoder, where LSB is equal to a number of bits in a least significant bit group of the secondary DAC input code.

16. The secondary voltage divider of claim 14, wherein a number of the plurality of multiplexers equals 2LSB+1, where LSB is equal to a number of bits in the secondary DAC input code.

17. The secondary voltage divider of claim 1 not comprising an isolating circuit coupled between the secondary voltage divider and a primary voltage divider.

18. The secondary voltage divider of claim 1 integrated into a semiconductor die.

19. The secondary voltage divider of claim 1, further comprising a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the secondary voltage divider is integrated.

20. A secondary voltage divider of a dual-string digital-to-analog converter (DAC) for dividing a voltage output from a primary voltage divider comprising:
a means for dividing a total voltage, a secondary resistor string comprising a plurality of secondary resistors, the secondary resistor string comprising a plurality of secondary resistor nodes configured to divide a selected primary DAC output voltage applied as a secondary DAC input voltage across the secondary resistor string into a plurality of divided voltage levels;
a means for selecting a secondary resistor node, a secondary switch unit comprising a plurality of secondary switches each coupled to a respective secondary resistor node among a plurality of secondary resistor nodes, each secondary switch among a plurality of secondary switches is configured to select a current secondary resistor node among the plurality of secondary resistor nodes of the secondary resistor string to provide a divided secondary voltage level across the current selected secondary resistor node to be applied to a DAC output voltage node of the dual-string DAC; and
a means for receiving a polarity indicator, a switch logic unit configured to receive a DAC input code and the polarity indicator indicating a polarity of the secondary DAC input voltage, and select a current secondary switch among the plurality of secondary switches based on the polarity indicator and the secondary DAC input code to select the secondary resistor node coupled to the selected current secondary switch, to cause the divided secondary voltage level across the current selected secondary resistor node to be applied to the DAC output voltage node of the dual-string DAC.

21. A method of providing a secondary digital-to-analog converter output voltage in a dual-string DAC, comprising:
receiving a secondary DAC input code and a polarity indicator indicating a polarity of a secondary DAC input voltage applied across a secondary resistor string comprising a plurality of secondary resistors, the secondary resistor string comprising a plurality of secondary resistor nodes dividing the secondary DAC input voltage across the secondary resistor string into a plurality of divided secondary voltage levels; and selecting, based on the polarity indicator and the secondary DAC input code, a current secondary switch among a plurality of secondary switches in a secondary switch unit, each of the plurality of secondary switches coupled to a respective secondary resistor node among the plurality of secondary resistor nodes, to select a current secondary resistor node among the plurality of secondary resistor nodes to cause a divided secondary voltage level across the current selected secondary resistor node to be applied to a DAC output voltage node of the dual-string DAC.

22. The method of claim 21, wherein the plurality of secondary resistors of the secondary resistor string comprises a top resistor coupled to a top node and a bottom resistor coupled to a bottom node, the top node and the bottom node configured to receive a selected primary DAC output voltage as the secondary DAC input voltage to apply the secondary DAC input voltage across the secondary resistor string.

23. The method of claim 22, wherein upon receiving the polarity indicator, a switch logic unit is configured to select an adjacent secondary switch located between the current selected secondary switch and the top node of the secondary resistor string in response to an increment in the secondary DAC input code and based on the polarity indicator indicating a non-reverse polarity mode.

24. The method of claim 22, wherein upon receiving the polarity indicator, a switch logic unit is configured to select an adjacent secondary switch located between the current selected secondary switch and the bottom node of the secondary resistor string in response to an increment in the secondary DAC input code and based on the polarity indicator indicating a reverse polarity mode.

25. The method of claim 22, wherein upon receiving the polarity indicator, a switch logic unit is configured to select an adjacent secondary switch located between the current selected secondary switch and the bottom node of the secondary resistor string in response to a decrement in the secondary DAC input code and based on the polarity indicator indicating a non-reverse polarity mode.

26. The method of claim 22, wherein upon receiving the polarity indicator, a switch logic unit is configured to select an adjacent secondary switch located between the current selected secondary switch and the top node of the secondary resistor string in response to an decrement in the secondary DAC input code and based on the polarity indicator indicating a reverse polarity mode.

27. A dual-string digital-to-analog converter (DAC), comprising:
a primary voltage divider, comprising:
a primary resistor string having a total resistance, the primary resistor string comprising a plurality of resistor nodes configured to divide a DAC input voltage applied across the primary resistor string into a plurality of divided voltage levels;
a primary switch unit configured to receive a DAC input code and select a resistor node circuit among a plurality of resistor node circuits, the resistor node circuit comprising a selected resistor node pair among a plurality of resistor node pairs of the primary resistor string based on the DAC input code to couple a divided voltage level across the selected resistor node pair to a secondary voltage divider circuit of the dual-string DAC; and
at least one adjusting circuit comprising at least one first fractional resistance to the selected resistor node configured to maintain an ideal voltage of the selected resistor node pair across the secondary voltage divider circuit in response to the primary switch unit selecting the selected resistor node pair, without impedance isolation between the primary voltage divider and the secondary voltage divider circuit; and
a secondary voltage divider comprising:
a secondary resistor string comprising a plurality of secondary resistors, the secondary resistor string comprising a plurality of secondary resistor nodes configured to divide a selected primary DAC output voltage applied as a secondary DAC input voltage across the secondary resistor string into a plurality of secondary divided voltage levels;
a secondary switch unit comprising a plurality of secondary switches each coupled to a respective secondary resistor node among the plurality of secondary resistor nodes, each secondary switch among the plurality of secondary switches configured to select a current secondary resistor node among the plurality of secondary resistor nodes of the secondary resistor string to provide one of the plurality of secondary divided voltage levels across the current selected secondary resistor node to be applied to a DAC output voltage node of the dual-string DAC; and
a switch logic unit configured to:
receive a secondary DAC input code and a polarity indicator indicating a polarity of the secondary DAC input voltage; and
select a current secondary switch among the plurality of secondary switches based on the polarity indicator and the secondary DAC input code to select a secondary resistor node coupled to the selected current secondary switch, to cause the one of the plurality of secondary divided voltage levels across the current selected secondary resistor node to be applied to the DAC output voltage node of the dual-string DAC.

28. The dual-string DAC of claim 27 not comprising an isolating circuit coupled between the primary voltage divider and the secondary voltage divider.

29. The dual-string DAC of claim 27, wherein the at least one adjusting circuit is comprised of at least one first adjusting circuit providing the at least one first fractional resistance to the selected resistor node circuit, the selected resistor node circuit comprising the at least one first adjusting circuit.

30. The dual-string DAC of claim 29, wherein:
a resistance of the selected resistor node pair is comprised of a primary resistance ($R_p$) and the at least one first fractional resistance ($R_{frac1}$); and
a resistance of the secondary voltage divider circuit is comprised of resistances providing a total secondary voltage divider circuit resistance ($R_{sd}$); and
the primary resistance ($R_p$) is $1/(1/(R_p+R_{frac1})+((1/R_{sd}))$.

31. The dual-string DAC of claim 29, wherein the at least one adjusting circuit further comprises:
a second adjusting circuit configured to include or not include at least one second fractional resistance in the total resistance of the primary resistor string in response to the primary switch unit selecting the resistor node pair, and
a third adjusting circuit configured to include or not include at least one third fractional resistance in the total resistance of the primary resistor string in response to the primary switch unit selecting the resistor node pair;

the second adjusting circuit and the third adjusting circuit configured to maintain the ideal voltage of the selected resistor node pair across the secondary voltage divider circuit, in response to the primary switch unit selecting the resistor node pair.

32. The dual-string DAC of claim 31, wherein:

the second adjusting circuit further comprises at least one second switch configured to include or not include the at least one second fractional resistance in the total resistance of the primary resistor string; and the third adjusting circuit further comprises at least one third switch configured to include or not include the at least one third fractional resistance from or to the total resistance of the primary resistor string.

33. The dual-string DAC of claim 31, wherein:

the second adjusting circuit is further configured to adjust a resistance of the primary resistor string between a voltage rail node of the primary resistor string and the selected resistor node circuit to adjust the total resistance of the primary resistor string; and the third adjusting circuit is further configured to adjust a resistance of the primary resistor string between a ground rail node of the primary resistor string and the selected resistor node circuit to adjust the total resistance of the primary resistor string.

34. The dual-string DAC of claim 31, further comprising: wherein:

a resistance of the selected resistor node pair is comprised of primary resistance ($R_p$) and the at least one first fractional resistance;

the DAC input code (i) is comprised of a plurality of binary input bits (n), each combination of the plurality of binary input bits configured to select a unique resistor node pair in the primary resistor string;

the resistance of the primary resistor string between a voltage rail node of the primary resistor string and the selected resistor node circuit is $(N-i-1)*R_p$; and the resistance of the primary resistor string between a ground rail node of the primary resistor string and the selected resistor node circuit is $i*R_p$.

35. The dual-string DAC of claim 34, further comprising:

a second biasing resistance ($R_{bulk2}$) configured to vary a total resistance of the second adjusting circuit; and a third biasing resistance ($R_{bulk1}$) configured to vary a total resistance of the third adjusting circuit;

wherein:

the resistance of the primary resistor string between the voltage rail node of the primary resistor string and the selected resistor node circuit is $(N-i-1)*R_p+R_{bulk2}$; and the resistance of the primary resistor string between the ground rail node of the primary resistor string and the selected resistor node circuit is $i*R_p+R_{bulk1}$.

36. The secondary voltage divider of claim 27, wherein the switch logic unit comprises:

a polarity logic switching unit configured to:
receive the polarity indicator indicating the polarity of the secondary DAC input voltage and the secondary DAC input code; and
generate a polarity DAC input code based on the polarity indicator; and a decoder configured to select the current secondary switch among the plurality of secondary switches based on the secondary DAC input code to cause a divided voltage level across the current selected secondary resistor node to be applied to the DAC output voltage node of the dual-string DAC.

37. The secondary voltage divider of claim 27, wherein the switch logic unit comprises:

a decoder configured to:
receive the DAC input code; and
decode the DAC input code to generate a DAC code selection output on one of a plurality of decoder outputs based on the DAC input code; and a plurality of multiplexers, each multiplexer of the plurality of multiplexers configured to:
receive a first input coupled to a corresponding one of the plurality of decoder outputs for a non-reverse polarity mode;
receive a second input coupled to a corresponding one of the plurality of decoder outputs for a reverse polarity mode;
receive a control input coupled to the polarity indicator;
generate a multiplexer output based on the control input selecting the first input or the second input; and
select the current secondary switch from among the plurality of secondary switches based on the multiplexer output to cause a divided voltage level across the current selected secondary resistor node to be applied to the DAC output voltage node of the dual-string DAC.

* * * * *